(12) United States Patent
Park et al.

(10) Patent No.: US 11,972,839 B2
(45) Date of Patent: Apr. 30, 2024

(54) MEMORY SYSTEM AND OPERATING METHOD OF THE MEMORY SYSTEM

(71) Applicant: SK hynix Inc., Gyeonggi-do (KR)

(72) Inventors: Chang Kyun Park, Gyeonggi-do (KR); Young Sik Koh, Gyeonggi-do (KR); Seung Jin Park, Gyeonggi-do (KR); Dong Hyun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/873,730

(22) Filed: Jul. 26, 2022

(65) Prior Publication Data
US 2022/0366953 A1    Nov. 17, 2022

Related U.S. Application Data

(63) Continuation of application No. 17/825,837, filed on May 26, 2022, which is a continuation of application
(Continued)

(30) Foreign Application Priority Data

Apr. 23, 2019  (KR) .................. 10-2019-0047421
Apr. 30, 2019  (KR) .................. 10-2019-0050591
(Continued)

(51) Int. Cl.
*G11C 16/04*    (2006.01)
*G11C 7/10*     (2006.01)
(Continued)

(52) U.S. Cl.
CPC .............. *G11C 8/18* (2013.01); *G11C 7/1072* (2013.01); *G11C 7/222* (2013.01);
(Continued)

(58) Field of Classification Search
CPC ......... G11C 8/18; G11C 7/1072; G11C 7/222; G11C 11/4076; G11C 16/32; G11C 2207/2272
See application file for complete search history.

(56) References Cited

U.S. PATENT DOCUMENTS 9,536,590 B1    1/2017 Zhu et al.
10,949,092 B2 *  3/2021 Kunimatsu ......... G06F 12/0246
(Continued)

FOREIGN PATENT DOCUMENTS

CN    106133710 A    11/2016
CN    107093459 A    8/2017
(Continued)

OTHER PUBLICATIONS

U.S. Appl. No. 17/825,837, filed May 2022, Park et al..*
(Continued)

*Primary Examiner* — Pho M Luu
(74) *Attorney, Agent, or Firm* — IP & T GROUP LLP

(57) ABSTRACT

A memory system includes a memory device including an interface circuit and a semiconductor memory, and a controller to generate a command for controlling the memory device. The interface circuit receives the command from the controller; determines whether the command is for the semiconductor memory or the interface circuit; and when it is determined that the command is for the interface circuit, performs a blocking operation to block transfer of the command between the interface circuit and the semiconductor memory and performs an internal operation of the interface circuit. The internal operation includes a signal controlling operation, a training operation, a read operation, an on-die termination operation, a ZQ calibration operation, or a driving force control operation.

20 Claims, 47 Drawing Sheets

Related U.S. Application Data

No. 16/992,424, filed on Aug. 13, 2020, now Pat. No. 11,404,097, which is a continuation-in-part of application No. 16/895,050, filed on Jun. 8, 2020, now Pat. No. 11,170,831, and a continuation-in-part of application No. 16/727,282, filed on Dec. 26, 2019, now Pat. No. 11,133,080, and a continuation-in-part of application No. 16/679,561, filed on Nov. 11, 2019, now Pat. No. 11,062,742, and a continuation-in-part of application No. 16/679,582, filed on Nov. 11, 2019, now Pat. No. 11,069,387, and a continuation-in-part of application No. 16/679,601, filed on Nov. 11, 2019, now Pat. No. 11,150,838, said application No. 16/895,050 is a continuation of application No. 16/215,981, filed on Dec. 11, 2018.

(30) Foreign Application Priority Data

| Apr. 30, 2019 | (KR) | 10-2019-0050617 |
|---|---|---|
| May 30, 2019 | (KR) | 10-2019-0064089 |

(51) Int. Cl.

| G11C 7/22 | (2006.01) |
|---|---|
| G11C 8/18 | (2006.01) |
| G11C 11/4076 | (2006.01) |
| G11C 16/32 | (2006.01) |

(52) U.S. Cl.
CPC .......... *G11C 11/4076* (2013.01); *G11C 16/32* (2013.01); *G11C 2207/2272* (2013.01)

(56) References Cited

U.S. PATENT DOCUMENTS

| 11,404,097 | B2* | 8/2022 | Park | G11C 16/26 |
|---|---|---|---|---|
| 2004/0193834 | A1 | 9/2004 | Emberling | |
| 2012/0023338 | A1 | 1/2012 | Sugahara et al. | |
| 2016/0104520 | A1 | 4/2016 | Kang et al. | |
| 2017/0364276 | A1 | 12/2017 | Bhuiyan et al. | |
| 2019/0004984 | A1 | 1/2019 | Lee et al. | |
| 2019/0348095 | A1 | 11/2019 | Koh | |
| 2020/0342919 | A1* | 10/2020 | Park | G11C 7/1093 |
| 2020/0348886 | A1 | 11/2020 | Park et al. | |
| 2022/0350541 | A1* | 11/2022 | Na | G06F 3/0659 |

FOREIGN PATENT DOCUMENTS

| CN | 108417233 A | 8/2018 |
|---|---|---|
| CN | 109313617 A | 2/2019 |
| CN | 109410993 A | 3/2019 |
| CN | 109491590 A | 3/2019 |
| CN | 111863056 B | 3/2024 |
| JP | 2013-200830 A | 10/2013 |
| KR | 10-2004-0021478 A | 3/2004 |
| KR | 10-2017-0135500 A | 12/2017 |

OTHER PUBLICATIONS

Notice of Allowance for the Korean Patent Application No. 10-2018-0054239 issued by the Korean Patent Office dated Mar. 10, 2023.

Office Action for the Chinese Patent Application No. 201811628540.9 Issued by the Chinese Patent Office dated Oct. 31, 2022.

Office Action for the Chinese Patent Application No. 201911224277.1 issued by the Chinese Patent Office dated Jul. 19, 1 2023.

Office Action for the Chinese Patent Application No. 201911224290.7 issued by the Chinese Patent Office on Nov. 16, 2023.

Office Action for the Chinese Patent Application No. 201911224246.6 issued by the Chinese Patent Office on Oct. 25, 2023.

* cited by examiner

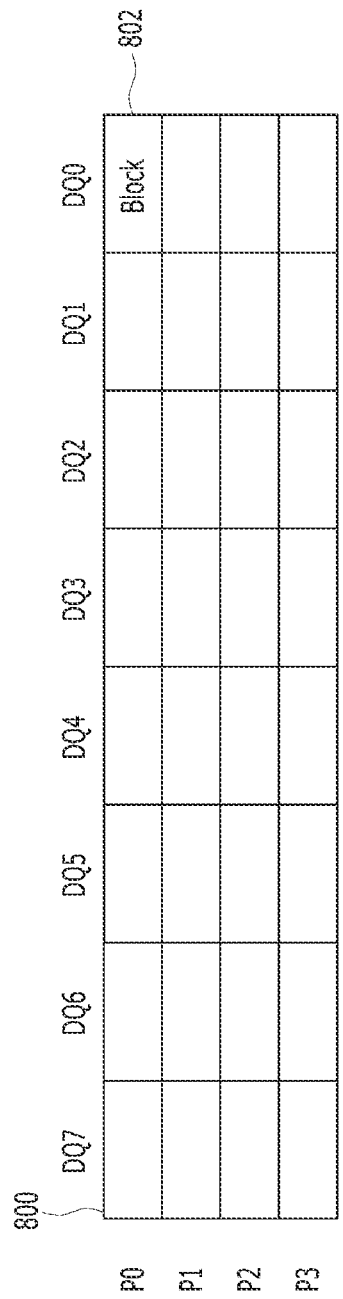

FIG. 55

|   | 1 | 2 | 3 | 4 | 5 | 6 | 8 | 9 | 10 | 11 | 12 | 13 |
|---|---|---|---|---|---|---|---|---|----|----|----|----|
| A | NC | NC | NC | NC |   |   |   |   | NC | NC | NC | NC |
| B | NC | NC | NC | NC |   |   |   |   | NC | NC | NC | NC |
| C | NC | NC | NC | NC |   |   |   |   | NC | NC | NC | NC |
| D | NC | NC | VCCQ | VCCQ | DQ3_1 | VSS | VCC | DQ4_1 | VCCQ | VCCQ | NC | NC |
| E | NC | NC | VSS | DQ2_1 | VSS | DQS_1_T | RE_1_T | VSS | DQ5_1 | VSS | NC | NC |
| F |   |   | DQ0_1 | DQ1_1 | DQS_1_C | DQ2_1 | WE_1_N | VREF_1 | DQ6_1 | DQ7_1 |   |   |
| G |   |   | VSS | VCCQ | ALE_1 | CLE_1 | CE3_1_N | CE2_1_N | VCCQ | VSS |   |   |
| H |   |   | Eno | ENi | WP_1_N | NC | CE1_1_N | CE0_1_N | ZQ_1_N | NC |   |   |
| J |   |   | VSS | VCC | R/B_0_N | R/B_2_N | R/B_3_N | R/B_1_N | VCC | VSS |   |   |
| K |   |   | NC | ZQ_0_N | CE0_0_N | CE1_0_N | VPP | WP_0_N | NC | NC |   |   |
| L |   |   | VSS | VCCQ | CE2_0_N | CE3_0_N | CLE_0 | ALE_0 | VCCQ | VSS |   |   |
| M |   |   | DQ7_0 | DQ6_0 | VREF_0 | WE_0_N | RE_0_C | DQS_0_C | DQ1_0 | DQ0_0 |   |   |
| N | NC | NC | VSS | DQ5_0 | VSS | RE_0_T | DQS_0_T | VSS | DQ2_0 | VSS | NC | NC |
| P | NC | NC | VCCQ | VCCQ | DQ4_0 | VCC | VSS | DQ3_0 | VCCQ | VCCQ | NC | NC |
| R | NC | NC | NC | NC |   |   |   |   | NC | NC | NC | NC |
| T | NC | NC | NC | NC |   |   |   |   | NC | NC | NC | NC |
| U | NC | NC | NC | NC |   |   |   |   | NC | NC | NC | NC |

FIG. 56

| | 1 | 2 | 3 | 4 | 5 | 6 | 8 | 9 | 10 | 11 | 12 | 13 |
|---|---|---|---|---|---|---|---|---|---|---|---|---|
| A | NC | NC | NC | NC | | | | | NC | NC | NC | NC |
| B | NC | NC | NC | NC | | | | | NC | NC | NC | NC |
| C | NC | NC | NC | NC | | | | | NC | NC | NC | NC |
| D | NC | NC | VCCQ | VCCQ | DQ3_1 | VSS | VCC | DQ4_1 | VCCQ | VCCQ | NC | NC |
| E | NC | NC | VSS | DQ2_1 | VSS | DQS_1_T | RE_1_T | VSS | DQ5_1 | VSS | NC | NC |
| F | | | DQ0_1 | DQ1_1 | DQS_1_C | DQ2_1 | WE_1_N | VREF_1 | DQ6_1 | DQ7_1 | | |
| G | VQPS_1 | | VSS | VCCQ | ALE_1 | CLE_1 | CE3_1_N | CE2_1_N | VCCQ | VSS | | NC |
| H | ANA_IT0_1 | | Eno | ENi | WP_1_N | NC | CE1_1_N | CE0_1_N | ZQ_1_N | NC | | VDD_CORE_0 |
| J | VDDI_1 | | VSS | VCC | R/B_0_N | R/B_2_N | R/B_3_N | R/B_1_N | VCC | VSS | | VDDI_0 |
| K | VDD_CORE_1 | | NC | ZQ_0_N | CE0_0_N | CE1_0_N | VPP | WP_0_N | NC | NC | | ANA_IT0_0 |
| L | NC | | VSS | VCCQ | CE2_0_N | CE3_0_N | CLE_0 | ALE_0 | VCCQ | VSS | | VQPS_0 |
| M | | | DQ7_0 | DQ6_0 | VREF_0 | WE_0_N | RE_0_C | DQS_0_C | DQ1_0 | DQ0_0 | | |
| N | NC | NC | VSS | DQ5_0 | VSS | RE_0_T | DQS_0_T | VSS | DQ2_0 | VSS | NC | NC |
| P | NC | NC | VCCQ | VCCQ | DQ4_0 | VCC | VSS | DQ3_0 | VCCQ | VCCQ | NC | NC |
| R | NC | NC | NC | NC | | | | | NC | NC | NC | NC |
| T | NC | NC | NC | NC | | | | | NC | NC | NC | NC |
| U | NC | NC | NC | NC | | | | | NC | NC | NC | NC |

EDGE_A  Interface_test_PIN_B  NAND_PKG_BALL  Interface_test_PIN_A  EDGE_B

EDGE_C  EDGE_D

FIG. 58

| | 1 | 2 | 3 | 4 | 5 | 6 | 8 | 9 | 10 | 11 | 12 | 13 |
|---|---|---|---|---|---|---|---|---|---|---|---|---|
| A | NC | NC | NC | NC | | | | | NC | NC | NC | NC |
| B | NC | NC | NC | NC | | | | | NC | NC | NC | NC |
| C | NC | NC | NC | CE_MUX | | | | | CE4_1_N | CE6_1_N | NC | NC |
| D | NC | NC | VCCQ | VCCQ | DQ3_1 | VSS | VCC | DQ4_1 | VCCQ | VCCQ | NC | NC |
| E | NC | NC | VSS | DQ2_1 | VSS | DQS_1_T | RE_1_T | VSS | DQ5_1 | VSS | NC | NC |
| F | | | DQ0_1 | DQ1_1 | DQS_1_C | DQ2_1 | WE_1_N | VREF_1 | DQ6_1 | DQ7_1 | | |
| G | VQPS_1 | | VSS | VCCQ | ALE_1 | CLE_1 | CE3_1_N | CE2_1_N | VCCQ | VSS | | NC |
| H | ANA_ITO_1 | | Eno | ENi | WP_1_N | CE5_0_N | CE1_1_N | CE0_1_N | ZQ_1_N | CE7_1_N | | VDD_CORE_0 |
| J | VDDI_1 | | VSS | VCC | R/B_0_N | R/B_2_N | R/B_3_N | R/B_1_N | VCC | VSS | | VDDI_0 |
| K | VDD_CORE_1 | | CE7_0_N | ZQ_0_N | CE0_0_N | CE1_0_N | VPP | WP_0_N | NC | CE5_1_N | | ANA_ITO_0 |
| L | NC | | VSS | VCCQ | CE2_0_N | CE3_0_N | CLE_0 | ALE_0 | VCCQ | VSS | | VQPS_0 |
| M | | | DQ7_0 | DQ6_0 | VREF_0 | WE_0_N | RE_0_C | DQS_0_C | DQ1_0 | DQ0_0 | | |
| N | NC | NC | VSS | DQ5_0 | VSS | RE_0_T | DQS_0_T | VSS | DQ2_0 | VSS | NC | NC |
| P | NC | NC | VCCQ | VCCQ | DQ4_0 | VCC | VSS | DQ3_0 | VCCQ | VCCQ | NC | NC |
| R | NC | NC | CE6_0_N | CE4_0_N | | | | | NC | NC | NC | NC |
| T | NC | NC | NC | NC | | | | | NC | NC | NC | NC |
| U | NC | NC | NC | NC | | | | | NC | NC | NC | NC |

FIG. 59

|   | 1 | 2 | 3 | 4 | 5 | 6 | 7 | 8 | 9 | 10 | 11 | 12 | 13 |
|---|---|---|---|---|---|---|---|---|---|----|----|----|----|
| A | NC | NC | NC | NC |   |   |   |   |   | NC | NC | NC | NC |
| B | NC | NC | NC | NC | VQPS_1 | ANA_ITO_1 | VDDI_1 | VDD_CORE_1 | NC | NC | NC | NC | NC |
| C | NC | NC | NC | CE_MUX |   |   |   |   |   | CE4_1_N | CE6_1_N | NC | NC |
| D | NC | NC | VCCQ | VCCQ | DQ3_1 | VSS |   | VCC | DQ4_1 | VCCQ | VCCQ | NC | NC |
| E | NC | NC | VSS | DQ2_1 | VSS | DQS_1_T |   | RE_1_T | VSS | DQ5_1 | VSS | NC | NC |
| F |   |   | DQ0_1 | DQ1_1 | DQS_1_C | DQ2_1 |   | WE_1_N | VREF_1 | DQ6_1 | DQ7_1 |   |   |
| G | VQPS_1 |   | VSS | VCCQ | ALE_1 | CLE_1 |   | CE3_1_N | CE2_1_N | VCCQ | VSS |   | NC |
| H | ANA_ITO_1 |   | Eno | ENi | WP_1_N | CE5_0_N |   | CE1_1_N | CE0_1_N | ZQ_1_N | CE7_1_N |   | VDD_CORE_0 |
| J | VDDI_1 |   | VSS | VCC | R/B_0_N | R/B_2_N |   | R/B_3_N | R/B_1_N | VCC | VSS |   | VDDI_0 |
| K | VDD_CORE_1 |   | CE7_0_N | ZQ_0_N | CE0_0_N | CE1_0_N |   | VPP | WP_0_N | NC | CE5_1_N |   | ANA_ITO_0 |
| L | NC |   | VSS | VCCQ | CE2_0_N | CE3_0_N |   | CLE_0 | ALE_0 | VCCQ | VSS |   | VQPS_0 |
| M |   |   | DQ7_0 | DQ6_0 | VREF_0 | WE_0_N |   | RE_0_C | DQS_0_C | DQ1_0 | DQ0_0 |   |   |
| N | NC | NC | VSS | DQ5_0 | VSS | RE_0_T |   | DQS_0_T | VSS | DQ2_0 | VSS | NC | NC |
| P | NC | NC | VCCQ | VCCQ | DQ4_0 | VCC |   | VSS | DQ3_0 | VCCQ | VCCQ | NC | NC |
| R | NC | NC | CE6_0_N | CE4_0_N |   |   |   |   |   | NC | NC | NC | NC |
| T | NC | NC | NC | NC | NC | VDD_CORE_0 | VDDI_0 | ANA_ITO_0 | VQPS_0 | NC | NC | NC | NC |
| U | NC | NC | NC | NC |   |   |   |   |   | NC | NC | NC | NC |

MEMORY SYSTEM AND OPERATING METHOD OF THE MEMORY SYSTEM

CROSS-REFERENCE TO RELATED APPLICATIONS

This application is a continuation of U.S. patent application Ser. No. 17/825,837, filed on May 26, 2022, which is a continuation of U.S. patent application Ser. No. 16/992,424, filed on Aug. 13, 2020, which is a continuation-in-part application of U.S. patent application Ser. No. 16/895,050, filed on Jun. 8, 2020 and issued as U.S. Pat. No. 11,170,831 on Nov. 9, 2021, which is a continuation of U.S. patent application Ser. No. 16/215,981, filed on Dec. 11, 2018 and issued as U.S. Pat. No. 10,714,162 on Jul. 14, 2020;

This application is a continuation of U.S. patent application Ser. No. 17/825,837, filed on May 26, 2022, which is a continuation of U.S. patent application Ser. No. 16/992,424, filed on Aug. 13, 2020, which is a continuation-in-part application of U.S. patent application Ser. No. 16/679,561, filed on Nov. 11, 2019 and issued as U.S. Pat. No. 11,062,742 on Jul. 13, 2021;

This application is a continuation of U.S. patent application Ser. No. 17/825,837, filed on May 26, 2022, which is a continuation of U.S. patent application Ser. No. 16/992,424, filed on Aug. 13, 2020, which is a continuation-in-part application of U.S. patent application Ser. No. 16/679,582, filed on Nov. 11, 2019 and issued as U.S. Pat. No. 11,069,387 on Jul. 20, 2021;

This application is a continuation of U.S. patent application Ser. No. 17/825,837, filed on May 26, 2022, which is a continuation of U.S. patent application Ser. No. 16/992,424, filed on Aug. 13, 2020, which is a continuation-in-part application of U.S. patent application Ser. No. 16/679,601, filed on Nov. 11, 2019 and issued as U.S. Pat. No. 11,150,838 on Oct. 19, 2021; and This application is a continuation of U.S. patent application Ser. No. 17/825,837, filed on May 26, 2022, which is a continuation of U.S. patent application Ser. No. 16/992,424, filed on Aug. 13, 2020, which is a continuation-in-part application of and U.S. patent application Ser. No. 16/727,282, filed on Dec. 26, 2019 and issued as U.S. Pat. No. 11,133,080 on Sep. 28, 2021.

This application claims priority to Korean patent application Nos. 10-2019-0047421 filed on Apr. 23, 2019, 10-2019-0050617 filed on Apr. 30, 2019, 10-2019-0050591 filed on Apr. 30, 2019 and 10-2019-0064089 filed on May 30, 2019. The disclosure of each of the above-identified applications is incorporated herein by reference in its entirety.

BACKGROUND

1. Field

Various embodiments of the present invention generally relate to a memory system. Particularly, embodiments relate to a memory system for processing data with a memory device, and a method for operating the memory system.

2. Description of the Related Art

The computer environment paradigm has been shifting to ubiquitous computing, which enables computer systems to be used anytime and anywhere. As a result, use of portable electronic devices such as mobile phones, digital cameras, and notebook computers has rapidly increased. These portable electronic devices generally use a memory system having one or more memory devices for storing data. A memory system in such device may be used as a main memory device or an auxiliary memory device.

Such memory systems provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Embodiments of the present invention are directed to a memory system capable of accurately correcting a dock of a memory system, and a method of operating the memory system.

In accordance with an embodiment of the present invention, a memory system includes: a memory device including an interface circuit and a semiconductor memory; and a controller configured to generate a command for controlling the memory device. The interface circuit receives the command from the controller; determines whether the command is for the semiconductor memory or the interface circuit; and when it is determined that the received command is for the interface circuit, performs a blocking operation to block transfer of the command between the interface circuit and the semiconductor memory and performs an internal operation of the interface circuit. The internal operation includes one of a signal controlling operation, a training operation, a read operation, an on-die termination operation, a ZQ calibration operation, or a driving force control operation.

In accordance with another embodiment of the present invention, a memory system includes: an external channel operatively coupling a plurality of internal channels through a plurality of interface devices, the plurality of internal channels including first and second internal channels, the plurality of interface devices including first and second interface devices; the first internal channel operably coupling the first interface device with a first memory device; the second internal channel operably coupling the second interface device with a second memory device; and a controller configured to send a plurality of control signals, including a first control signal to send to the first interface device and a second control signal to send to the second interface device, to control an operation of the memory devices or the interface devices. The first interface device is configured to receive the first control signal including a command for correcting a duty cycle of a memory control signal transferred by the first interface device.

BRIEF DESCRIPTION OF THE DRAWINGS

FIG. 9A exemplarily shows each bit of an operation control register of an interface device in accordance with an embodiment of the present invention.

FIG. 55 is a diagram illustrating packaging ball mapping of a packaged memory device.

FIG. 56 is a diagram illustrating packaging ball mapping of a memory device according to an embodiment of the present disclosure.

FIG. 58 is a diagram illustrating packaging ball mapping of a memory device according to an embodiment of the present disclosure.

FIG. 59 is a diagram illustrating packaging ball mapping of a memory device according to an embodiment of the present disclosure.

DETAILED DESCRIPTION

Figure 1:
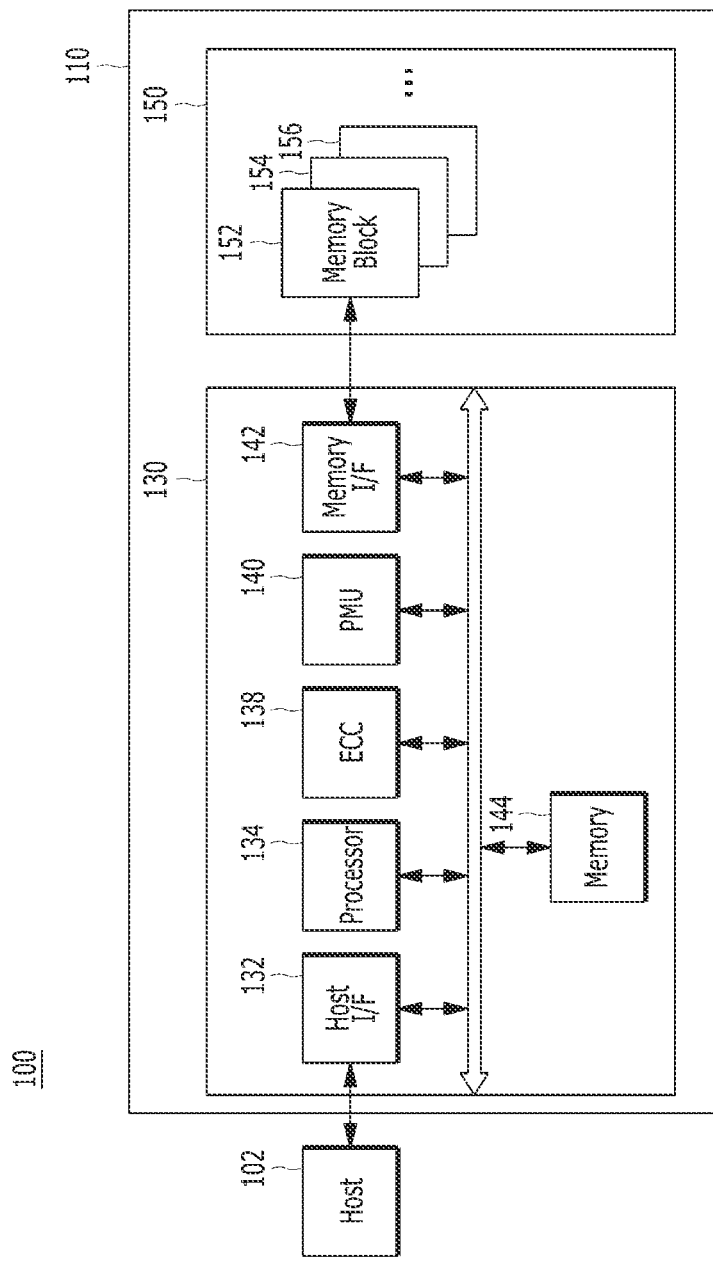
FIG. 1 is a block diagram illustrating a data processing system in accordance with an embodiment of the present invention.

Various embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. It is noted that reference to "an embodiment," "another embodiment" or the like does not necessarily mean only one embodiment, and different references to any such phrase are not necessarily to the same embodiment(s). Also, the term "embodiments" when used herein does not necessarily refer to all embodiments.

It will be understood that, although the terms "first" and/or "second" may be used herein to identify various elements, these elements should not be limited by these terms. These terms are only used to distinguish one element from another element that otherwise have the same or similar names. A first element in one instance could be termed a second element in another instance without indicating any change in the element itself.

It will be understood that when an element is referred to as being "coupled" or "connected" to another element, it can be directly coupled or connected to the other element or one or more intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations thereof but do not preclude the presence or addition of one or more other features, numbers, steps, operations, elements, components, and/or combinations thereof.

The embodiments described herein are merely for the purpose of understanding the technical spirit of the present disclosure; the scope of the present invention should not be limited to any of the disclosed embodiments. As those skilled in the art to which the present disclosure pertains will understand, other modifications based on the technical spirit of the present disclosure may be made to any of the above-described embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed in an ideal or excessively formal way.

Hereinafter, various embodiments of the present invention are described in detail with reference to the attached drawings.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and laptop computer, or any of various non-portable electronic devices such as a desktop computer, game machine, TV, and projector.

The host 102 may include at least one operating system (OS), which may manage and control overall functions and operations of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a power saving function of a system may include Android, iOS and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 may include a solid state drive (SSD), a multi-media card (MMC), a secure digital (SD) card, a universal serial bus (USB) device, a universal flash storage (UFS) device, compact flash (CF) card, a smart media card (SMC), a personal computer memory card international association (PCMCIA) card and memory stick. The MMC may include an embedded MMC (eMMC), reduced size MMC (RS-MMC), micro-MMC, and the like. The SD card may include a mini-SD card and micro-SD card.

The memory system 110 may be embodied by various types of storage devices. Examples of such storage devices include, but are not limited to, volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 102, and the controller 130 may control data stored in the memory device 150.

The controller 130 and the memory device 150 may be integrated into a single semiconductor device, which may be included in any of the various types of memory systems as exemplified above. For example, the controller 130 and the memory device 150 may be integrated as one semiconductor device to constitute an SSD. When the memory system 110 is used as an SSD, the operating speed of the host 102 connected to the memory system 110 can be improved. In addition, the controller 130 and the memory device 150 may be integrated as one semiconductor device to constitute a memory card, such as a PCMCIA (personal computer memory card international association) card, CF card, SMC (smart media card), memory stick, MMC including RS-MMC and micro-MMC, SD card including mini-SD, micro-SD and SDHC, or UFS device.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even when power is not supplied or interrupted. The memory device 150 may store data provided from the host 102 through a write operation, and provide data stored therein to the host 102 through a read operation. The memory device 150 may include a plurality of memory blocks 152, 154, 156 . . . (hereinafter, referred to as "memory blocks 152 to 156") each of which may include a plurality of pages, and each of the pages may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of these elements and features are omitted here.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a memory I/F 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (DATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may output an error correction fail signal.

The ECC component 138 may perform error correction through a coded modulation such as Low Density Parity Check (LDDC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include any and all circuits, modules, systems or devices for suitable error correction.

The PMU 140 may provide and manage power of the controller 130.

The memory I/F 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150 and process data to be provided to the memory device 150 under the control of the processor 134. The memory 142 may work as an interface (e.g., a NAND flash interface) for processing a command and data between the controller 130 and the memory device 150. Specifically, the memory I/F 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or out of the controller 130. FIG. 1 exemplifies the memory 144 disposed within the controller 130. In an embodiment, the memory 144 may be embodied by an external volatile memory having a memory interface transferring data between the memory 144 and the controller 130.

The processor 134 may control overall operation of the memory system 110. The processor 134 may drive firmware to control overall operation of the memory system 110. The firmware may be referred to as flash translation layer (FTL). Also, the processor 134 may be realized as a microprocessor or a Central Processing Unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102, or source other than the host 102. The controller 130 may perform a foreground operation as the command operation corresponding to the command received from the host 102. For example, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation on the memory device 150 through the processor 134, which is realized as a microprocessor or a CPU. The background operation performed on the memory device 150 may include an operation of copying and processing data stored in some memory blocks among the memory blocks 152 to 156 of the memory device 150 into other memory blocks, e.g., a garbage collection (GC) operation, an operation of swapping between the memory blocks 152 to 156 or between the data of the memory blocks 152 to 156, e.g., a wear-leveling (WL) operation, an operation of storing the data stored in the controller 130 in the memory blocks 152 to 156, e.g., a flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
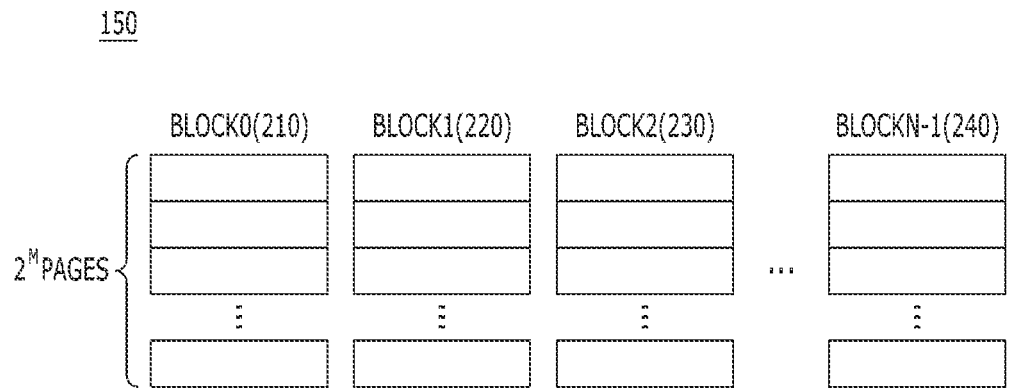
FIG. 2 is a schematic diagram illustrating an exemplary configuration of a memory device employed in a memory system of FIG. 1.
Figure 3:
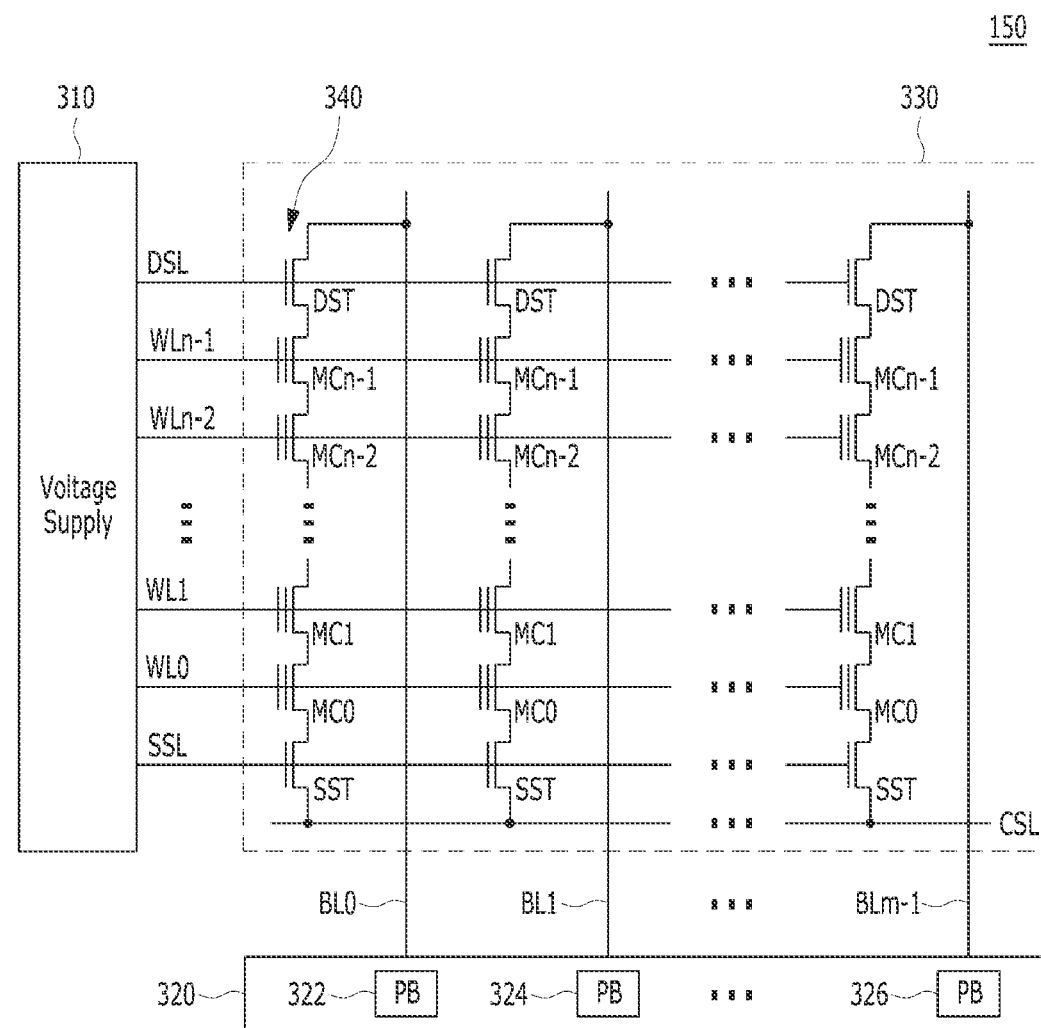
FIG. 3 is a circuit diagram illustrating an exemplary configuration of a memory cell array of a memory block in a memory device shown in FIG. 1.
Figure 4:
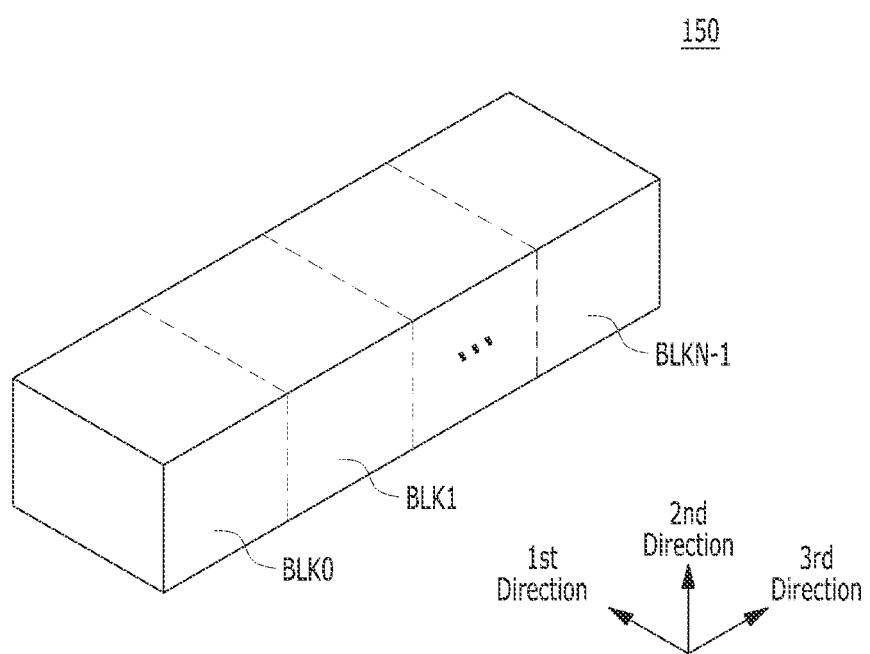
FIG. 4 is a schematic diagram illustrating an exemplary three-dimensional (3D) structure of the memory device of FIG. 2.

FIG. 2 is a schematic diagram illustrating the memory device 150, FIG. 3 is a circuit diagram illustrating an exemplary configuration of a memory cell array of a memory block in the memory device 150, and FIG. 4 is a schematic diagram illustrating an exemplary 3D structure of the memory device 150.

Referring to FIG. 2, the memory device 150 may include a plurality of memory blocks 0 to N−1, e.g., a memory block 0 BLOCK0(210), a memory block 1 BLOCK1 (220), a memory block 2 BLOCK2 (230), and a memory block N−1 BLOCKN−1 (240). Each of the memory blocks BLOCK0 to BLOCKN−1 may include a plurality of pages, for example 2m pages, the number of which may vary according to circuit design. For example, in some applications, each of the memory blocks may include M pages. Each of the pages may include a plurality of memory cells that are coupled to a plurality of word lines WL.

Also, the memory device 150 may include a plurality of memory blocks, which may include a single level cell (SLC) memory block in which each memory cell stores 1 bit of data and/or a multi-level cell (MLC) memory block in which each memory cell stores 2 bits of data. The SLC memory blocks may include a plurality of pages that are realized by memory cells storing one-bit data in one memory cell. The SLC memory blocks may have high speed data operation performance and high durability. On the other hand, the MLC memory blocks may include a plurality of pages that are realized by memory cells storing multi-bit data, e.g., data of two or more bits, in one memory cell. The MLC memory blocks may have a greater data storage space than the SLC memory blocks. In other words, the MLC memory blocks may be highly integrated. Particularly, the memory device 150 may include not only the MLC memory blocks, each of which includes a plurality of pages that are realized by memory cells each capable of storing two bits of data, but also triple level cell (TLC) memory blocks each of which includes a plurality of pages that are realized by memory cells each capable of storing three bits of data, quadruple level cell (QLC) memory blocks each of which includes a plurality of pages that are realized by memory cells each capable of storing four bits data, and/or multiple level cell memory blocks each of which includes a plurality of pages that are realized by memory cells each capable of storing five or more bits of data.

In accordance with an embodiment of the present invention, the memory device 150 is described as a non-volatile memory, such as a flash memory, e.g., a NAND flash memory. However, the memory device 150 may be realized as any memory among a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

The memory blocks BLOCK0 to BLOCKN−1 may store the data transferred from the host 102 through a program operation, and transfer data stored therein to the host 102 through a read operation.

Referring to FIG. 3, a memory block 330 may include a plurality of cell strings 340 coupled to a plurality of corresponding bit lines BL0 to BLm−1. The memory block 330 may correspond to any of the plurality of memory blocks 152 to 156 included in the memory device 150 of the memory system 110 shown in FIG. 1, The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines as may be needed.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

Referring to FIG. 4, the memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. The memory blocks BLK0 to BLKN−1 may correspond to the memory blocks 152 to 156 shown in FIG. 1 and the memory blocks BLOCK0 to BLOCKN−1 shown in FIG. 2. Each of the memory blocks BLK0 to BLKN−1 may be realized in a 3D structure (or vertical structure). For example, the memory blocks BLK0 to BLKN−1 may be a three-dimensional structure with dimensions extending in first to third directions, e.g., an x-axis direction, a y-axis direction, and a z-axis direction.

Although not illustrated in FIG. 4, each memory block BLK0 to BLKN−1 which may correspond to any one memory block among the memory blocks shown in FIGS. 1 to 3 of the memory device 150 may include a plurality of NAND strings NS that are extended in the second direction, and a plurality of NAND strings NS that are extended in the first direction and the third direction. Each of the NAND strings NS may be coupled to a bit line BL, at least one string selection line SSL, at least one ground selection line GSL, a plurality of word lines WL, at least one dummy word line DWL, and a common source line CSL, and each of the NAND strings NS may include a plurality of transistor structures TS.

In short, each memory block BLK0 to BLKN−1 which may correspond to any one memory block among the memory blocks shown in FIGS. 1 to 3 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Memory cells MC may be provided between the string selection transistor SST and the ground selection transistor GST of each NAND string NS. In other words, a plurality of memory cells may be realized in each memory block 330 of the memory blocks 152 to 156 of the memory device 150.

Hereinafter, a data processing operation of a memory device, particularly, a data processing operation performed when a plurality of command operations corresponding to a plurality of commands are performed, in a memory system in accordance with an embodiment of the present invention is described in detail with reference to FIGS. 5 to 13.

Figure 5:
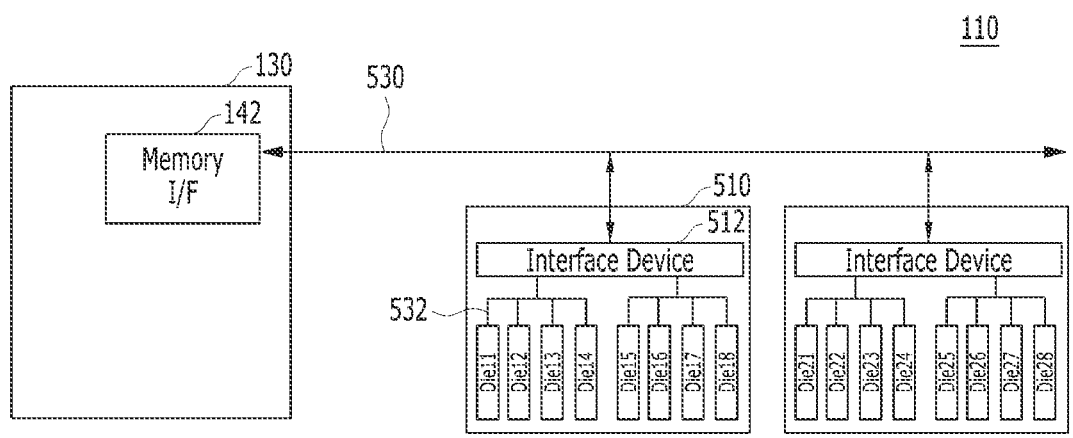
FIG. 5 is a block diagram illustrating an example of a memory system including an interface device.

FIG. 5 is a block diagram illustrating an example of the memory system 110 including an interface device 512.

The memory system 110 may include a plurality of memory devices 150 to meet the demands for increasing capacity of the memory system 110. Each memory dies Die 11 to Die 28 shown in FIG. 5 may correspond to the memory device 150 of FIG. 1. A set number of the memory devices 150 may be packaged into a memory package 510 and included in the memory system 110.

When the loading capacitance of the memory package 510 including a plurality of the memory devices 150 increases, the speed of the memory system 110 may be degraded due to Inter-Symbol Interference (ISI). To improve this problem, the memory package 510 may include an interface device 512 (ISSCC 2015 SESSION 7/NON-VOLATILE MEMORY SOLUTIONS/7.6 1 GB/s 2 Tb NAND Flash Mufti-Chip Package with Frequency-Boosting Interface Chip).

The interface device 512 may perform communication between the controller 130 and the memory dies Die 11 to Die 28. The memory package 510 may include an internal channel 532 that couples the interface device 512 to the memory devices 150. FIG. 5 illustrates the memory package 510 that includes two internal channels 532. In this case, the effective loading capacitance of the memory package 510 may be reduced by half, which may improve the speed of the memory system 110.

Figure 6:
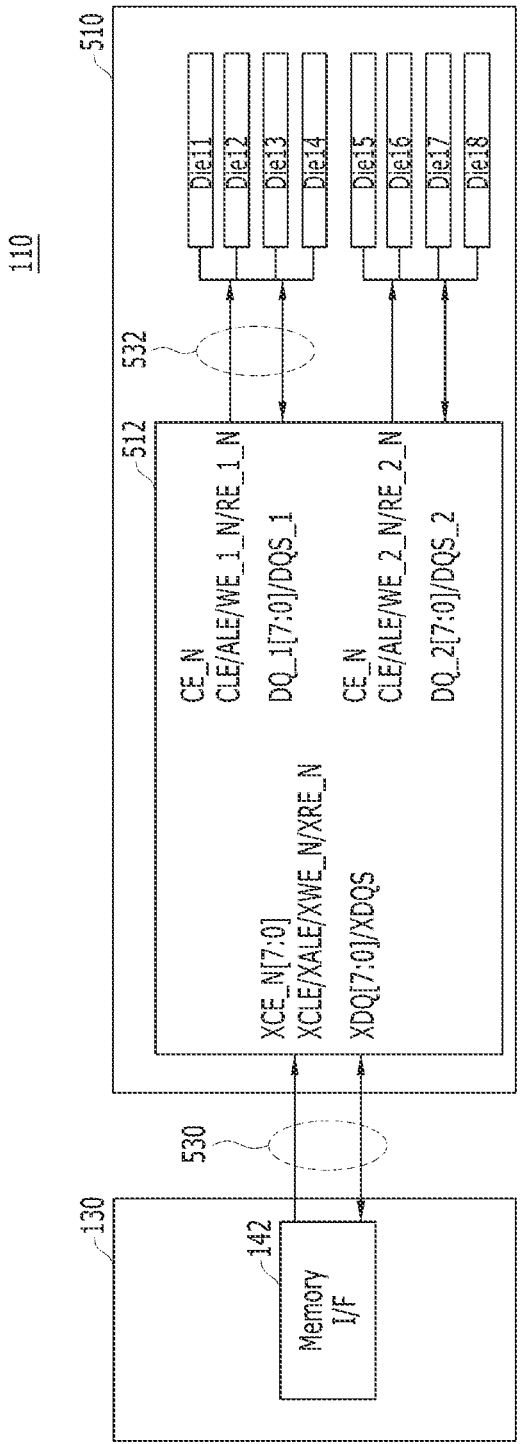
FIG. 6 is a block diagram illustrating an example of a controller and a memory device that communicates with each other through an interface device in a memory system.

FIG. 6 is a block diagram illustrating an example of the controller 130 and the memory device 150 that communicate with each other through the interface device 512 of the memory system 110.

When the controller 130 controls a write operation of the memory die Die 11 in response to a write command transferred from a host (e.g., the host 102 shown in FIG. 1), the interface device 512 may receive a chip enable signal XCE_N[7:0], a command enable signal XCLE, an address enable signal XALE, a write enable signal XWE_N, and a data strobe signal XDQS as control signals, and a data signal XDQ[7:0] as a data signal. The interface device 512 may output an internal chip enable signal CE_N, an internal command enable signal CLE, an internal address enable signal ALE, an internal write enable signal WE_1_N, an internal data signal DQ_N[7:0], an internal data strobe signal DQS_N to the memory die Die 11 corresponding to the chip enable signal XCE_N[7:0] through the internal channel 532 in response to the received control signal.

When the controller controls a read operation of the memory die Die 11 in response to a read command transferred from the host, the interface device may receive a chip enable signal XCE_N[7:0], a command enable signal XCLE, an address enable signal XALE, a read enable signal XRE_N as control signals. The interface device 512 may output an internal chip enable signal CE_N, an internal command enable signal CLE, an internal address enable signal ALE, an internal read enable signal RE_1_N to the memory die Die 11 corresponding to the chip enable signal XCE_N[7:0] through the internal channel 532 in response to the received control signal.

As described above, the effective loading capacitance may be reduced so that the memory system 110 may operate at a high frequency by transferring a control signal from the controller 130 to the interface device 512 of the memory package 510 and transferring an internal signal from the interface device 512 to the memory device 150 based on the received control signal. As a high-speed operation through the interface device 512 is realized, the need for duty cycle correction is increased.

Figure 7:
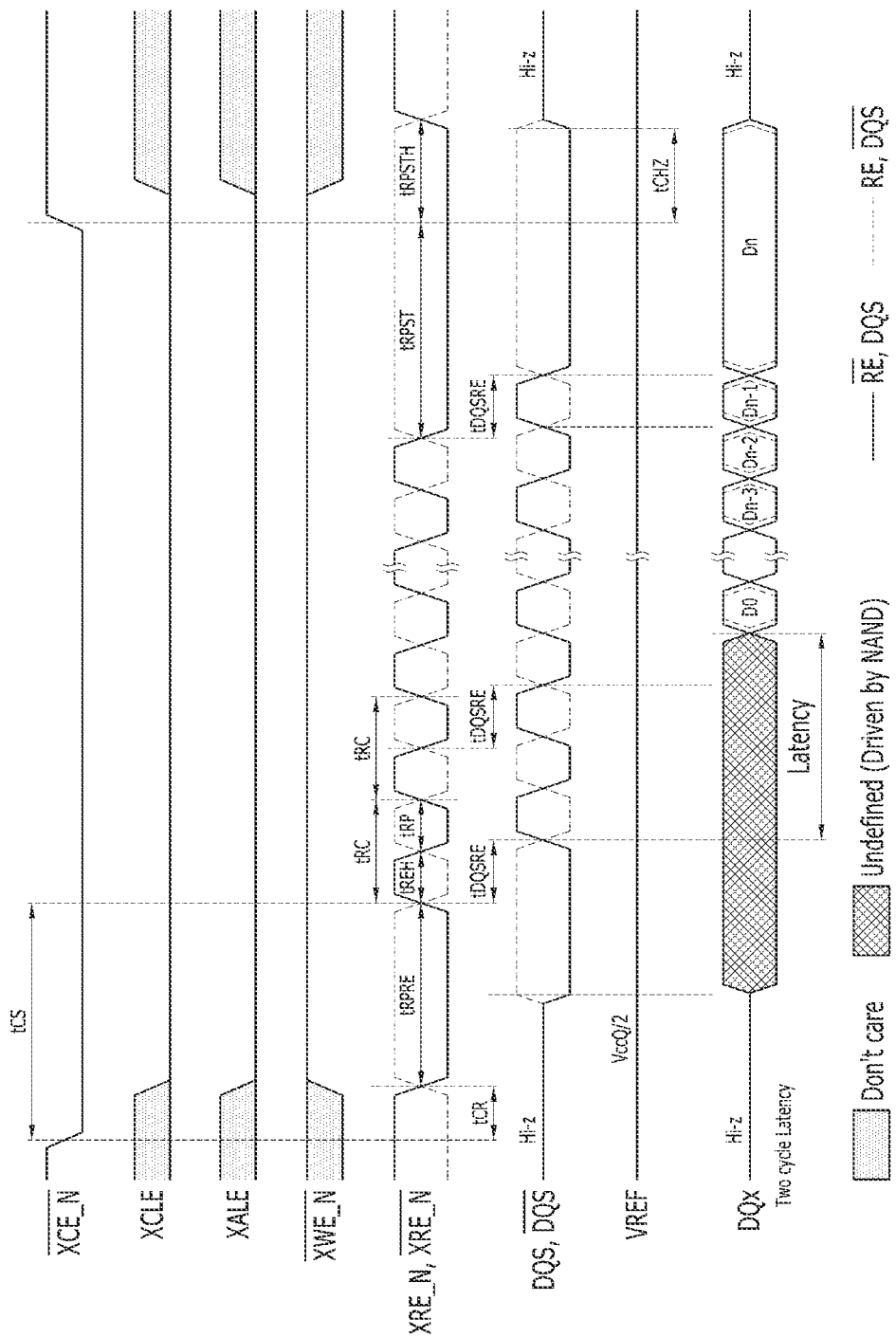
FIG. 7 is a timing diagram illustrating an example of a method for correcting a duty cycle in a memory device.

FIG. 7 is a timing diagram illustrating an example of a method for correcting a duty cycle in the memory device 150.

When a read command is received from the host 102, the controller 130 may generate a chip enable signal XCE_N, a command enable signal XCLE, an address enable signal XALE, and a read enable signal XRE_N. The memory device 150 corresponding to the memory dies Die 11 to Die 28 may perform a read operation in response to the signals and generate a data strobe signal DQS based on the read enable signal RE. The memory device 150 may output a data signal DQ to the controller 130 in response to the data strobe signal DQS.

When the duty cycle of the read enable signal RE is not approximately 50%, the duty cycle of the data strobe signal DQS generated based on the read enable signal RE may not be approximately 50%. Further, the data signal DQ may be outputted in both high and low sections of the data strobe signal DQS in the memory system 110 operating at a high speed. Therefore, the duty cycle of the data signal DQ outputted in response to the data strobe signal DQS may not be approximately 50%. Since the time section during which the data signal DQ is enabled is short in the memory system 110 operating at a high speed, it may be desirable to broaden a data valid window by matching the ratio of the high section and the low section, for example, to approximately 50%.

According to an embodiment, the memory device 150 may not output a valid data signal immediately after the data strobe signal DQS is generated, but instead output the valid data signal after a latency period, which may be a specific number of cycles.

According to Korean Patent Publication No. 10-2016-0041717, the duty cycle of a read enable signal RE is corrected in the latency period, and then the read enable signal RE and a data strobe signal DQS, duty cycles of which are corrected during the latency period, are outputted after the latency period.

However, the length of the latency period may be restricted according to how the memory device 150 is implemented, and even though the length of the latency period is not restricted, if the latency period is too long during a read operation, the performance of the memory system 110 may be degraded.

Therefore, according to the above technique, the memory device 150 has to correct the duty cycle within only a few cycles after the read enable signal RE is driven. However, since an error may occur in the duty cycle correction due to the generation of power noise immediately after the read enable signal RE is driven and the duty cycle correction has to be completed within a short time, the accuracy may be poor, which is problematic.

According to an embodiment of the present invention, in response to an interface control signal from the controller 130, the interface device 512 may correct a duty cycle. Herein, the interface device 512 may deactivate the internal channel 532 to prevent the internal signal from being transferred to the memory device 150, and may correct the duty cycle by using a sufficiently long period of time as well as the latency interval. The reliability of the memory system 110 may be improved by increasing the accuracy of the duty cycle correction according to an embodiment of the present invention.

Figure 8:
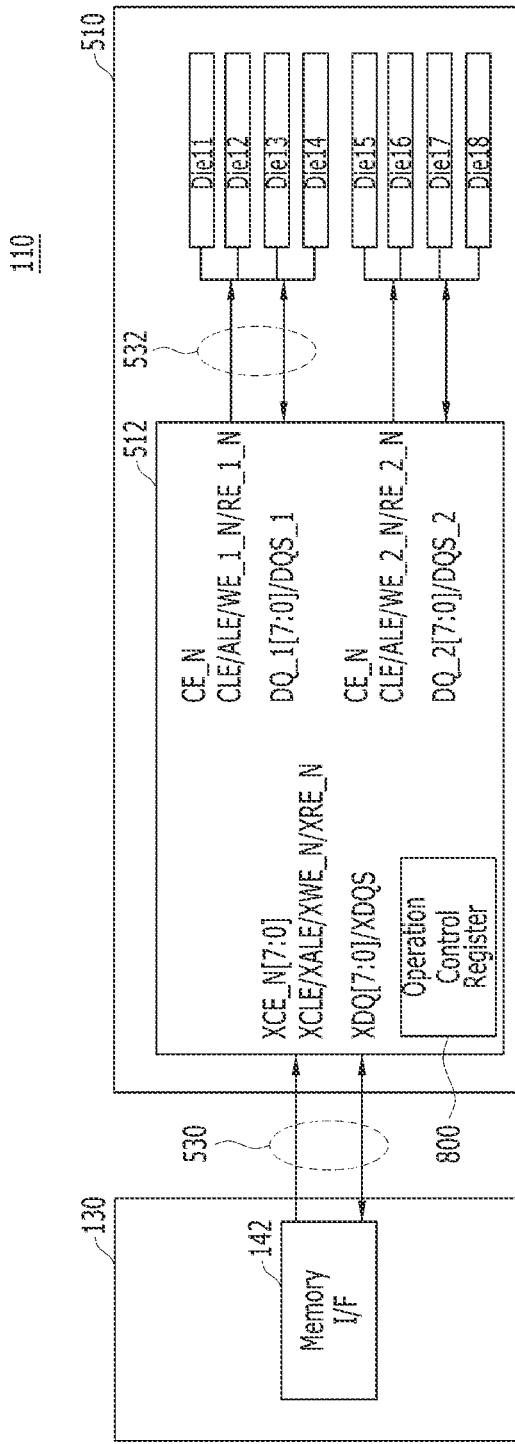
FIG. 8 is a block diagram illustrating a memory system in accordance with an embodiment of the present invention.

FIG. 8 is a block diagram illustrating the memory system 110 in accordance with an embodiment of the present invention.

According to an embodiment of the present invention, the interface device 512 may include an operation control register 800. The operation control register 800 may store information on whether the internal channel 532 is activated or not. The operation control register 800 may be, but not limited to, a 32-bit register, FIG. 9A exemplarily shows each bit of the operation control register 800 of the interface device 512, when the operation control register 800 is assumed to be a 32-bit register, in accordance with an embodiment of the present invention.

The controller 130 may store the information on whether the internal channel 532 is activated or not by providing a set feature command to the interface device 512 and changing a value stored in the operation control register 800. The set feature command may refer to a command used when an operation of the memory device 150 is to be changed. The set feature command may refer to a command which does not cause a change of a status or an operation of the memory device 150. For example, the set feature command may include a set feature address which is not related with a read, write or erase operation of the memory device 150. The set feature command may include the set feature address which may be accessed by the interface device 512. The set feature command including the set feature address may be accessed by the interface device 512 after receiving a reserved set feature command. The set feature address in the set feature command is different with a reserved set feature address in the reserved set feature command. For example, the set feature address may be one of A0h~Afh and the reserved set feature address may be one of 91h~9fh and B0~ffh.

Figure 9B:
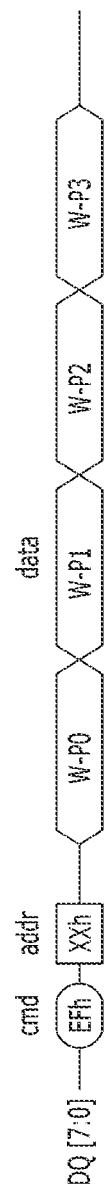
FIG. 9B is a timing diagram illustrating a set feature command in accordance with an embodiment of a present invention.

FIG. 9B is a timing diagram illustrating the set feature command, when the operation control register is assumed to be a 32-bit register, in accordance with an embodiment of the present invention.

In the example of FIG. 9B, the controller 130 may transfer a command, an address, and a 32-bit data through the data bus DQ[7:0]. The 32-bit data may be transferred through four-time transfer operations P0 to P3.

For example, in FIG. 9B, the controller 130 transfers a command EFh (denoted as "crud"), and address XXh (denoted as "addr"), and 32-bits of data W-P0 to W-P3 (denoted as "data") through the data bus DQ[7:0]. The 32-bit data may be transferred through four-time transfer operations W-P0 to W-P3.

According to an embodiment of the present invention, at least one of the bits of the operation control register 800 may be designated as a blocking bit 802. In the example of FIG. 9A, the P0<0> bit, that is, the bit to be transferred first to the 32-bit register, may be designated as the blocking bit 802 (denoted as "Block"). For another example, P0<1> bit may be designated as the blocking bit 802. The value transferred as the blocking bit 802 may be different according to whether the internal channel 532 is activated or not. At least one of the bits of the operation control register 800 may be designated as a selecting bit (not shown). In the example of FIG. 9A, the P0<0> bit, that is, the bit to be transferred first to the 32-bit register, may be designated as the selecting bit. A set feature command including a set feature address may be accessed by the interface device 512 after receiving the selecting bit. A set feature command including a set feature address may be accessed by the interface device 512 after receiving a reserved set feature command including the selecting bit. The interface device 512 may access the operation control register 800 according the selecting bit. The interface device 512 may access the operation control register 800 after receiving the selecting bit. The interface device 512 may write or read the operation control register 800 depending on a value of the selecting bit.

Although FIGS. 9A and 9B illustrate, as an example and for convenience of description, that the operation control register is a 32-bit register, it is to be noted that the present invention is not limited thereto. That is, the number of bits of the register may vary depending on design.

Figure 10:
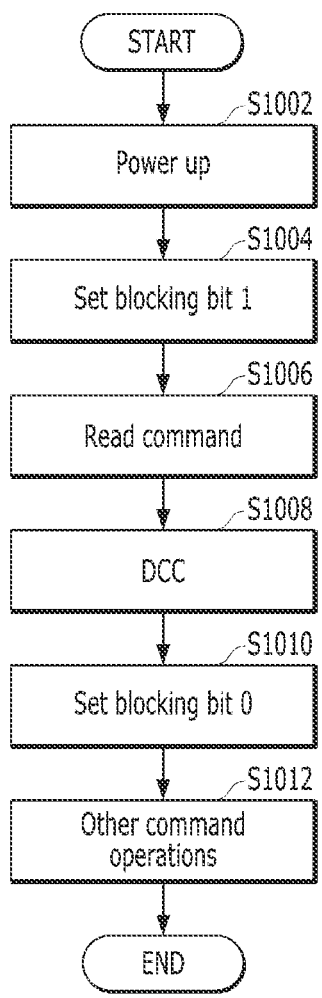
FIG. 10 is a flowchart describing an operation of the memory system in accordance with an embodiment of the present invention.

FIG. 10 is a flowchart describing an operation of the memory system 110 in accordance with an embodiment of the present invention.

When the memory system 110 is powered up (or turned on) in step S1002, the interface device 512 may correct the duty cycle of the clock by performing the operations of steps S1004 to S1010.

According to an embodiment of the present invention, the memory system 110 may include a plurality of interface devices 512, and each of the interface devices 512 may correct its duty cycle of the clock.

In step S1004, the controller 130 may transfer a command for setting the blocking bit 802 to a set value, for example, '1', to the interface device 512 in order to deactivate the internal channel 532. The interface device 512 may set the blocking bit 802 to '1' in response to the command.

In step S1006, the controller 130 may provide a read command to the interface device 512. Referring to FIG. 8, since the external channel 530 is activated, the interface device 512 may receive the chip enable signal XCE_N[7:0], the command enable signal XCLE, the address enable signal XALE_N, and the read enable signal XRE_N from the controller 130 as control signals.

In response to the received signal, the interface device 512 may generate an internal chip enable signal CE_N, an internal command enable signal CLE, an internal address enable signal ALE_N, and an internal lead enable signal RE_N as internal signals.

The interface device 512 may check the value of the blocking bit 802 to determine whether to transfer the generated signals to the memory device 150. Since the value of the blocking bit 802 is set to '1' in the step S1004, the interface device 512 may not transfer the generated internal signals to the memory device 150 by deactivating the internal channel 532 accordingly.

According to an embodiment of the present invention, the interface device 512 may disable the internal signals including the internal chip enable signal CE_N based on the value of the blocking bit 802. The interface device 512 may disable only the internal chip enable signal CE_N among the internal signals based on the value of the blocking bit 802. For example, the interface device 512 may disable the internal chip enable signal CE_N by keeping the internal chip enable signal CE_N having a logic high level, when the value of the blocking bit 802 is '1'. In this case, even if the remaining signals are transferred to the memory device 150, operations according to the signals are not actually performed in the memory device 150.

When a read command is received while the internal channel 532 is deactivated, the interface device 512 may correct the duty cycle based on the received signal in step S1008. The read command may be a command for generating a clock signal for duty cycle correction (DCC). In this present specification, this command may be referred to as a "correction command".

Hereafter, the operations of the steps S1004 to S1008 will be described in more detail with reference to FIGS. 11 and 12.

Figure 11:
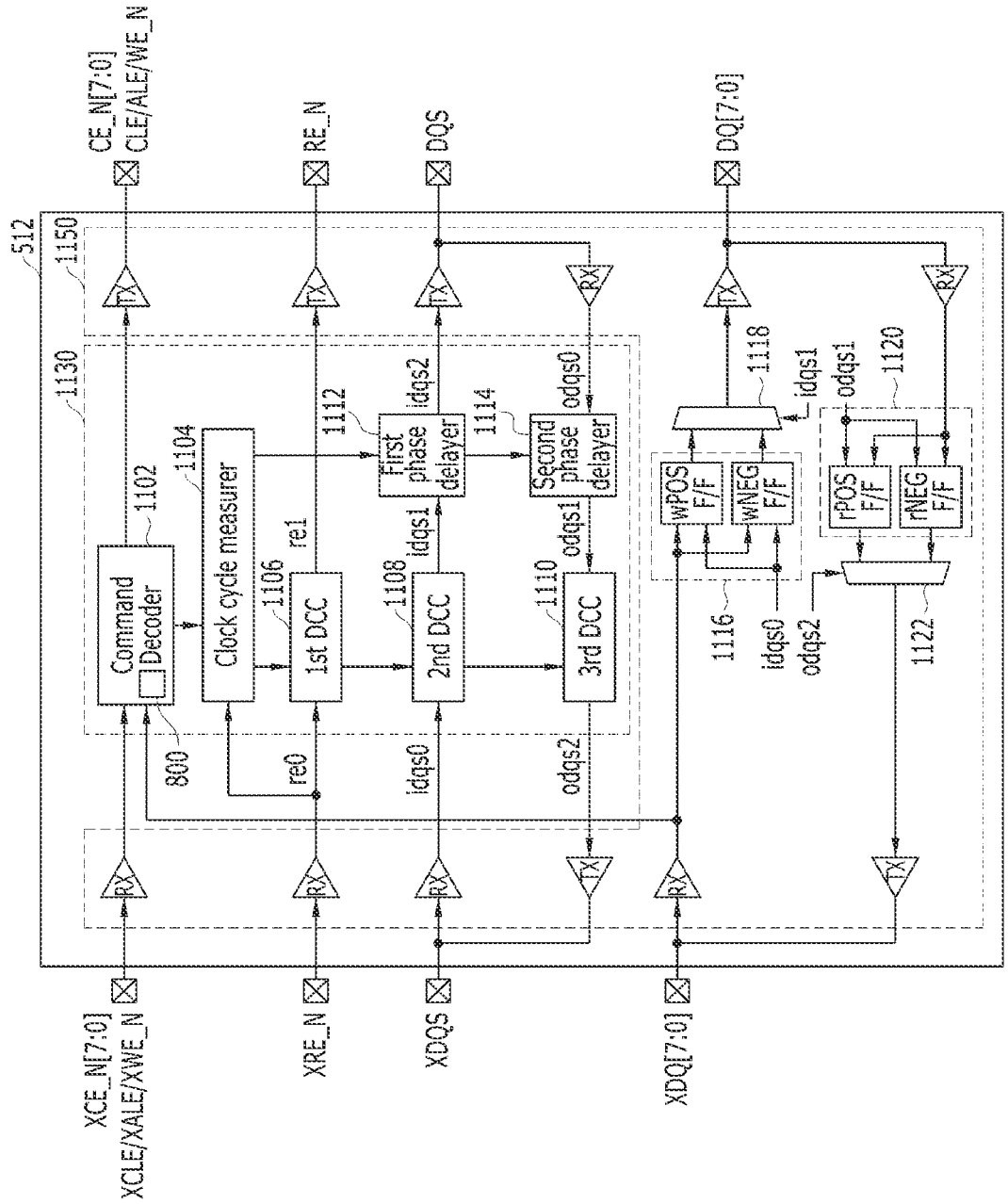
FIG. 11 is a schematic diagram illustrating a structure of the interface device in accordance with an embodiment of the present invention.

FIG. 11 is a schematic diagram illustrating a structure of the interface device 512 in accordance with an embodiment of the present invention.

The interface device 512 may include a signal control device 1130, a signal transfer device 1150 and a bypass transfer device (not shown).

The bypass transfer device may transfer the control signal from the controller 130 to the memory device 150 and transfer the data between the memory device 150 and the controller 130 without actively adjusting a phase modification. The bypass signal transfer device may include a selector which selects a signal among multiple input signals to output according to a bypass signal. The bypass signal transfer device may include a multiplexer which outputs a signal among several input signals according to a bypass signal.

The signal transfer device 1150 may transfer the control signal from the controller 130 to the memory device 150 and transfer the data between the memory device 150 and controller 130. The signal transfer device 1150 may include a first sampler 1116, a first multiplexer 1118, a second sampler 1120, a second multiplexer 1122, plural delays, plural receivers (RX) and plural transmitters (TX). Each receiver may be electrically connected to a corresponding delay. Each transmitter may be electrically connected to a corresponding delay.

The signal control device 1130 may control an operation of the signal transfer device in response to an interface control signal included in the control signal. The signal control device 1130 may include a command decoder 1102, a clock cycle measurer 1104, a first duty cycle correction circuit 1106, a second duty cycle correction circuit 1108, a third duty cycle correction circuit 1110, a first phase delayer 1112 and a second phase delayer 1114.

The command decoder 1102 may extract a command, an address, and a data from the control signals that are received from the controller 130 through the external channel 530. As a result of the extraction, when a command (e.g., P0<0>=1b) for setting the value of the blocking bit 802 to, e.g., '1', in the operation control register 800 is received, the command decoder 1102 may set the value of the blocking bit 802 to '1'.

The interface device 512 may receive the read enable signal XRE from the controller 130, deactivate the internal channel 532 according to the value of the blocking bit 802 and measure the time corresponding to one clock cycle of the read enable signal XRE. The duty cycles of the internal read enable signal RE_N, the internal data strobe signal DQS, and the data strobe signal XDQS may be corrected based on the measured one cycle time of the read enable signal XRE.

The clock cycle measurer 1104 may measure and store the one cycle time of the read enable signal XRE.

Herein, the memory device 150 described with reference to FIG. 1 may perform a read operation by the unit of a page. For example, the memory device 150 may store approximately 8 KB or 16 KB of data on one page. When the memory system 110 receives one random read command and reads one page, the controller 130 may generate the read enable signal XRE approximately 4000 times or 8000 times.

According to an embodiment of the present invention, the interface device 512 may receive the read enable signal XRE thousands of times according to one read command, and may accurately measure one cycle time of the read enable signal XRE.

The clock cycle measurer 1104 may output a ½ cycle signal and a ¼ cycle signal based on the measured one cycle time and transfer them to first to third duty cycle correction (DCC) circuits 1106 to 1110. The duty cycle correction (DCC) circuit may include a bypass transfer circuit which transfers the control signal from the controller 130 to the memory device 150 and the data between the memory device 150 and the controller 130 without actively adjusting a phase modification.

Figure 12A:
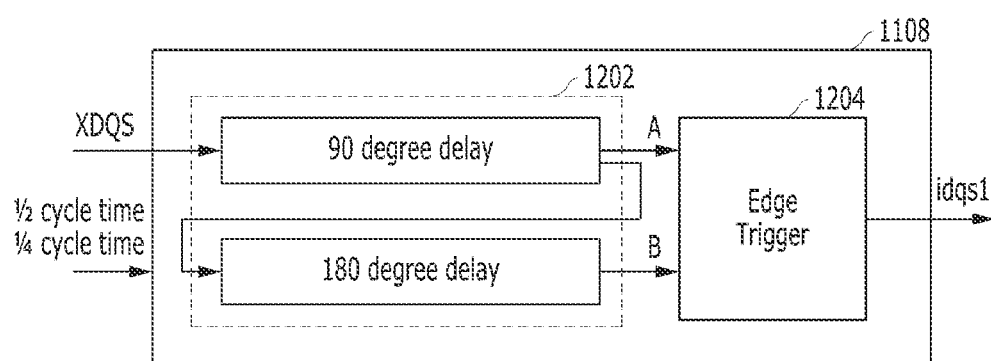
FIGS. 12A to 12D are block diagrams and timing diagrams illustrating a structure and an operation of a duty cycle correction circuit in accordance with an embodiment of the present invention.

FIG. 12A is a block diagram illustrating a structure of a second duty cycle correction circuit 1108 included in the interface device 512 in accordance with an embodiment of the present invention. In describing the structure and the operating method of the second duty cycle correction circuit 1108, references will be made to FIG. 11.

The second duty cycle correction circuit 1108 may receive the data strobe signal XDQS from the controller 130 and receive the ½ cycle signal and the ¼ cycle signal from the clock cycle measurer 1104. A phase converter 1202 may convert the phase of the data strobe signal XDQS.

Figure 12B:
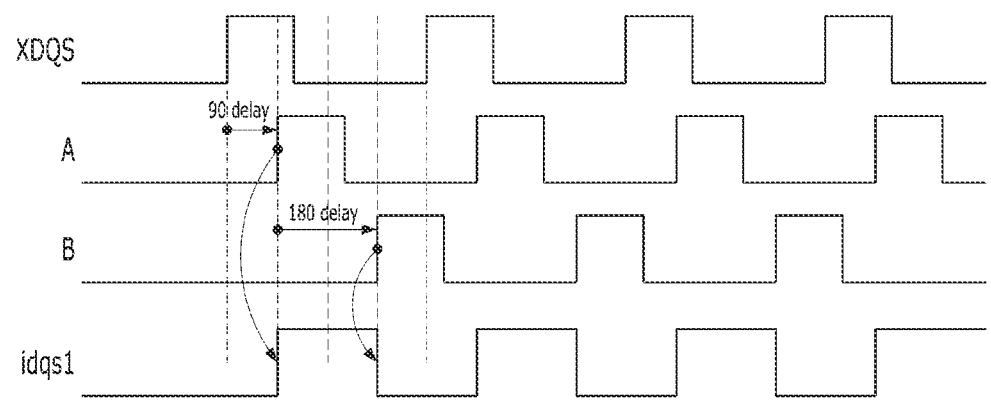

FIG. 12B is a timing diagram illustrating an operation of the second duty cycle correction circuit 1108.

The phase converter 1202 may generate a signal A by delaying the phase of the data strobe signal XDQS by 90 degrees based on the ¼ cycle signal, and generate a signal B by delaying the signal A by 180 degrees based on the ½ cycle signal.

The edge trigger 1204 may receive the signal A and the signal B and output a signal idqs1 in a logic high level at a rising edge of the signal A, and output the signal idqs1 in a logic low level at a rising edge of the signal B. As a result, the signal idqs1 which has a duty cycle of approximately 50% and which has a phase lag of approximately 90 degrees behind the phase of the strobe signal XDQS may be generated.

Referring back to FIG. 11, the first phase delayer 1112 may generate a signal idqs2 by delaying the phase of the signal idqs1 by approximately 90 degrees. When the internal channel 532 is activated, the generated signal idqs2 may be outputted to the memory device 150 as the internal data strobe signal DQS.

Figure 12C:
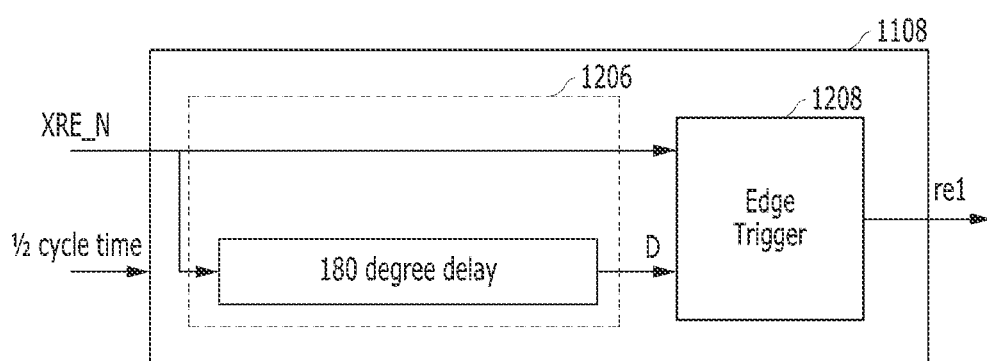

FIG. 12C is a block diagram illustrating a structure of the first duty cycle correction circuit 1106 included in the interface device 512 in accordance with an embodiment of the present invention.

The first duty cycle correction circuit 1106 may receive the read enable signal XRE_N from the controller and receive the ½ cycle signal from the dock cycle measurer 1104. A phase converter 1206 may convert the phase of the read enable signal XRE_N.

Figure 12D:
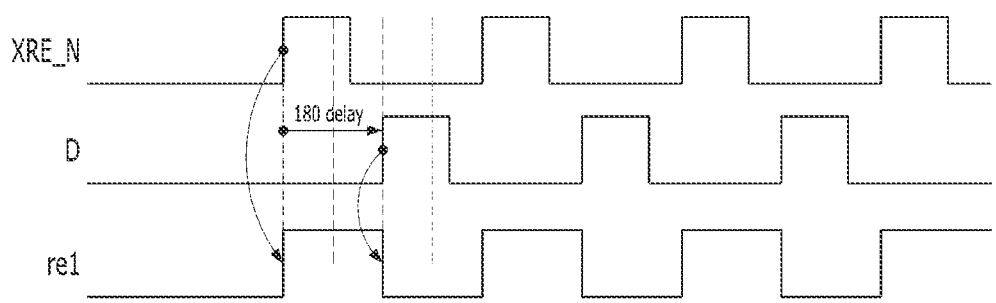

FIG. 12D is a timing diagram illustrating an operation of the first duty cycle correction circuit 1106.

The phase converter 1206 may generate a signal D by delaying the phase of the read enable signal XRE_N. The edge trigger 1208 may receive the read enable signal XRE_N and the signal D and output a signal re1 in a logic high level at a rising edge of the read enable signal XRE_N, and output the signal re1 in a logic low level at a rising edge of the signal D.

As a result, the first duty cycle correction circuit 1106 may generate a signal which has a duty cycle of approximately 50% and has no phase difference from the read enable signal XRE based on the read enable signal XRE and the ½ cycle signal.

When the internal channel 532 is activated, the generated signal may be outputted to the memory device 150 as the internal read enable signal RE_N.

The configuration of the third duty cycle correction circuit 1110 may be substantially same to the second duty cycle correction circuit 1108. Similar to the second duty cycle correction circuit 1108, the third duty cycle correction circuit 1110 may generate a signal which has a duty cycle of approximately 50% and has a phase 90 degrees which lags behind the phase of a signal odqs1 based on the signal odqs1 which has a phase that is delayed from the internal data strobe signal DQS and the ½ cycle signal and the ¼ cycle signal. When the internal channel 532 is activated, the generated signal may be outputted to the controller 130 as the data strobe signal XDQS.

Although the example in FIGS. 11 and 12 shows a method in which the interface device 512 receives the read command and the read enable signal XRE as correction commands and performs the duty cycle correction is described with reference to FIG. 11, the present invention is not limited thereto. According to an embodiment of the present invention, the interface device 512 may receive a write command as a correction command and, in response to the write command, perform duty cycle correction based on the data strobe signal XDQS which is generated by the interface device 512.

Referring back to FIG. 10, when the duty cycle correction is completed in the step S1008, the controller 130 may transfer a command for setting the blocking bit 802 to a set number, for example, '0' to the interface device 512 in step S1010. The interface device 512 may set the blocking bit 802 to 0 in response to the command.

In step S1012, the controller 130 may transfer an external command to the interface device 512. The interface device 512 may receive an external signal according to the external command. The interface device 512 may generate an internal signal in response to the received signal.

The interface device 512 may check the value of the blocking bit 802 to determine whether to provide the generated signal to the memory device 150 or not. Since the value of the blocking bit 802 is set to '0' in step S1010, the interface device 512 may accordingly transfer the generated signal to the memory device 150 by activating the internal channel 532. Thus, the memory device 150 may perform other operations in response to the commands transferred from the host 102 or the controller 130.

The interface device 512 may perform communication between the controller 130 and the memory device 150 as described with reference to FIGS. 6 and 7. Herein, data input/output operations may be performed based on the internal read enable signal RE_N which has a duty cycle that is corrected and the internal data strobe signal DQS which is generated based on the internal read enable signal RE_N, the duty cycle of which is corrected, and has a duty cycle of approximately 50%.

The method of changing the value of the blocking bit 802 to activate or deactivate the internal channel 532 is not limited to transferring the command, the address, and the 32-bit data as described above. According to an embodiment of the present invention, the interface device 512 may receive only a command and an address from the controller 130, and change the value of the blocking bit 802 only by accessing the blocking bit 802.

According to an embodiment of the present invention, the interface device 512 may receive only a blocking command and an unblocking command, and change the value of the blocking bit 802.

According to various embodiments of the invention described above, the interface device 512 may deactivate the internal channel 532 such that an operation according to a command is not performed in the memory device 150 but the interface device 512 performs a duty cycle correction based on a sufficient dock cycle according to the command. The reliability of the memory system 110 may be improved by performing a data input/output operation based on a clock which has a duty cycle that is more accurately corrected than the case where the duty cycle is corrected in the latency period, which is described in FIG. 7.

Figure 13A:
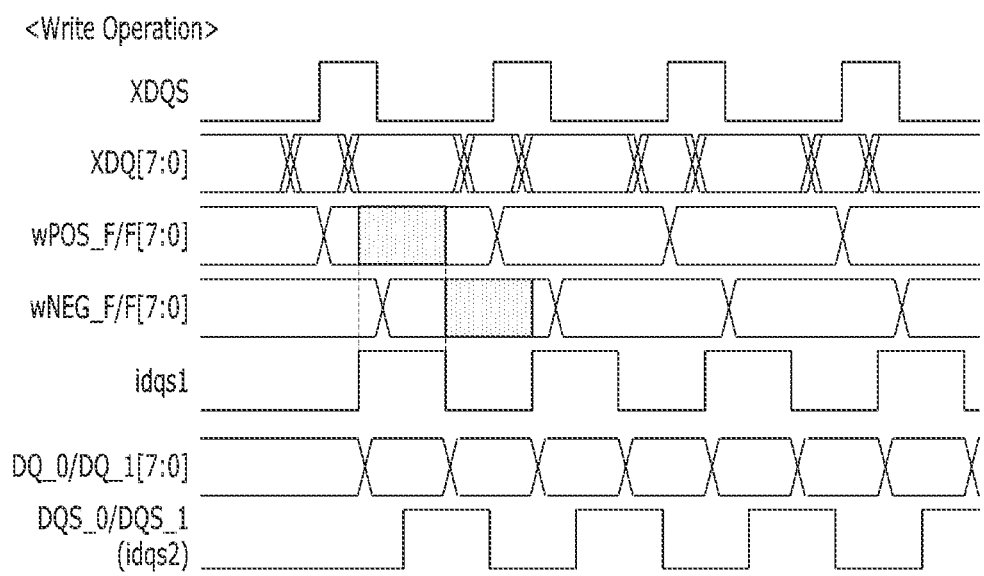
FIGS. 13A and 13B are timing diagrams illustrating an operation of the memory system based on a corrected clock in accordance with an embodiment of the present invention.

FIG. 13A is a timing diagram illustrating a write operation of the memory system 110 based on the corrected clock in accordance with an embodiment of the present invention.

Referring to FIG. 13A, in response to a write command transferred from the host 102, the controller 130 may transfer the data strobe signal XDQS and the data signal XDQ[7:0] according to which a write operation is to be performed to the interface device 512.

The first sampler 1116 of FIG. 11 may sample the data signal XDQ[7:0] at a rising edge and a falling edge of the external data strobe signal XDQS which has a duty cycle that is not corrected. The sampled signal may correspond to a wPOS_F/F signal and a wNEG_F/F signal of FIG. 13.

The signal idqs1 in FIG. 13 may be generated by the second duty cycle correction circuit 1108, which has a duty cycle of approximately 50% and which has a phase that lags approximately 90 degrees behind the phase of the data strobe signal XDQS. The first multiplexer 1118 in FIG. 11 may generate a data signal DQ[7:0] with a wide data valid window by outputting either the signal wPOS_F/F or the signal wNEG_F/F according to the signal idqs1.

The first phase delayer 1112 may generate a signal idqs2 which has a phase that lags approximately 90 degrees behind the phase of the signal idqs1 and output the signal idqs2 as an internal data strobe signal DQS. The interface device 512 may transfer the internal data signal DQ[7:0] and the internal data strobe signals DQS to the memory device 150.

Even though the interface device 512 receives from the controller 130 the data strobe signal XDQS and the data signal XDQ[7:0], duty cycles of which are not 50%, the reliability of the data written in the memory device 150 may be improved by transferring to the memory device 150 the internal data strobe signal DQS and the internal data signal DQ[7:0], duty cycles of which are 50%.

Figure 13B:
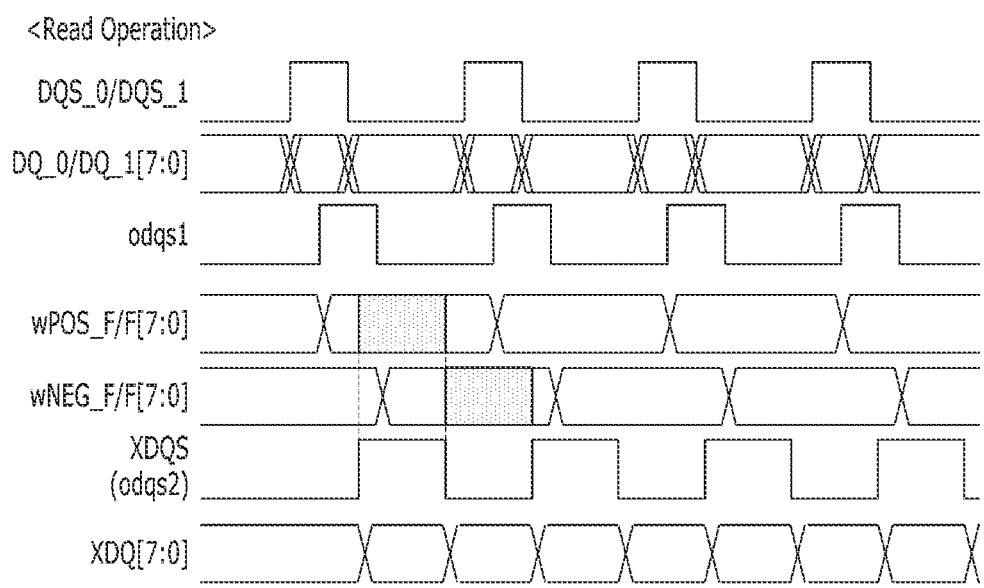

FIG. 13B is a timing diagram illustrating a read operation of the memory system 110 based on the corrected dock in accordance with an embodiment of the present invention.

Referring to FIG. 13B, after a read operation is performed in the memory device 150 in response to a read command from the host 102, the internal data strobe signal DQS and the internal data signal DQ[7:0] including the read data may be transferred to the interface device 512. Herein, the read enable signal RE may be modified in the memory device 150 and the duty cycle of the internal data strobe signal DQS which is generated based on the modified read enable signal may not be approximately 50%. The data valid window of the internal data signal DQ[7:0] which is sampled based on the internal data strobe signal DQS may not be constant.

The second phase delayer 1114 of FIG. 11 may modify the phase of the internal data strobe signal DQS to generate a signal odqs1. The signal odqs1 may have a phase that lags approximately 90 degrees behind the phase of the internal data strobe signal DQS, or the signal odqs1 may have a phase that is delicately tuned according to the sampling result. The second sampler 1120 may sample the internal data signal DQ[7:0] at a rising edge and a falling edge of the signal odqs1. The sampled signal may correspond to the signal wPOS_F/F and the signal wNEG_F/F in FIG. 12.

The signal odqs2 in FIG. 12 may be generated by the third duty cycle correction circuit 1110 and which has a duty cycle of approximately 50% and a phase that lags approximately 90 degrees behind the phase of the signal odqs1. The second multiplexer 1122 in FIG. 11 may generate a data signal XDQ[7:0] with a wide data valid window by outputting either the signal wPOS_F/F or the signal wNEG_F/F based on the signal odqs2.

The interface device 512 may transfer the data signal XDQ[7:0] to the controller 130. The interface device 512 may transfer the signal odqs2 to the controller 130 as the data strobe signal XDQS.

Even though the internal read enable signal RE is modified in the memory device 150 so that the duty cycle is not approximately 50%, the reliability of the read data may be improved as the interface device 512 transfers the data strobe signal XDQS having the duty cycle of approximately 50% and the data signal XDQ[7:0] to the controller 130.

Hereafter, referring to FIGS. 14 to 22, a data processing system and electronic devices to which the memory system 110 including the memory device 150 and the controller 130 described with reference to FIGS. 1 to 13 in accordance with an embodiment of the present invention is applied, may be described in detail.

Figure 14:
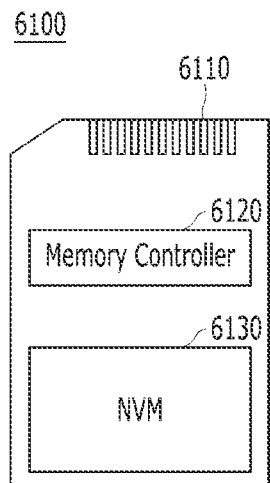
FIGS. 14 to 22 are diagrams schematically illustrating application examples of the data processing system in accordance with various embodiments of the present invention.

FIG. 14 is a diagram schematically illustrating the data processing system including the memory system in accordance with an embodiment. FIG. 14 schematically illustrates a memory card system to which the memory system in accordance with an embodiment is applied.

Referring to FIG. 14, the memory card system 6100 may include a memory controller 6120, a memory device 6130 and a connector 6110.

More specifically, the memory controller 6120 may be connected to the memory device 6130 embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processor, a host interface, a memory interface and an error correction component.

The memory controller 6120 may communicate with an external device, for example the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with an embodiment may be applied to wired/wireless electronic devices or particularly mobile electronic devices.

The memory device 6130 may be implemented by a nonvolatile memory. For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may be integrated to form a solid-state driver (SSD). Also, the memory controller 6120 and the memory device 6130 may form a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 15:
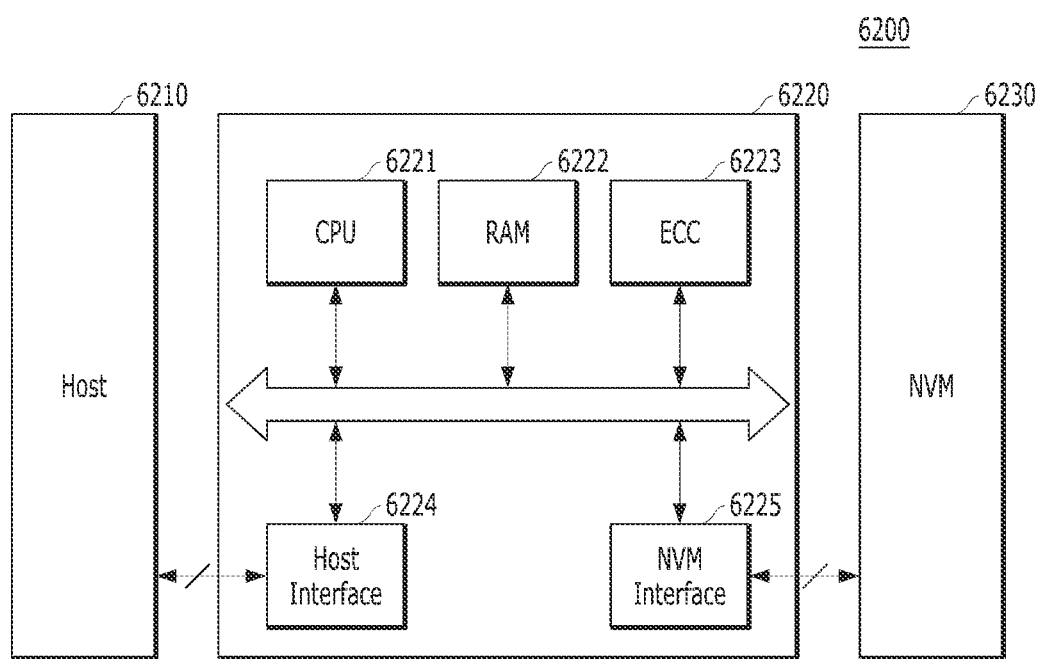

FIG. 15 is a diagram schematically illustrating another example of the data processing system including the memory system in accordance with an embodiment.

Referring to FIG. 15, the data processing system 6200 may include a memory device 6230 having one or more nonvolatile memories and a memory controller 6220 for controlling the memory device 6230. The data processing system 6200 illustrated in FIG. 15 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operation on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC component 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. The ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with an embodiment may be applied to wired/wireless electronic devices or particularly a mobile electronic device.

Figure 16:
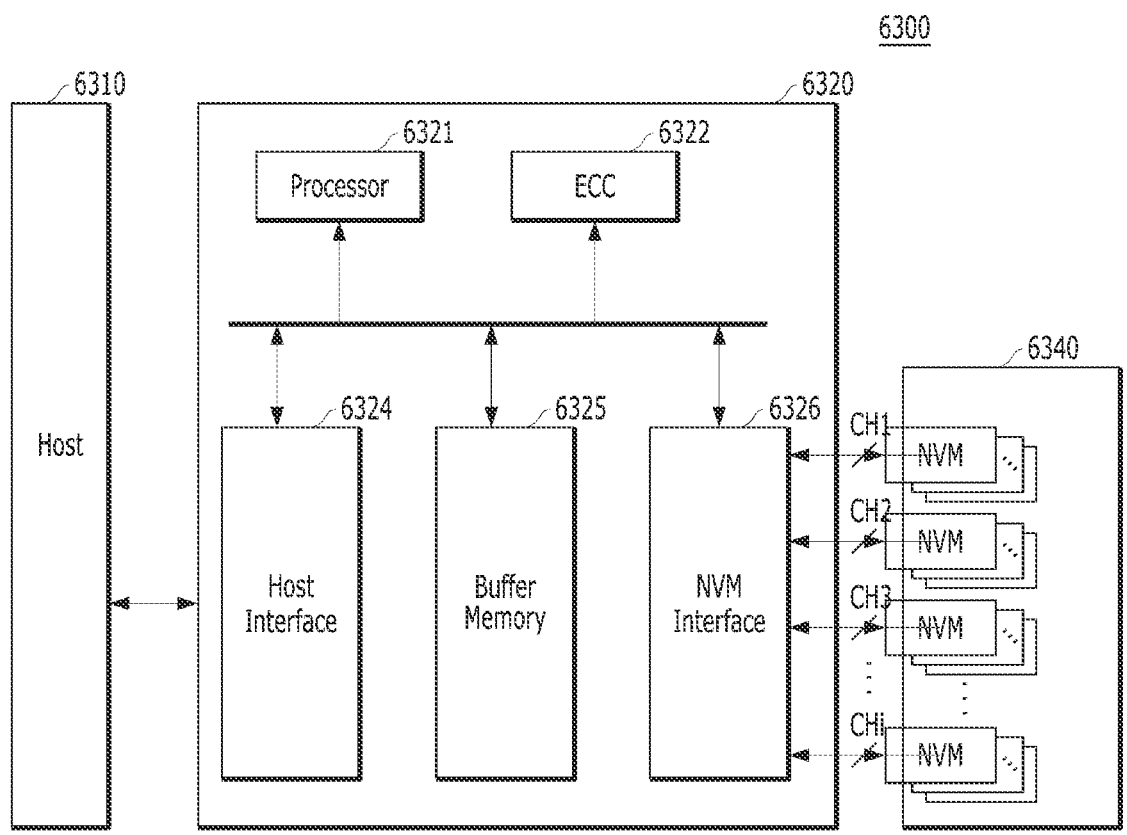

FIG. 16 is a diagram schematically illustrating another example of the data processing system including the memory system in accordance with an embodiment. FIG. 16 schematically illustrates an SSD to which the memory system may be applied.

Referring to FIG. 16, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. By way of example, FIG. 16 illustrates that the buffer memory 6325 is disposed in the controller 6320. However, the buffer memory 6325 may be external to the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 17:
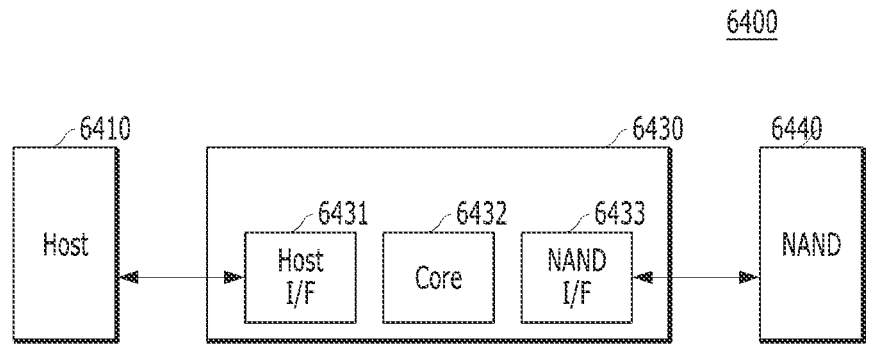

FIG. 17 is a diagram schematically illustrating another example of the data processing system including the memory system in accordance with an embodiment. FIG. 17 schematically illustrates an embedded Multi-Media Card (eMMC) to which the memory system may be applied.

Referring to FIG. 17, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operation of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 18 to 21 are diagrams schematically illustrating other examples of the data processing system including the memory system in accordance with one or more embodiments, FIGS. 18 to 21 schematically illustrate UFS (Universal Flash Storage) systems to which the memory system may be applied.

Referring to FIGS. 18 to 21, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices or particularly mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 10 to 12, and the UFS cards 6530, 6630, 6730 and 6830 may be embodied in the form of the memory card system 6100 described with reference to FIG. 14.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 18:
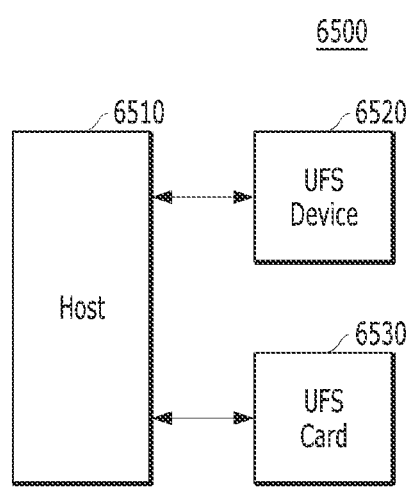

In the UFS system 6500 illustrated in FIG. 18, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment of FIG. 18, the configuration in which one UFS device 6520 and one UFS card 6530 are connected to the host 6510 is illustrated. However, in another embodiment, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 19:
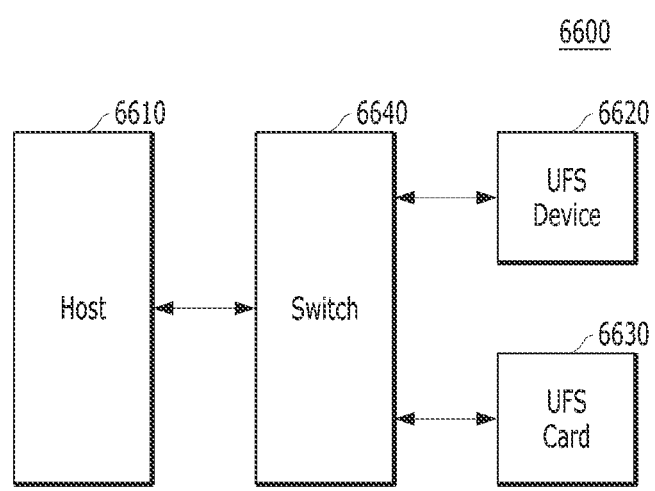

In the UFS system 6600 illustrated in FIG. 19, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment of FIG. 19, the configuration in which one UFS device 6620 and one UFS card 6630 are connected to the switching module 6640 is illustrated. However, in another embodiment, a plurality of UFS devices and UFS cards may be connected in parallel or in the form of a star to the switching module 6640, and a plurality of UFS cards may be connected in series or in the form of a chain to the UFS device 6620.

Figure 20:
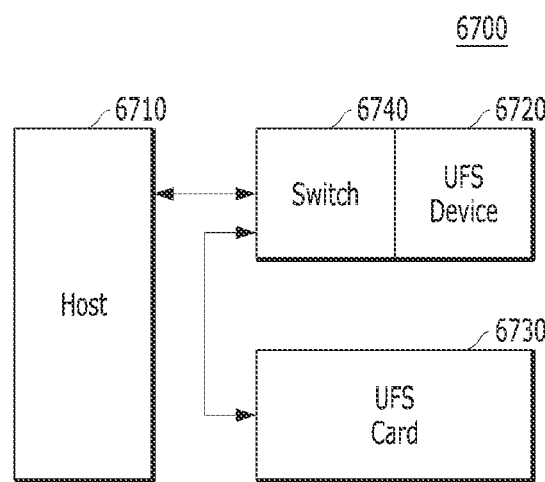

In the UFS system 6700 illustrated in FIG. 20, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the embodiment of FIG. 20, the configuration in which one UFS device 6720 and one UFS card 6730 are connected to the switching module 6740 is illustrated. However, in another embodiment, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 21:
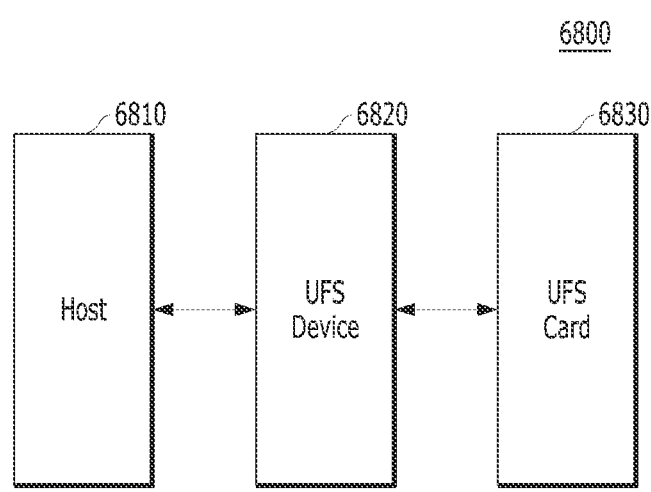

In the UFS system 6800 illustrated in FIG. 21, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the embodiment of FIG. 21, the configuration in which one UFS device 6820 is connected to the host 6810 and one UFS card 6830 is connected to the UFS device 6820 is illustrated. However, in another embodiment, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 22:
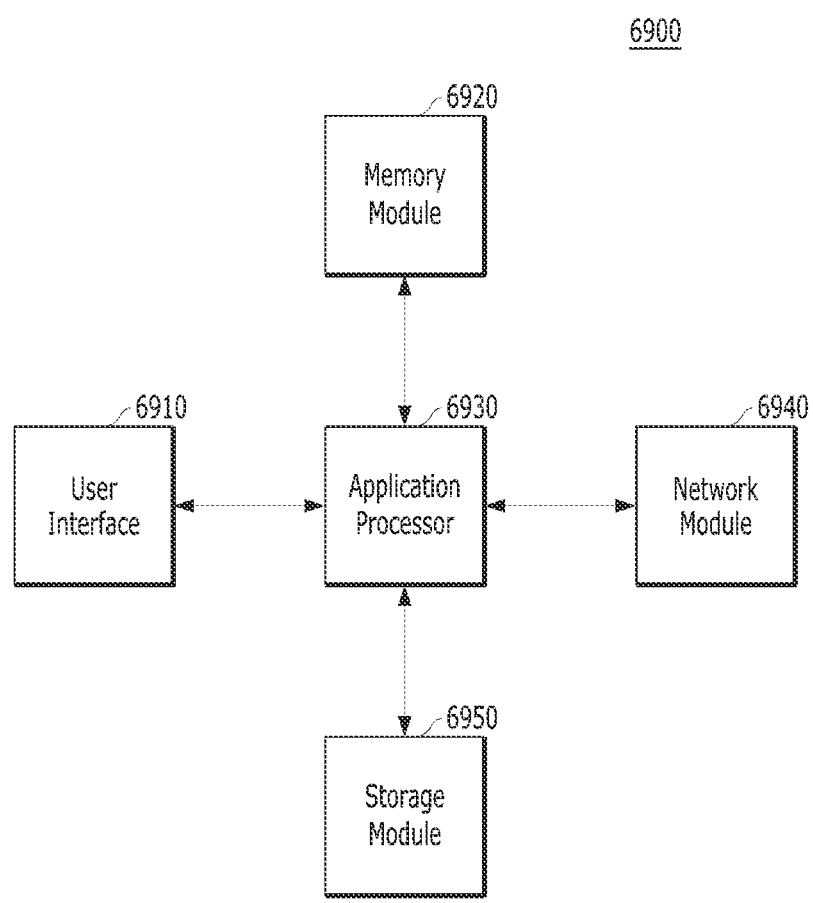

FIG. 22 is a diagram schematically illustrating another example of the data processing system including the memory system in accordance with an embodiment, FIG. 22 is a diagram schematically illustrating a user system to which the memory system may be applied.

Referring to FIG. 22, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR2 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices or particularly mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 16 to 21.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a monitor.

Furthermore, when the memory system 110 of FIG. 1 is applied to a mobile electronic device of the user system 6900, the application processor 6930 may control overall operation of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to embodiments of the present invention, the memory system may have improved reliability by accurately correcting a dock of the memory system, and a method of operating the memory system.

Figure 23:
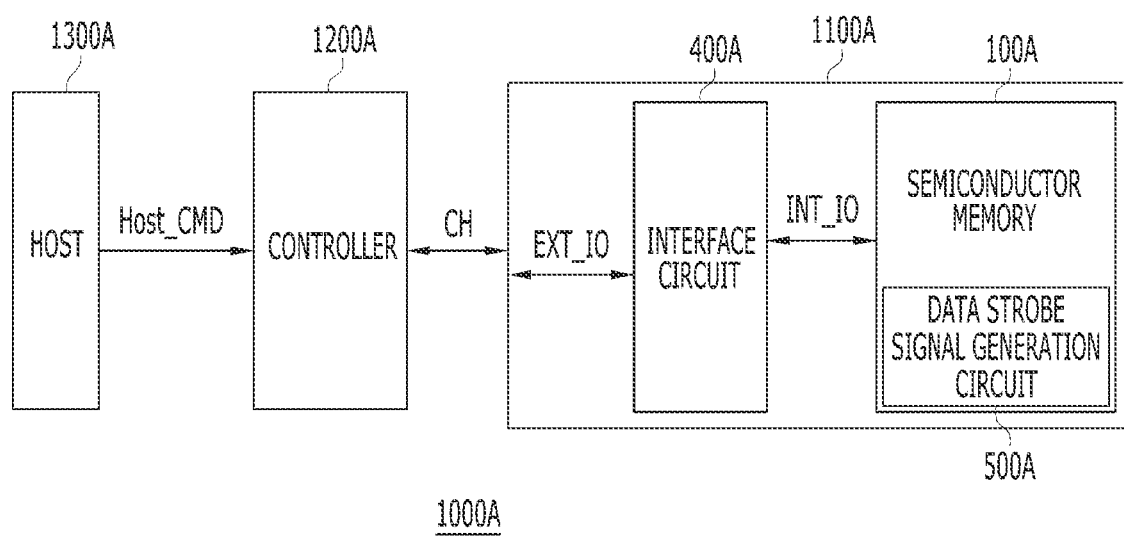
FIG. 23 is a block diagram describing a memory system according to an embodiment of the present invention disclosure.

FIG. 23 is a block diagram describing a memory system 1000A according to an embodiment of the present invention disclosure.

Referring to FIG. 23, the memory system 1000A may include a memory device 1100A in which data is stored, and a controller 1200A that controls the memory device 1100A. The memory system may also include a host 1300A coupled to the controller 1200A. The host 1300A may control the operation of the controller 1200A.

The host 1300A may communicate with the controller 1200A by using an interface protocol such as a peripheral component interconnect-express (PCI-E), an advanced technology attachment (ATA), a serial ATA (SATA), a parallel ATA (DATA), or a serial attached SCSI (SAS). In addition, the interface protocol between the host 1300A and the controller 1200A is not limited to the above-described example, and alternatively may be one of various other interface protocols such as a universal serial bus (USB), a multi-media card (MMC), an enhanced small disk interface (ESDI), and integrated drive electronics (IDE).

The controller 1200A may generally control an operation of the memory device 1100A and control a data exchange between the host 1300A and the memory device 1100A. For example, the controller 1200A may control the memory device 1100A according to a request of the host 1300A to program or read data. The controller 1200A may control the memory device 1100A to read system data of a semiconductor memory 100A included in the memory device 1100A according to the request of the host 1300A. The controller 1200A may control the memory device 1100A to perform a read operation of system data stored in an interface circuit 400A of the memory device 1100A. The system data of the semiconductor memory 100A may be status data, read training data, option parameter data, and the like of the semiconductor memory. The system data stored in the interface circuit 400A may be status data, read training data, option parameter data, and the like of the interface circuit 400A. In order to control performance of the read operation of the system data stored in the semiconductor memory 100A or the interface circuit 400A, the controller 1200A may generate a specific command. The specific command may be configured of a command, an address, and data. The address included in the specific command may be an address corresponding to the semiconductor memory 100A or an address corresponding to the interface circuit 400A. That is, the memory device 1100A may perform the read operation of the system data stored in the semiconductor memory 100A or the read operation of the system data stored in the interface circuit 400A according to the address included in the specific command.

The memory device 1100A may include the semiconductor memory 100A and the interface circuit 400A. The memory device 1100A may be connected to the controller 1200A through a channel CH. The semiconductor memory 100A may communicate with the controller 1200A through the interface circuit 400A. For example, the interface circuit 400A may mediate command and data communication between the controller 1200A and the semiconductor memory 100A. In addition, the interface circuit 400A may perform a retiming operation on the command and the data exchanged between the controller 1200A and the semiconductor memory 100A. The retiming operation may include buffering for storing and outputting the data or the command to be transmitted. When the data or the command to be transmitted is first stored and then transmitted as an output, an output timing of the data or the command to be transmitted can be rearranged to reduce skew. That is, the interface circuit 400A may improve reliability of the memory system 1000A by correcting the output timing of the data and the command exchanged between the controller 1200A and the semiconductor memory 100A. The interface circuit 400A nay be connected to the channel CH through an external input/output line EXT_IO and may be connected to the semiconductor memory 100A through an internal input/output line INT_IO. The interface circuit 400A may operate on a different voltage than the controller 1200A. The interface circuit 400A may operate on a different voltage than the semiconductor memory 100A. For example, the interface circuit 400A may operate at 1.8V and the controller 1200A may operate at 1.2V. For example, the interface circuit 400A may operate at 1.2V and the semiconductor memory 100A may operate at 1.8V. A voltage range of a signal transferred through the external input/output line EXT_IO is different from a voltage range of a signal transferred through the internal input/output line INT_IO. For example, a voltage range of a signal transferred through the external input/output line EXT_IO is 1.8V wide and a voltage range of a signal transferred through the internal input/output line INT_IO is 1.2 wide, or vice versa.

The interface circuit 400A may be selected by the specific command received from the controller 1200A to perform the read operation of the system data stored in the interface circuit 400A. The interface circuit 400A may output the read system data to the controller 1200A in synchronization with a data strobe signal generated in the semiconductor memory 100A.

The semiconductor memory 100A may include a data strobe signal generation circuit 500A that generates the data strobe signal for synchronizing read data with a plurality of memory cells capable of storing norm& data and the system data, and outputting the read data during a data read operation. The data strobe signal generation circuit 500A may generate the data strobe signal for synchronously outputting the read data during the read operation of the normal data and the system data stored in the semiconductor memory 100A, and the read operation of the system data stored in the interface circuit 400A.

According to an embodiment, the memory device 1100A may include a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), or a flash memory.

Figure 24:
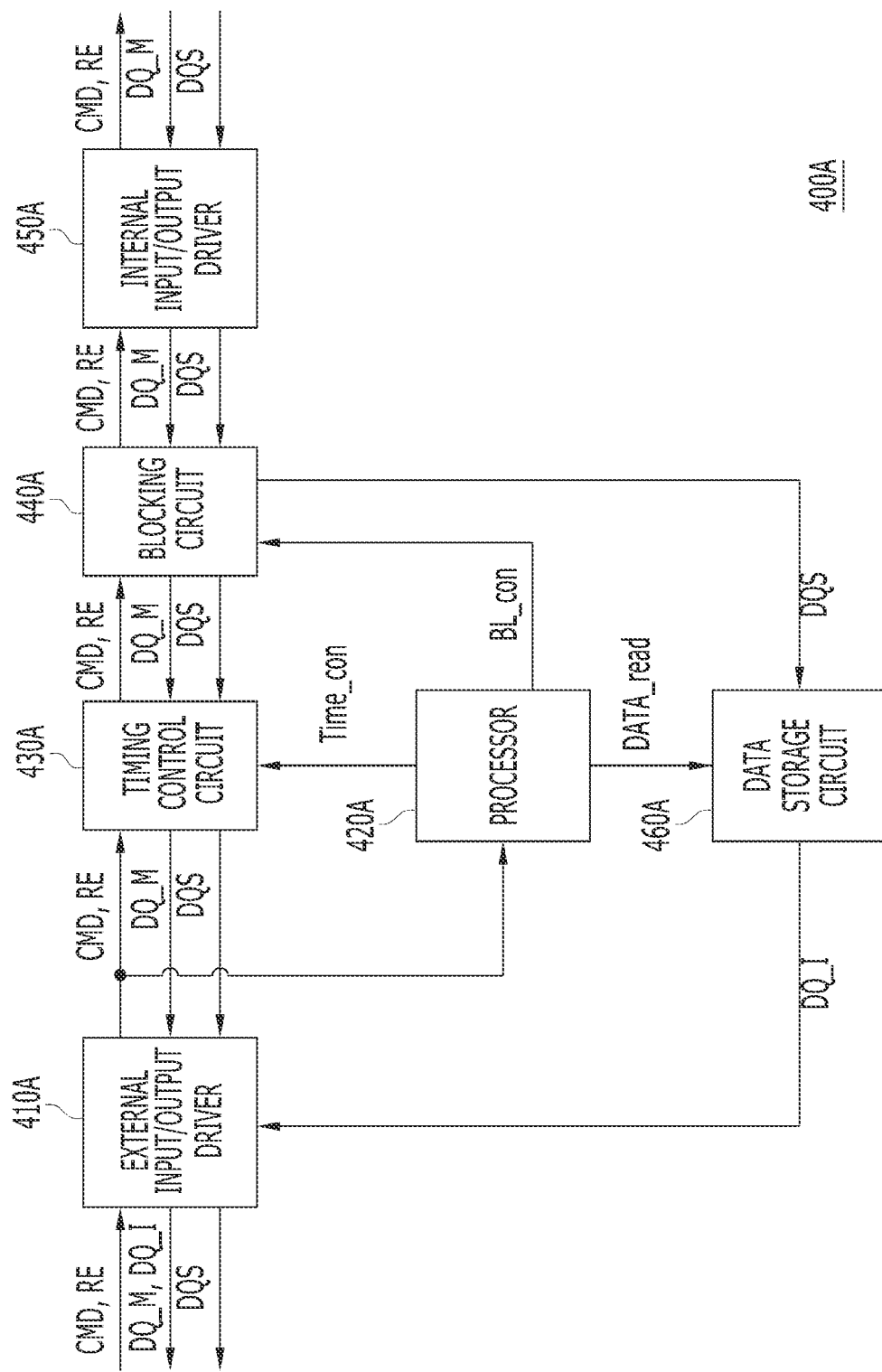
FIG. 24 is a block diagram describing a configuration of an interface circuit employed in the memory system of FIG. 23 according to an embodiment of the present invention disclosure.

FIG. 24 is a block diagram describing a configuration of the interface circuit 400A.

Referring to FIG. 24, the interface circuit 400A may include an external input/output driver 410A, a processor 420A, a timing control circuit 430A, a blocking circuit 440A, an internal input/output driver 450A, a signal bypass circuit and a data storage circuit 460A. The signal bypass circuit transfers a signal between the external input/output driver 410A and the internal input/output driver 450A without actively adjusting a timing or phase modification.

The external input/output driver 410A receives a command CMD and a read enable signal RE from the controller 1200A and transmits the command CMD and the read enable signal RE to the processor 420A and the timing control circuit 430A.

In addition, the external input/output driver 410A receives data DQ_M and a data strobe signal DQS from the timing control circuit 430A and transmits the data DQ_M and the data strobe signal DQS to the controller 1200A. Alternatively, the external input/output driver 410A receives the data strobe signal DQS from the timing control circuit 430A, receives data DQ_I from the data storage circuit 460A, and transmits the data strobe signal DQS and the data DQ_I to the controller 1200A.

The processor 420A receives the command CMD from the external input/output driver 410A and parses the received command CMD. The processor 420A determines whether an address included in the command CMD corresponds to the semiconductor memory 100A or the interface circuit 400A during a parsing operation.

As a result of the parsing, when the command CMD is a command CMD to be transmitted to the semiconductor memory 100A, the processor 420A generates and outputs a timing control signal Time_con corresponding to the command CMD. The command may correspond to an operation such as, for example, a program operation, a read operation, a system data read operation and the like.

When, as a result of the parsing, the processor 420A determines that the received command CMD corresponds to the read operation of the system data stored in the data storage circuit 460A in the interface circuit 400A, the processor 420A activates a data read signal DATA_read and outputs the data read signal DATA_read to the data storage circuit 460A. In addition, as a result of the parsing, when the received command CMD corresponds to the read operation of the system data stored in the data storage circuit 460A, the processor 420A generates a blocking control signal BL_con to control the blocking circuit 440A to block the data DQ_M received through the internal input/output driver 450A from the semiconductor memory 100A.

The timing control circuit 430A receives the command CMD and the read enable signal RE from the external input/output driver 410A, controls and rearranges a timing of the received command CMD and read enable signal RE in response to the timing control signal Time_con received from the processor 420A, and outputs the command CMD and the read enable signal RE to the blocking circuit 440A.

The blocking circuit 440A receives the command CMD and the read enable signal RE output from the timing control circuit 430A and transmits the command CMD and the read enable signal RE to the internal input/output driver 450A.

In addition, the blocking circuit 440A may receive the blocking control signal Block_con from the processor 420A and block the data DQ_M among the data DQ_M and the data strobe signal DQS received through the internal input/output driver 450A. As a result, the received data strobe signal DQS may be transmitted to the data storage circuit 460A and the timing control circuit 430A.

For example, the blocking circuit 440A transmits to the timing control circuit 430A the data DQ_M and the data strobe signal DQS received through the internal input/output driver 450A without a blocking operation during the normal read operation and the system data read operation of the semiconductor memory 100A. The blocking circuit 440A blocks the data DQ_M among the data DQ_M and the data strobe signal DQS received through the internal input/output driver 450A during the system data read operation of the interface circuit 400A, and outputs the data strobe signal DQS to the timing control circuit 430A and the data storage circuit 460A.

The internal input/output driver 450A receives the command CMD and the read enable signal RE through the blocking circuit 440A and transmits the command CMD and the read enable signal RE to the semiconductor memory 100A. The internal input/output driver 450A receives the data DQ_M and the data strobe signal DQS from the semiconductor memory 100A and transmits the data and the data strobe signal DQS to the blocking circuit 440A.

The data storage circuit 460A stores the system data of the interface circuit 400A. The system data may be the status data, the read training data, the option parameter data, and the like of the interface circuit 400A. The data storage circuit 460A performs the read operation of the system data in response to the data read signal DATA_read received from the processor 420A and outputs the read data to the external input/output driver 410A in synchronization with the data strobe signal DQS received from the blocking circuit 440A.

Figure 25:
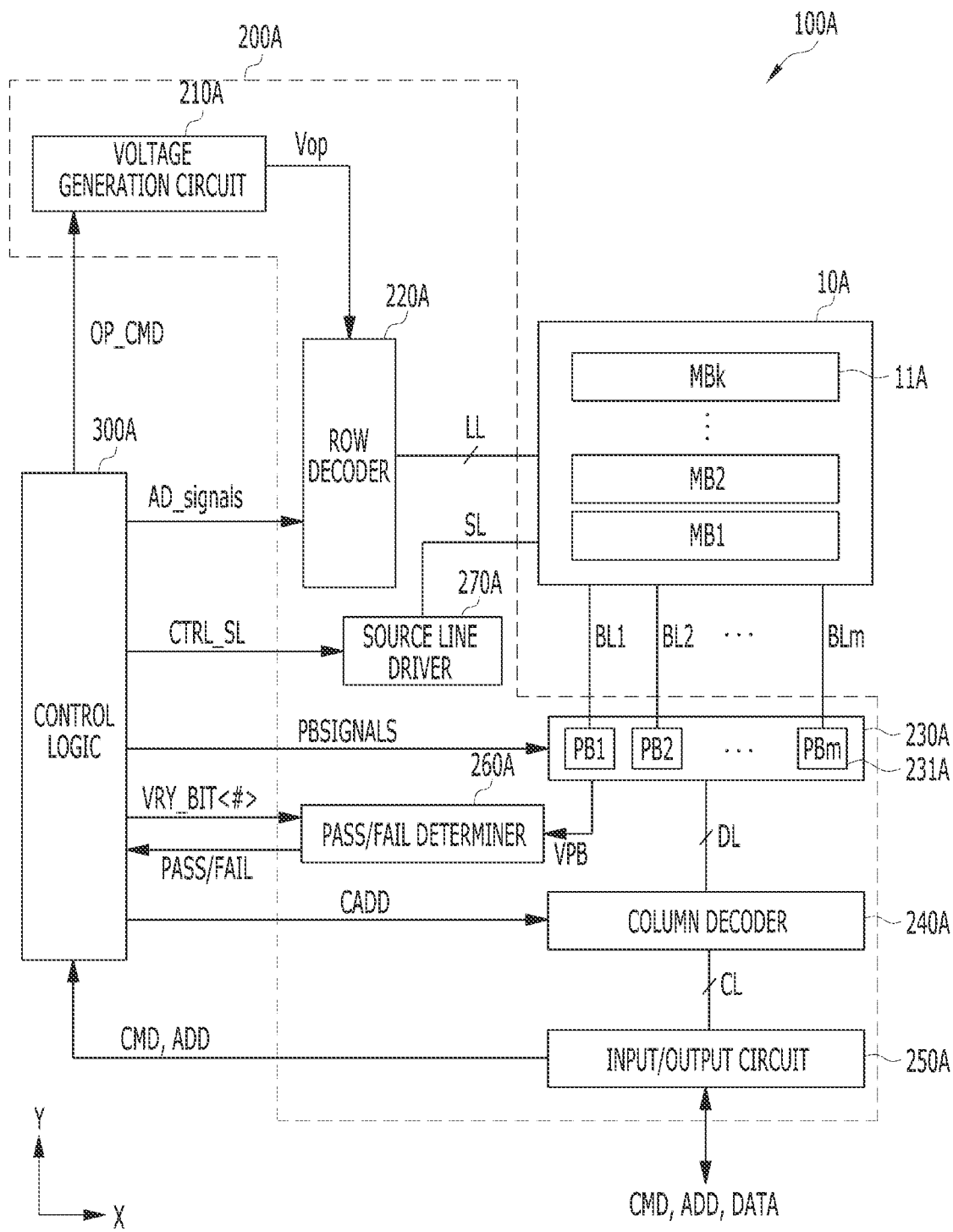
FIG. 25 is a diagram describing an exemplary configuration of a semiconductor memory of the memory system of FIG. 23.

FIG. 25 is a diagram describing the semiconductor memory 100A of FIG. 23.

Referring to FIG. 25, the semiconductor memory 100A may include a memory cell array 10A in which data is stored. The semiconductor memory 100A may include peripheral circuits 200A configured to perform a program operation for storing data in the memory cell array 10A, a read operation for outputting the stored data, and an erase operation for erasing the stored data. The semiconductor memory 100A may include a control logic 300A that controls the peripheral circuits 200A according to the command that is generated in the controller 1200A and received through the interface circuit 400A.

The memory cell array 10A may include a plurality of memory blocks MB1 to MBk and 11A (k is a positive integer). Some memory blocks (for example, MB1) of the plurality of memory blocks 11A may store the system data, and the remaining memory blocks MB2 to MBk may store the normal data. Local lines LL and bit lines BL1 to BLm (m is a positive integer) may be connected to each of the memory blocks MB1 to MBk. For example, the local lines LL may include a first select line, a second select line, and a plurality of word lines arranged between the first and second select lines. In addition, the local lines LL may include dummy lines arranged between the first select line and the word lines, and between the second select line and the word lines. Here, the first select line may be a source select line, and the second select line may be a drain select line. For example, the local lines LL may include the word lines, the drain and source select lines, and source lines SL. For example, the local lines LL may further include the dummy lines. For example, the local lines LL may further include pipe lines. The local lines LL may be connected to the memory blocks MB1 to MBk 11A, respectively, and the bit lines BL1 to BLm may be commonly connected to the memory blocks MB1 to MBk 11A. The memory blocks MB1 to MBk 11A may be implemented in a two-dimensional or three-dimensional structure. For example, the memory cells may be arranged in a direction parallel to a substrate in the memory block 11A of the two-dimensional structure. For example, the memory cells may be stacked in a direction perpendicular to the substrate in the memory block 11A of the three-dimensional structure.

The peripheral circuits 200A may be configured to perform the program, read, and erase operations of the memory block 11A selected under control of the control logic 300A. For example, the peripheral circuits 200A may include a voltage generation circuit 210A, a row decoder 220A, a page buffer group 230A, a column decoder 240A, an input/output circuit 250A, a pass/fail determiner (pass/fail check circuit) 260A, and a source line driver 270A.

The voltage generation circuit 210A may generate various operation voltages Vop used in the program, read, and erase operations in response to an operation signal OP_CMD. In addition, the voltage generation circuit 210A may selectively discharge the local lines LL in response to the operation signal OP_CMD. For example, the voltage generation circuit 210A may generate a program voltage, a verify voltage, a pass voltage, and a select transistor operation voltage under the control of the control logic 300A.

The row decoder 220A may transmit the operation voltages Vop to the local lines LL connected to the selected memory block 11A in response to a row decoder control signals AD_signals1 and AD_signals2. For example, the row decoder 220A may selectively apply the operation voltages (for example, the program voltage, the verify voltage, the pass voltage, and the like) generated in the voltage generation circuit 210A in response to the row decoder control signals AD_signals to the word lines among the local lines LL.

The row decoder 220A applies the program voltage generated in the voltage generation circuit 210A to the selected word line among the local lines LL and applies the pass voltage generated in the voltage generation circuit 210A to the remaining unselected word lines, in response to the row decoder control signals AD_signals during a program voltage application operation. In addition, the row decoder 220A applies the read voltage generated in the voltage generation circuit 210A to the selected word line among the local lines LL and applies the pass voltage generated in the voltage generation circuit 210A to the remaining unselected word lines, in response to the row decoder control signals AD_signals during a read operation.

The page buffer group 230A may include a plurality of page buffers PB1 to PBm 231A connected to the bit lines BL1 to BLm. The page buffers PB1 to PBm 231A may operate in response to page buffer control signals PBSIGNALS. For example, the page buffers PB1 to PBm 231A may temporarily store data to be programmed during a program operation or sense a voltage or a current of the bit lines BL1 to BLm during the read operation or the verify operation.

The column decoder 240A may transfer data between the input/output circuit 250A and the page buffer group 230A in response to a column address CADD. For example, the column decoder 240A may exchange data with the page buffers 231A through data lines DL, or may exchange data with the input/output circuit 250A through column lines CL.

The input/output circuit 250A may transfer the command CMD and the address ADD received from the controller 1200A to the control logic 300A or may exchange the data with the column decoder 240A.

The pass/fail determiner 260A may generate a reference current in response to a permission bit VRY_BIT<#> during the read operation or the verify operation, compare a sensing voltage VPB received from the page buffer group 230A with a reference voltage generated by the reference current, and output a pass signal PASS or a fail signal FAIL.

The source line driver 270A may be connected to the memory cell included in the memory cell array 10A through a source line SL and may control a voltage applied to the source line SL. The source line driver 270A may receive a source line control signal CTRL_SL from the control logic 300A and may control a source line voltage applied to the source line SL based on the source line control signal CTRL_SL.

The control logic 300A may output the operation signal OP_CMD, the row decoder control signal AD_signals, the page buffer control signals PBSIGNALS, and the permission bit VRY_BIT<#> in response to the command CMD and the address ADD to control the peripheral circuits 200A. In addition, the control logic 300A may determine whether the verify operation has passed or failed in response to the pass signal PASS or the fail signal FAIL.

Figure 26:
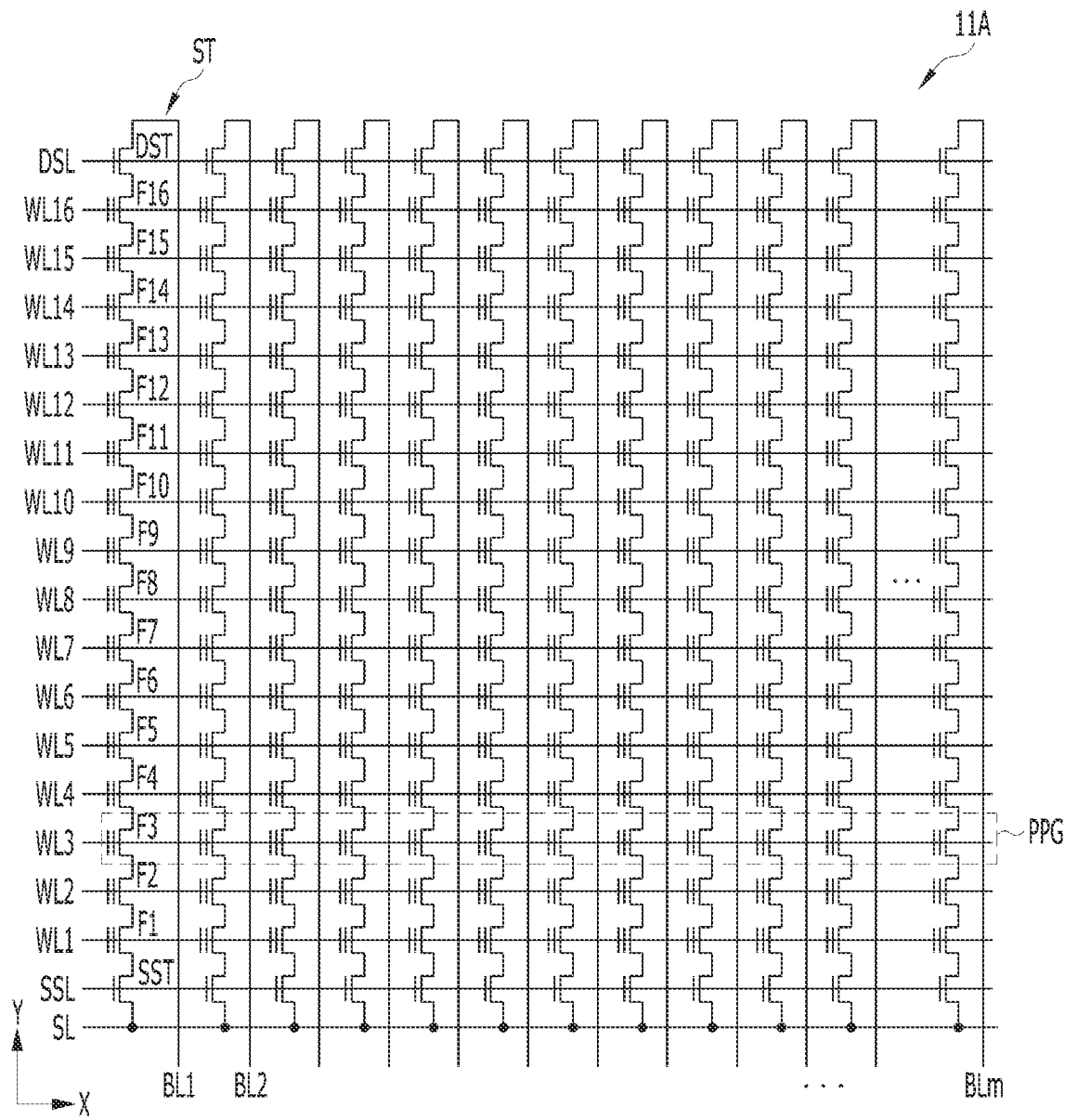
FIG. 26 is a diagram describing an exemplary two-dimensional configuration of a memory block of the semiconductor memory of FIG. 25.

FIG. 26 is a diagram describing the memory block of FIG. 25.

Referring to FIG. 26, the memory block 1A may be connected to the plurality of word lines arranged in parallel with each other between the first select line and the second select line. Here, the first select line may be a source select line SSL, and the second select line may be a drain select line DSL. Specifically, the memory block 11A may include a plurality of strings ST connected between the bit lines BL1 to BLm and the source line SL. The bit lines BL1 to BLm may be connected to the strings ST, respectively, and the source line SL may be commonly connected to the strings ST. Since the strings ST may be configured to be identical to each other, a string ST connected to the first bit line BL1 will be described in detail, as an example.

The string ST may include a source select transistor SST, a plurality of memory cells F1 to F16, and a drain select transistor DST connected in series between the source line SL and the first bit line BL1. One string ST may include at least one of the source select transistor SST and the drain select transistor DST, and may include more memory cells than the number shown in the figure.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of the source select transistors SST included in the different strings ST may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings ST may be referred to as a physical page PPG. Therefore, the memory block 11A may include the physical pages PPG of the number of the word lines WL1 to WL16.

One memory cell may store one bit of data. This is commonly referred to as a single level cell (SLC). In this case, one physical page PPG may store one logical page (LPG) data. One logical page (LPG) data may include data bits of the number of cells included in one physical page PPG. In addition, one memory cell may store two or more bits of data. This is commonly referred to as a multi-level cell (MLC). In this case, one physical page PPG may store two or more logical page (LPG) data.

Figure 27:
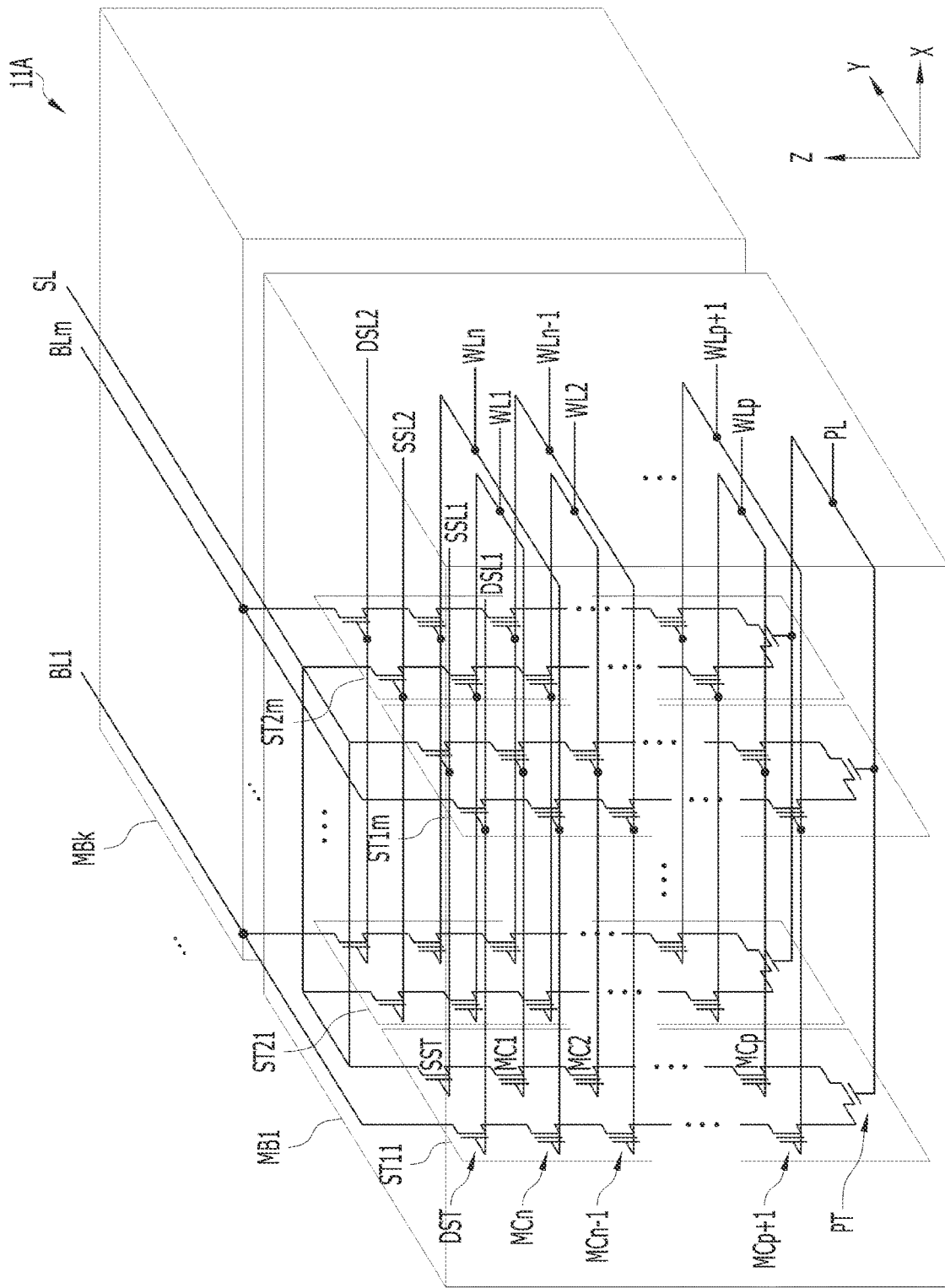
FIG. 27 is a diagram describing an embodiment of a three-dimensional configuration of a memory block of the semiconductor memory of FIG. 25.

FIG. 27 is a diagram describing an embodiment of a memory block configured in three-dimensions.

Referring to FIG. 27, the memory cell array 10A may include a plurality of memory blocks MB1 to MBk. The memory block 11A may include a plurality of strings ST11 to ST1$m$ and ST21 to ST2$m$. In an embodiment, each of the plurality of strings ST11 to ST1$m$ and ST21 to ST2$m$ may be formed in a U shape. In the first memory block MB1, m strings may be arranged in a direction (X direction). In FIG. 27, two strings are arranged in a column direction (V direction), but this is for clarity; three or more strings may be arranged in the column direction (Y direction).

Each of the plurality of strings ST11 to ST1$m$ and ST21 to ST2$m$ may include at least one source select transistor SST, first to n-th memory cells MC1 to MCn, a pipe transistor PT, and at least one drain select transistor DST.

The source and drain select transistors SST and DST and the memory cells MC1 to MCn may have similar structures. For example, each of the source and drain select transistors SST and DST and the memory cells MC1 to MCn may include a channel film, a tunnel insulating film, a charge trap film, and a blocking insulating film. For example, a pillar for providing the channel film may be provided in each string. For example, a pillar for providing at least one of the channel film, the tunnel insulating film, the charge trap film, and the blocking insulating film may be provided in each string.

The source select transistor SST of each string may be connected between the source line SL and the memory cells MC1 to MCp.

In an embodiment, the source select transistors of the strings arranged in the same row may be connected to the source select line extending in the row direction, and the source select transistors of the strings arranged in different rows may be connected to different source select lines. In FIG. 27, the source select transistors of the strings ST11 to ST1$m$ of a first row may be connected to a first source select line SSL1. The source select transistors of the strings ST21 to ST2$m$ of a second row may be connected to a second source select line SSL2.

As another embodiment, the source select transistors of the strings ST11 to ST1m and ST21 to ST2m may be commonly connected to one source select line.

The first to n-th memory cells MC1 to MCn of each string may be connected between the source select transistor SST and the drain select transistor DST.

The first to n-th memory cells MC1 to MCn may be divided into first to p-th memory cells MC1 to MCp and (p+1)-th to n-th memory cells MCp+1 to MCn. The first to p-th memory cells MC1 to MCp may be sequentially arranged in a vertical direction (Z direction), and may be connected in series between the source select transistor SST and the pipe transistor PT. The (p+1)-th to n-th memory cells MCp+1 to MCn may be sequentially arranged in the vertical direction (Z direction), and may be connected in series between the pipe transistor PT and the drain select transistor DST. The first to p-th memory cells MC1 to MCp and the (p+1)-th to n-th memory cells MCp+1 to MCn may be connected to each other through the pipe transistor PT. Gates of the first to n-th memory cells MC1 to MCn of each string may be connected to the first to n-th word lines WL1 to WLn, respectively.

In an embodiment, at least one of the first to n-th memory cells MC1 to MCn may be used as a dummy memory cell. When the dummy memory cell is provided, a voltage or a current of a corresponding string may be stably controlled. A gate of the pipe transistor PT of each string may be connected to a pipeline PL.

The drain select transistor DST of each string may be connected between the bit line and the memory cells MCp+1 to MCn. The strings arranged in the row direction may be connected to the drain select line extending in the row direction. The drain select transistors of the strings ST11 to ST1m of the first row may be connected to a first drain select line DSL1. The drain select transistors of the strings ST21 to ST2m of the second row may be connected to a second drain select line DSL2.

The strings arranged in the column direction may be connected to the bit lines extending in the column direction. In FIG. 5, the strings ST11 and ST21 of a first column may be connected to the first bit line BL1. The strings ST1m and ST2m of an m-th column may be connected to the m-th bit line BLm.

Among the strings arranged in the row direction, the memory cells connected to the same word line may configure one page. For example, the memory cells connected to the first word line WL1 of the strings ST11 to ST1m of the first row may configure one page. The memory cells connected to the first word line WL1 of the strings ST21 to ST2m of the second row may configure another page. When one of the drain select lines DSL1 and DSL2 is selected, the strings arranged in one row direction are selected. When one of the word lines WL1 to WLn is selected, one page is selected among the selected strings.

Figure 28:
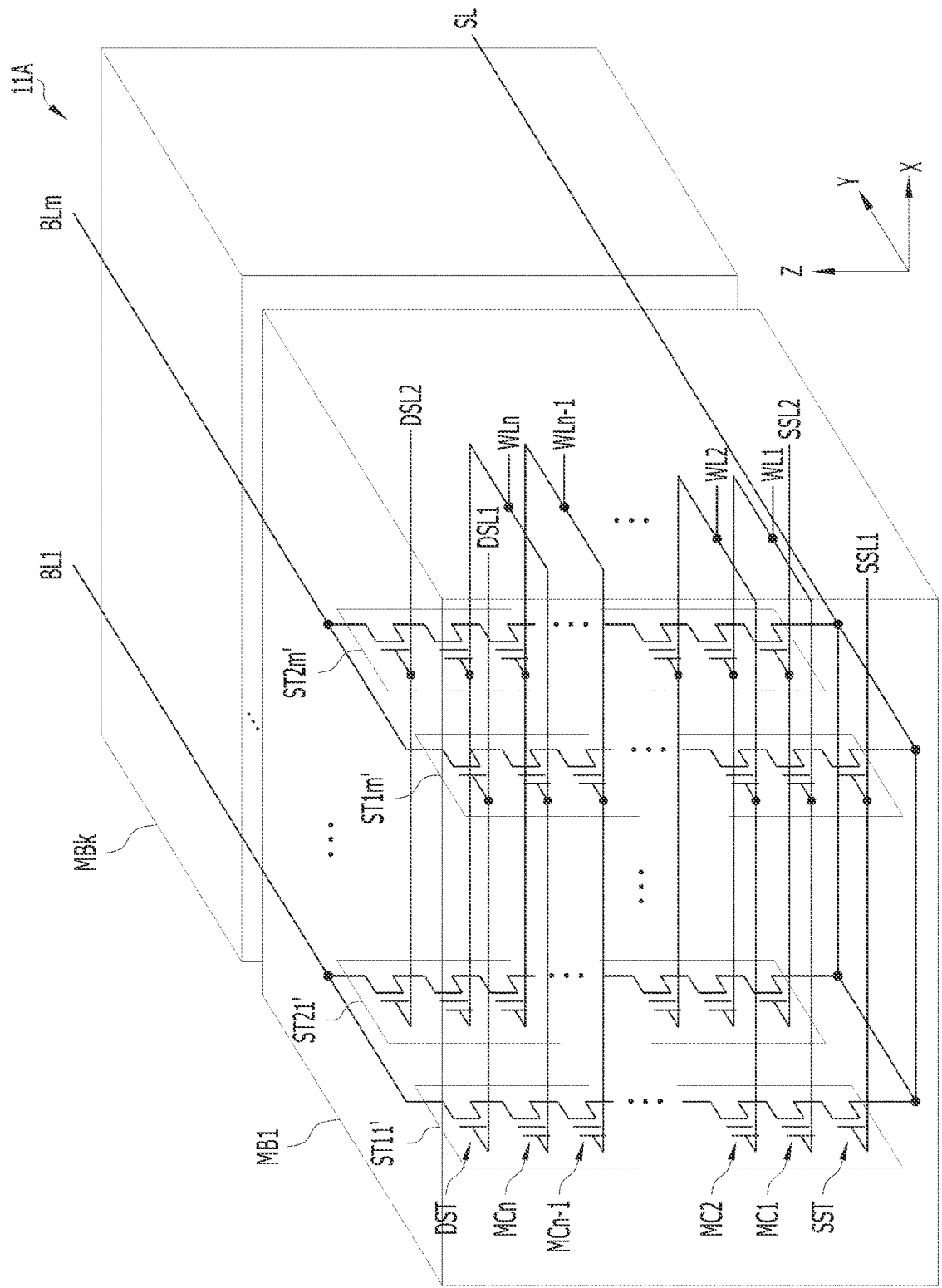
FIG. 28 is a diagram describing another embodiment of a three-dimensional configuration of a memory block of the semiconductor memory of FIG. 25.

FIG. 28 is a diagram describing another embodiment of a memory block configured in three-dimensions.

Referring to FIG. 28, the memory cell array 10A may include a plurality of memory blocks MB1 to MBk. The memory block 11A may include a plurality of strings ST11' to ST1m' and ST21' to ST2m'. Each of the plurality of strings ST11' to ST1m' and ST21' to ST2m' may extend along the vertical direction (Z direction). In the memory block 11A, m strings may be arranged in the row direction (X direction). In FIG. 28, two strings are arranged in the column direction (Y direction), but this is for clarity; three or more strings may be arranged in the column direction (Y direction).

Each of the plurality of strings ST11' to ST1m' and ST21' to ST2m' may include at least one source select transistor SST, first to n-th memory cells MC1 to MCn, and at least one drain select transistor DST.

The source select transistor SST of each string may be connected between the source line SL and the memory cells MC1 to MCn. The source select transistors of the strings arranged in the same row may be connected to the same source select line. The source select transistors of the strings ST11' to ST1m' arranged in the first row may be connected to the first source select line SSL1. The source select transistors of the strings ST21' to ST2m' arranged in the second row may be connected to the second source select line SSL2. As another embodiment, the source select transistors of the strings ST11' to ST1m' and ST21' to ST2m' may be commonly connected to one source select line.

The first to n-th memory cells MC1 to MCn of each string may be connected to each other in series between the source select transistor SST and the drain select transistor DST. Gates of the first to n-th memory cells MC1 to MCn may be connected to the first to n-th word lines WL1 to WLn, respectively.

In an embodiment, at least one of the first to n-th memory cells MC1 to MCn may be used as a dummy memory cell. When the dummy memory cell is provided, a voltage or a current of a corresponding string may be stably controlled. Therefore, reliability of the data stored in the memory block 11A may be improved.

The drain select transistor DST of each string may be connected between the bit line and the memory cells MC1 to MCn. The drain select transistors DST of the strings arranged in the row direction may be connected to the drain select line extending in the row direction. The drain select transistors DST of the strings CS11' to CS1m' of the first row may be connected to the first drain select line DSL1. The drain select transistors DST of the strings CS21' to CS2m' of the second row may be connected to the second drain select line DSL2.

Figure 29:
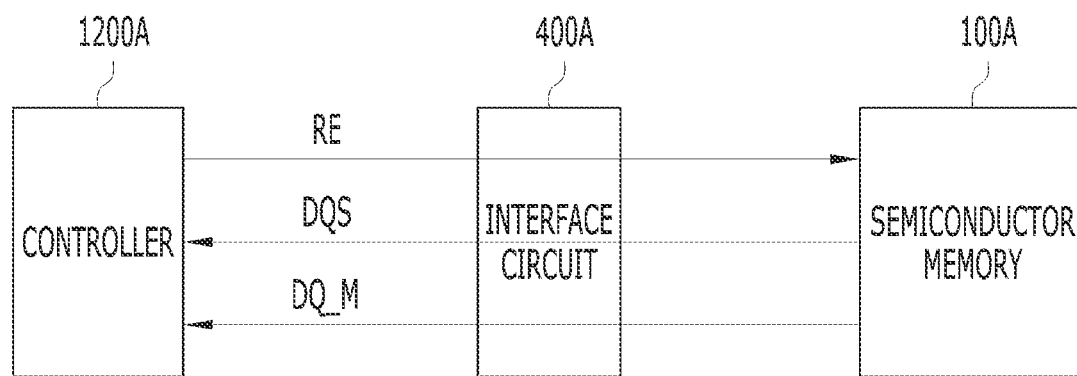
FIG. 29 is a diagram describing a transmission flow of data and signals during a read operation of a semiconductor memory according to an embodiment of the present invention disclosure.

FIG. 29 is a diagram describing a transmission flow of data and signals during a read operation of a semiconductor memory according to an embodiment of the present invention disclosure.

Figure 30:
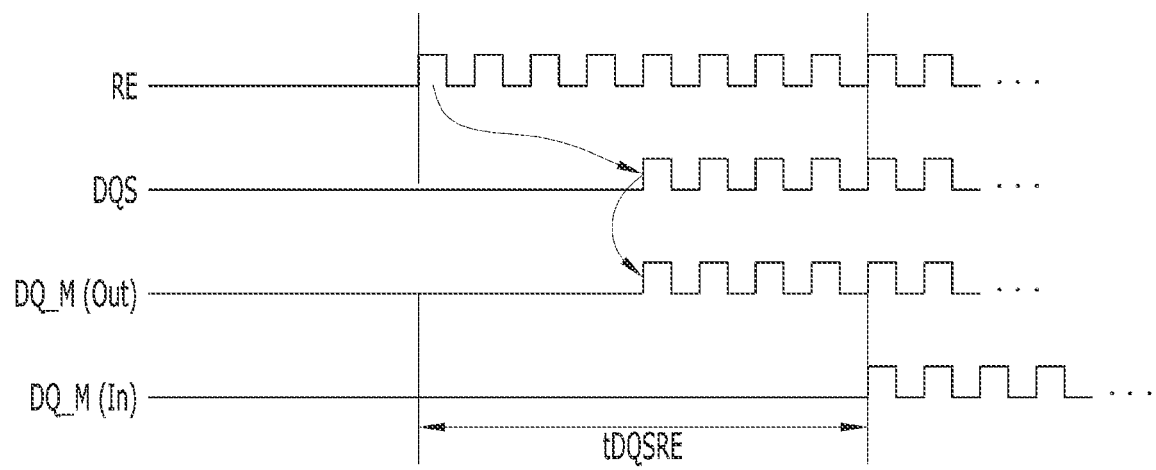
FIG. 30 is a waveform diagram of data and signals which describe a read operation of a semiconductor memory according to an embodiment of the present invention disclosure.

FIG. 30 is a waveform diagram of data and signals describing a read operation of a semiconductor memory according to an embodiment of the present invention disclosure.

The read operation of the normal data or the system data of the semiconductor memory according to an embodiment of the present invention disclosure will be described as follows with reference to FIGS. 29 and 30.

Referring to FIGS. 29 and 30, the controller 1200A generates and outputs the read enable signal RE during a read operation of the normal data or the system data DQ_M stored in the semiconductor memory 100A. The read enable signal RE is toggled at a set frequency from an activation time point.

The read enable signal RE generated in the controller 1200A is transmitted to the interface circuit 400A and the interface circuit 400A transmits the received read enable signal RE to the semiconductor memory 100A. The semiconductor memory 100A generates the data strobe signal DQS in response to the received read enable signal RE.

The semiconductor memory 100A reads the stored normal data or system data DQ_M and outputs the read normal data or system data DQ_M in synchronization with the data strobe signal DQS (DQ_M(Out)). Then, the output normal data or system data DQ_M is received by the controller 1200A through the interface circuit 400A (DQ_M(In)).

A period of time from a time point at which the read enable signal RE is activated and generated in the controller 1200A to a time point at which the normal data or the system data DQ_M is received by the controller 1200A is defined as a data transmission time tDQSRE of the read operation, and the controller 1200A may perform a preparatory operation for receiving data during the data transmission time tDQSRE. Therefore, the data transmission time tDQSRE may be set to a specific time. When the data transmission time tDQSRE is shorter than the set time, a data reception preparation operation of the controller cannot be completed and thus reliability of the received data may be reduced.

Figure 31:
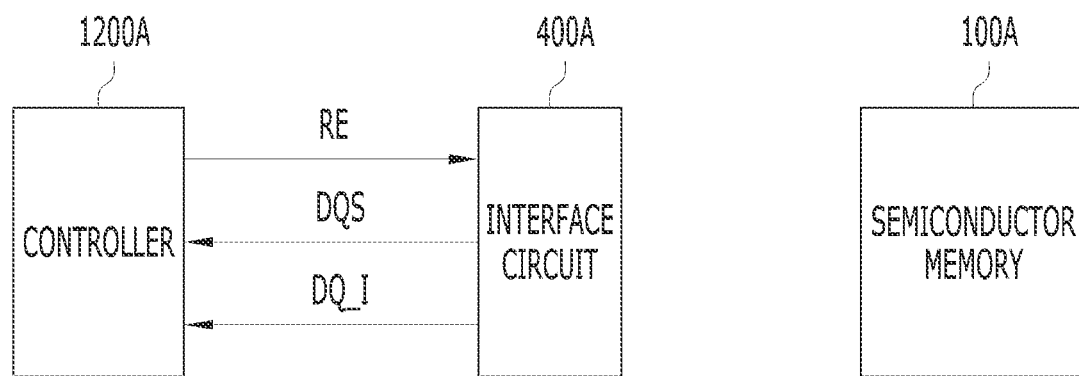
FIG. 31 is a diagram describing a transmission flow of data and signals during a read operation of data stored in an interface circuit.

FIG. 31 is a diagram describing a transmission flow of data and signals during a read operation of data stored in an interface circuit.

Figure 32:
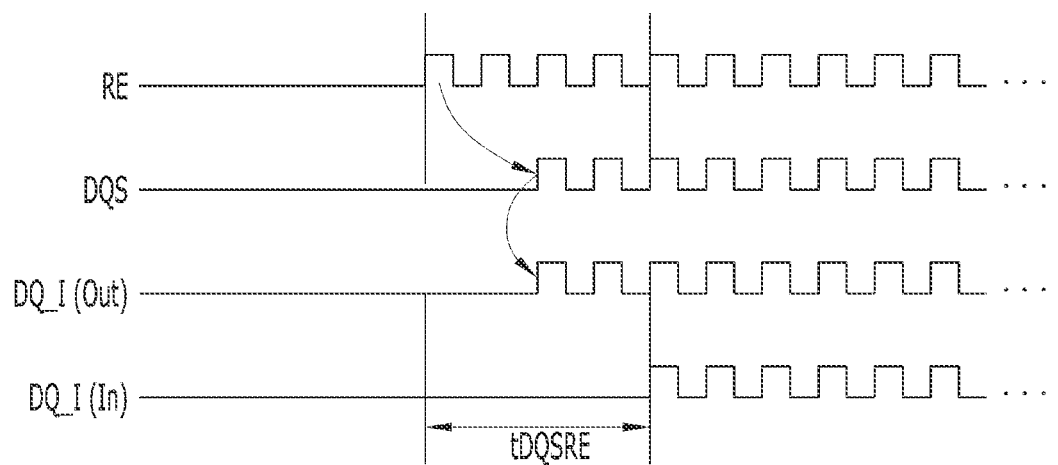
FIG. 32 is a waveform diagram of data and signals describing a read operation of data stored in an interface circuit.

FIG. 32 is a waveform diagram of data and signals describing a read operation of data stored in an interface circuit.

Referring to FIGS. 31 and 32, the controller 1200A generates and outputs the read enable signal RE during a read operation of the system data DQ_I stored in the interface circuit 400A. The read enable signal RE is toggled at a set frequency from an activation time point.

The read enable signal RE generated in the controller 1200A is transmitted to the interface circuit 400A, and the interface circuit 400A generates the data strobe signal DQS in response to the received read enable signal RE.

The interface circuit 400A reads the system data DQ_M stored in the interface circuit 400A, and outputs the system data DQ_I in synchronization with the data strobe signal DQS (DQ_I(Out)). The output system data DQ_I is received by the controller 1200A (DQ_I(In)).

When the interface circuit 400A generates the data strobe signal DQS during the read operation of the system data DQ_I stored in the interface circuit 400A, the time from when the data strobe signal DQS is generated by the interface circuit 400A to when the read data reaches the controller 1200A is less than of the time it takes to perform the read operation of the norm al data or the system data of the semiconductor memory 100A shown in FIGS. 29 and 30. Therefore, the data transmission time tDQSRE during the read operation of the system data DQ_I stored in the interface circuit 400A is shorter than the data transmission time tDQSRE during the read operation of the normal data or the system data of the semiconductor memory 100A. The shorter data transmission time tDQSRE during the read operation of the system data DQ_I stored in the interface circuit 400A may interrupt completion of the data reception preparation operation of the controller and thus reliability of the read operation of the system data DQ_I stored in the circuit 400A may be reduced.

Figure 33:
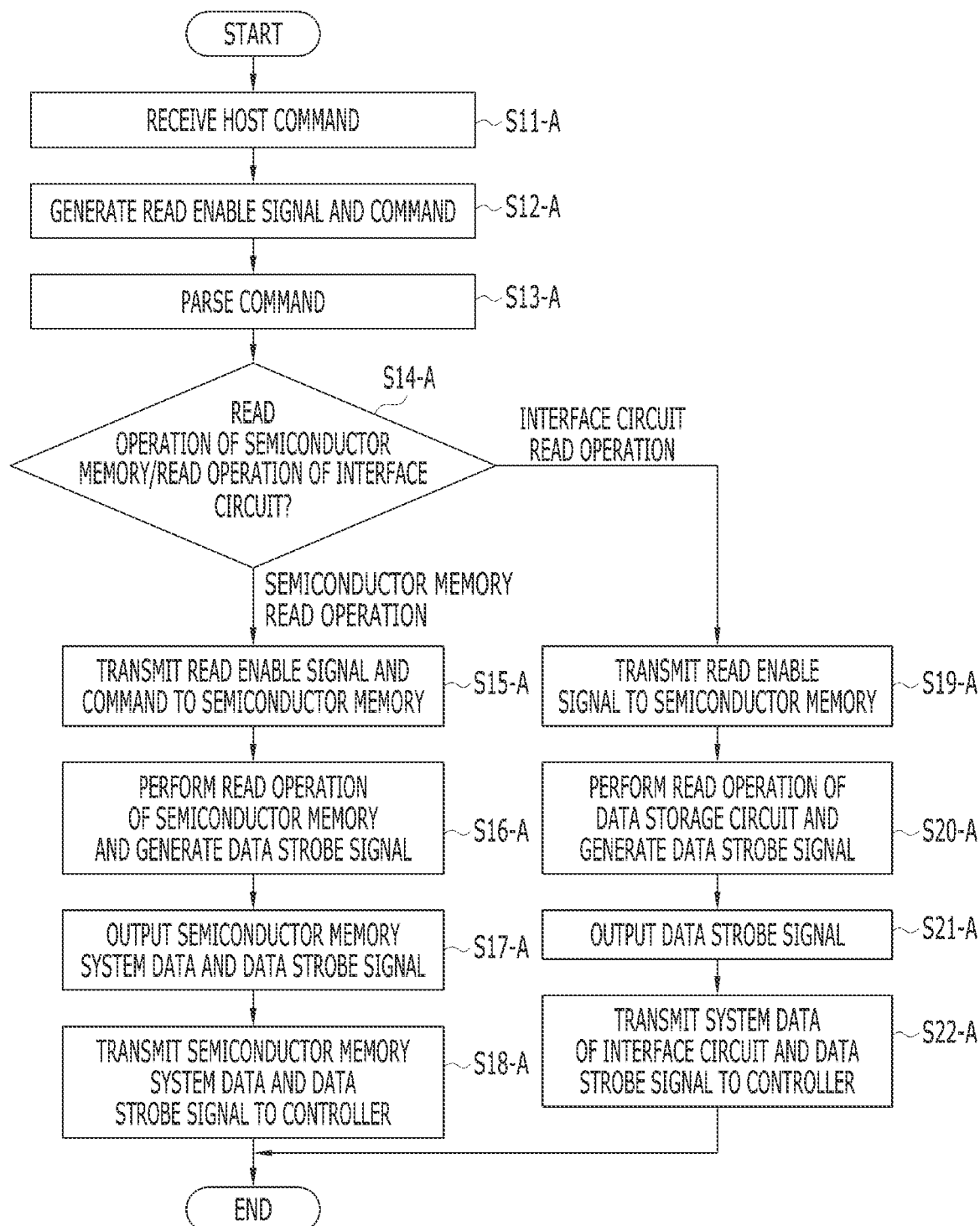
FIG. 33 is a flowchart of a method of operating a memory system according to an embodiment of the present invention disclosure.

FIG. 33 is a flowchart describing a method of operating the memory system 1000A according to an embodiment of the present invention disclosure.

A method of operating the memory system 1000A according to an embodiment of the present invention disclosure will be described as follows with reference to FIGS. 23, 24, and 33.

In an embodiment of the present invention disclosure, the operation of reading the system data stored in the semiconductor memory 100A or the system data stored in the interface circuit 400A will be described as an example.

The host 1300 outputs the specific command for the read operation of the system data stored in the semiconductor memory 100A or the interface circuit 400A as a host command Host_CMD. The controller 1200A receives the host command Host_CMD from the host 1300 (S11-A), and generates and outputs the command CMD corresponding to the host command Host_CMD and the read enable signal RE for the read operation (S12-A). The address included in the command may be an address corresponding to the semiconductor memory 100A or an address corresponding to the interface circuit 400A according to a target of the read operation.

The interface circuit 400 of the memory device 1100A receives the command CMD and the read enable signal RE from the controller 1200A, and the processor 420A of the interface circuit 400A parses the received command CMD (S13-A).

As a result of the parsing of the command CMD by the processor 420A (S14-A), when it is determined that the received command CMD corresponds to the read operation of the semiconductor memory 100A, the interface circuit 400A controls and rearranges the timing of the received command CMD and read enable signal RE, and transmits the command CMD and the read enable signal RE to the semiconductor memory 100A (S15-A).

The semiconductor memory 100A performs the read operation of the system data in response to the received command CMD, and the data strobe signal generation circuit 500A of the semiconductor memory 100A generates the data strobe signal DQS in response to the read enable signal RE (S16-A).

The semiconductor memory 100A outputs the read system data DQ_M to the interface circuit 400A together with the data strobe signal DQS in synchronization with the data strobe signal DQS (S17-A).

The interface circuit 400A receives the system data DQ_M and the data strobe signal DQS from the semiconductor memory 100A, controls and rearranges the timing of the received system data DQ_M and data strobe signal DQS, and then transmits the system data DQ_M and the data strobe signal DQS to the controller 1200A (S18-A).

As result of the parsing of the command CMD by the processor 420A described above (S14-A), when it is determined that the received command CMD corresponds to the read operation of the interface circuit 400A, the interface circuit 400A controls and rearranges the timing of the read enable signal RE, and transmits the read enable signal RE to the semiconductor memory 100A (S19-A). The received command CMD may also be transmitted to the semiconductor memory 100A together with the read enable signal RE.

The processor 420A of the interface circuit 400A activates the data read signal DATA_read according to the parsing result of the command CMD and outputs the data read signal DATA_read to the data storage circuit 460A. The data storage circuit 460A reads the system data DQ_I of the interface circuit 400A in response to the data read signal DATA_read, and the data strobe signal generation circuit 500A of the semiconductor memory 100A generates the data strobe signal DQS in response to the read enable signal RE (S20-A). The semiconductor memory 100A may perform the read operation of the system data DQ_M of the semiconductor memory 100A in response to the command CMD received together with the read enable signal RE.

The semiconductor memory 100A outputs the read system data DQ_M to the interface circuit 400A together with the data strobe signal DQS in synchronization with the data strobe signal DQS (S21-A).

The interface circuit 400A receives the data strobe signal DQS from the semiconductor memory 100A and outputs the system data DQ_I to the controller 1200A in synchronization with the received data strobe signal DQS. The interface circuit 400A may transmit the system data DQ_I and the data strobe signal DQS together to the controller 1200A (S22-A). In addition, the interface circuit 400A blocks the system data DQ_M of the semiconductor memory 100A received from the semiconductor memory 100A.

Figure 34:
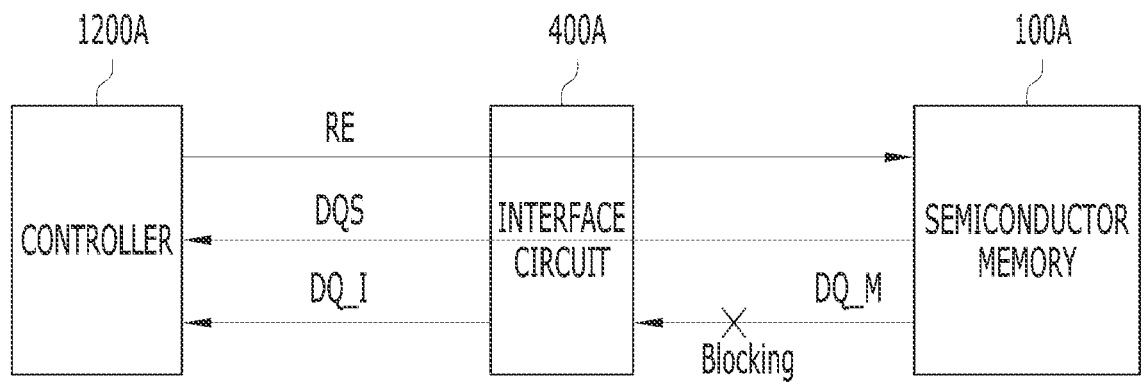
FIG. 34 is a diagram describing a transmission flow of data and signals during a read operation of data stored in an interface circuit according to an embodiment of the present invention disclosure.

FIG. 34 is a diagram describing a transmission flow of data and signals during a read operation of data stored in an interface circuit according to an embodiment of the present invention disclosure.

Figure 35:
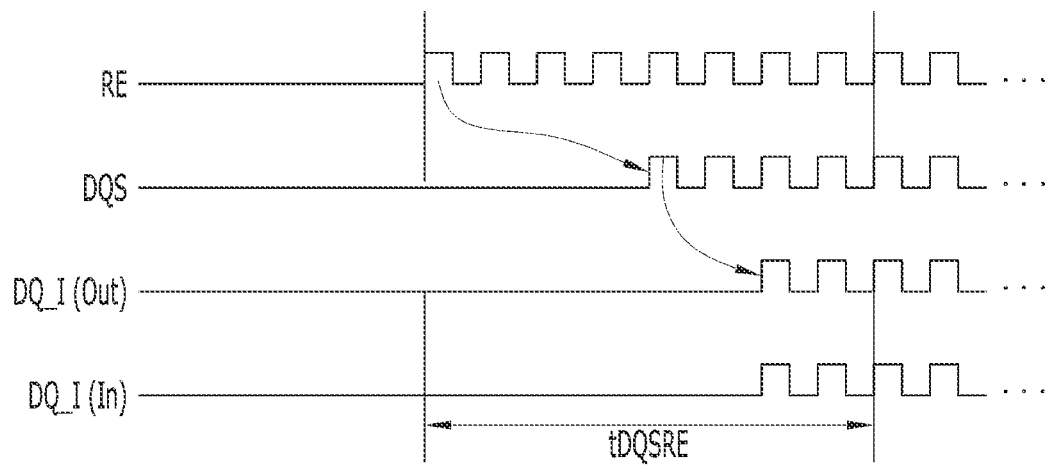
FIG. 35 is a waveform diagram of data and signals describing a read operation of data stored in an interface circuit according to an embodiment of the present invention disclosure.

FIG. 35 is a waveform diagram of data and signals describing a read operation of data stored in an interface circuit according to an embodiment of the present invention disclosure.

Referring to FIGS. 34 and 35, the controller 1200A generates and outputs the read enable signal RE during the read operation of the system data DQ_I stored in the interface circuit 400A. The read enable signal RE is toggled at a set frequency from an activation time point.

The read enable signal RE generated in the controller 1200A is transmitted to the interface circuit 400A, and the interface circuit 400A transmits the received read enable signal RE to the semiconductor memory 100A. The semiconductor memory 100A generates the data strobe signal DQS in response to the received read enable signal RE.

The semiconductor memory 100A transmits the data strobe signal DQS to the interface circuit 400A, and the interface circuit 400A outputs the system data DQ_I of the interface circuit 400A to the controller 1200A in synchronization with the data strobe signal DQS received from the semiconductor memory 100A. The interface circuit 400A may bypass the data strobe signal DQS generated by the semiconductor memory 100A. The interface circuit 400A may re-time the data strobe signal DQS generated by the semiconductor memory 100A. The interface circuit 400A may block the system data of the semiconductor memory 100A received from the semiconductor memory 100A together with the data strobe signal DQS. The interface circuit 4001 may operate at different frequencies in different operation modes. For example, the interface circuit 4001 may operate at a relatively low frequency (e.g., 533 Mbps) in a bypass mode and the interface circuit 4001 may operate at a relatively high frequency (e.g., 1.6 Gbps) in a retiring mode.

As described above, during the read operation of the system data of the interface circuit 400A, the read enable signal RE generated in the controller 1200A is transmitted to the semiconductor memory 100A and the system data of the interface circuit 400A is transmitted to the controller 1200A using the data strobe signal DQS generated in the semiconductor memory 100A. Therefore, the data transmission time tDQSRE of the read operation of the system data of the interface circuit 400A may be the same as the data transmission time tDQSRE of the read operation of the data of the semiconductor memory 100A shown in FIG. 30. Thus, the same data transmission time tDQSRE may prevent an interruption to the completion of the data reception preparation operation of the controller and reliability of the read operation of the system data of the interface circuit 400A may be improved.

Figure 36:
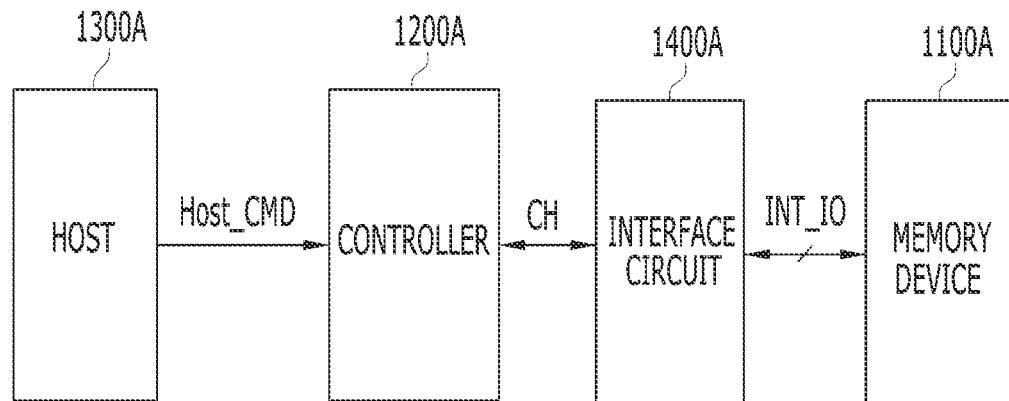
FIG. 36 is a diagram describing another embodiment of the memory system.

FIG. 36 is a diagram describing another embodiment of the memory system.

Referring to FIG. 36, a memory system 1000A includes a memory device 1100A in which data is stored, a controller 1200A that controls the memory device 1100A under control of a host 1300A, and an interface circuit 1400A that mediates command and data transmission between the controller 1200A and the memory device 1100A.

Differently from the memory system 1000A shown in FIG. 23, in the memory system 1000A shown in FIG. 36, the interface circuit 1400A may be disposed outside the memory device 1100A and may transmit the command and data through the memory device 1000A and an internal input/output line INT_IO.

The controller 1200A may generally control an operation of the memory system 1000A and control a data exchange between the host 1300A and the memory device 1100A. The controller 1200A may control a plurality of semiconductor memories included in the memory device 1100A to program or read data according to a request of the host 1300A. In addition, the controller 1200A may control the interface circuit 1400A to perform a read operation of data stored in the interface circuit 1400A according to the request of the host 1300A, and may transmit the data stored in the interface circuit 1400A to the controller 1200A using a data strobe signal generated in the memory device 1100A based on a read enable signal during a read operation of the data stored in the interface circuit 1400A.

A configuration of the interface circuit 1400A may be configured and operated as in the configuration of FIG. 24 described above.

Figure 37:
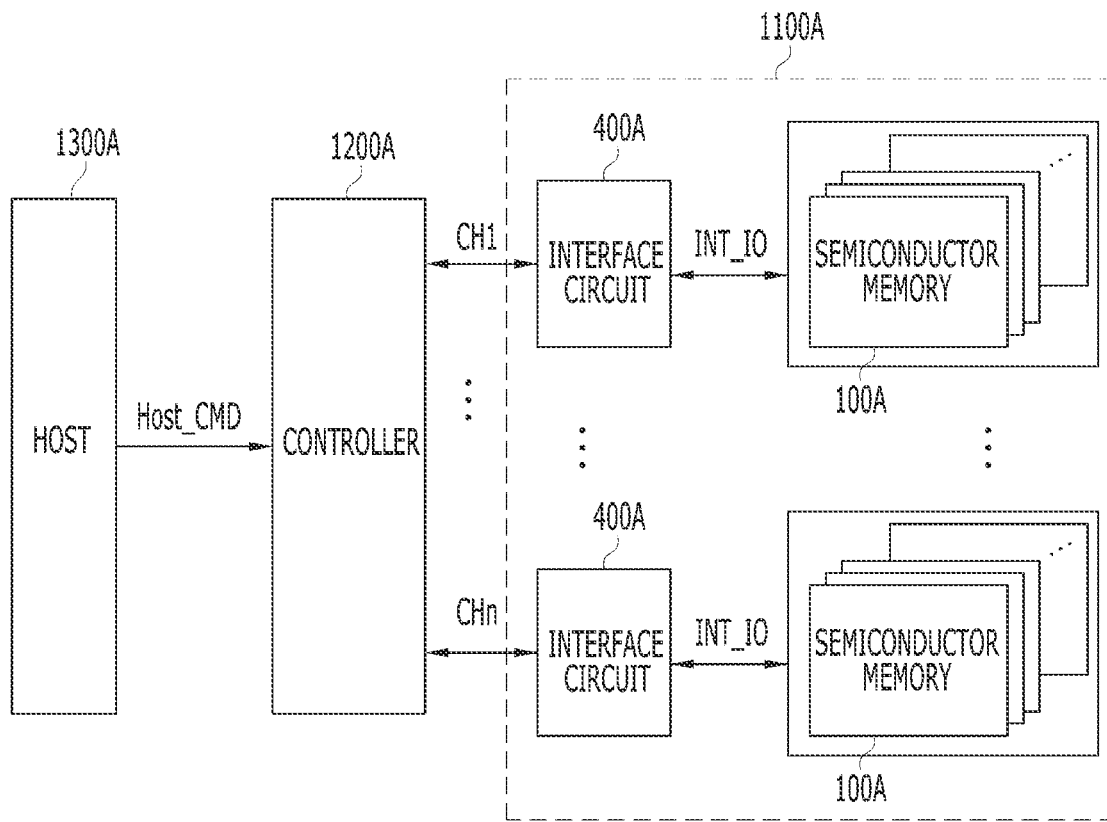
FIG. 37 is a diagram describing another embodiment of the memory system.

FIG. 37 is a diagram describing another embodiment of the memory system.

Referring to FIG. 37, a memory system 1000A includes a memory device 1100A and a controller 1200A. The memory device 1100A includes a plurality of semiconductor memories 100A and a plurality of interface circuits 400A. The plurality of semiconductor memories 100A may be divided into a plurality of groups, and each of the plurality of groups may be connected to one interface circuit 400A through an intern& input/output line INT_IO.

In FIG. 37, a plurality of interface circuits 400A communicate with the controller 1200A through first to n-th channels CH1 to CHn, respectively. Therefore, the plurality of semiconductor memories 100A included in one group are configured to communicate with the controller 1200A through one interface circuit 400A and a common channel. The controller 1200A is configured to control the plurality of semiconductor memories 100A of the memory device 1100A through the plurality of channels CH1 to CHn.

The controller 1200A may generally control an operation of the memory system 1000A and control a data exchange between the host 1300A and the memory device 1100A. The controller 1200A may control the plurality of semiconductor memories 100 included in the memory device 1100A to program or read data according to a request of the host 1300A. In addition, the controller 1200A may control the interface circuits 400A to perform a read operation of data stored in the interface circuit 400A according to the request of the host 1300A, and may transmit the data stored in the interface circuits 400A to the controller 1200A using a data strobe signal generated in the memory device 1100A based on a read enable signal during a read operation of the data stored in the interface circuits 1400A.

A configuration of the interface circuit 400A may be configured and operated as in the configuration of FIG. 24 described above.

The controller 1200A and the memory device 1100A may be integrated into one semiconductor device. In an embodiment, the controller 1200A and the memory device 1100A may be integrated into one semiconductor device to for a memory card, such as a PC card (personal computer memory card international association (PCMCIA)), a compact flash card (CF), a smart media card (SM, SMC), a memory stick, a multimedia card (MMC, RS-MMC, MMCmicro), an SD card (SD, miniSD, microSD, SDHC), and/or a universal flash memory (UFS).

The controller 1200A and the memory device 1100A may be integrated into one semiconductor device to form a semiconductor drive (solid state drive (SSD)). The semiconductor drive (SSD) includes a storage device configured to store data in a semiconductor memory. When the memory system 1000A is used as the semiconductor drive (SSD), an operation speed of the host 1300A connected to the memory system 1000A is dramatically improved.

As another example, the memory system 1000A is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring telematics network, an RFID device, or one of various components configuring a computing system.

In an embodiment, the memory device 1100A or memory system 1000A may be mounted as a package of various types. For example, the memory device 1100A or the memory system 1000A may be packaged and mounted in a method such as a package on package (PoP), ball grid arrays (BGAs), chip scale packages (CSPs), plastic leaded chip carriers (PLCO), a plastic dual in line package (PDIP), a die in waffle pack, die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), or a wafer-level fabricated package processed stack package (WSP).

Figure 38:
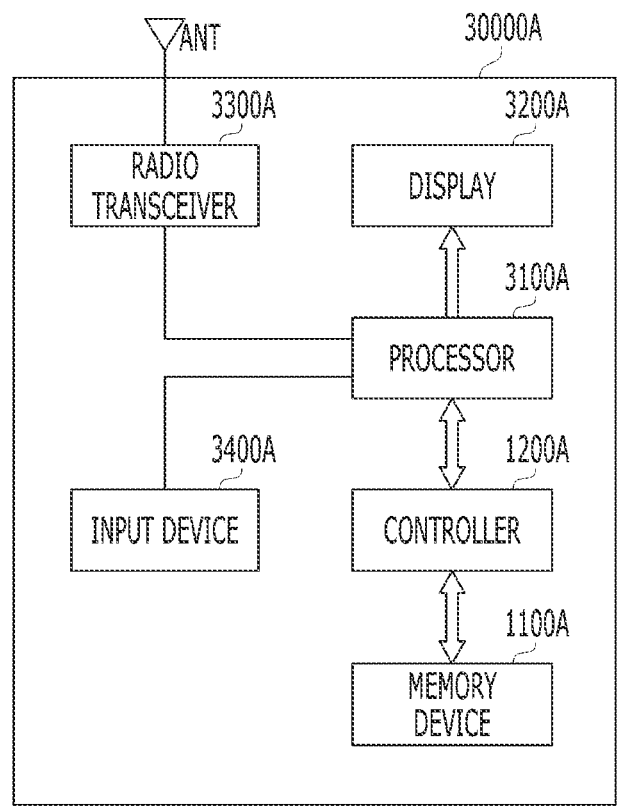
FIG. 38 is a diagram describing another embodiment of the memory system.

FIG. 38 is a diagram describing another embodiment of the memory system.

Referring to FIG. 38, a memory system 30000A may be implemented as a cellular phone, a smartphone, a tablet PC, a personal digital assistant (PDA) or a wireless communication device. The memory system 30000A may include the memory device 1100A and the controller 1200A capable of controlling the operation of the memory device 1100A. The controller 1200A may control a data access operation, for example, a program operation, an erase operation, or a read operation, of the memory device 1100A under control of a processor 3100A.

Data programmed in the memory device 1100A may be output through a display 3200A under the control of the controller 1200A.

A radio transceiver 3300A may transmit and receive radio signals through an antenna ANT. For example, the radio transceiver 3300A may convert a radio signal received through the antenna ANT into a signal that may be processed by the processor 3100A. Therefore, the processor 3100A may process the signal output from the radio transceiver 3300A and transmit the processed signal to the controller 1200A or the display 3200A. The controller 1200A may program the signal processed by the processor 3100A to the memory device 1100A. In addition, the radio transceiver 3300A may convert a signal output from the processor 3100A into a radio signal, and output the converted radio signal to an external device through the antenna ANT. An input device 3400A may be a device capable of inputting a control signal for controlling the operation of the processor 3100A or data to be processed by the processor 3100A. The input device 3400A may be implemented as a pointing device such as a touch pad, a computer mouse, a keypad, or a keyboard. The processor 3100A may control an operation of the display 3200A so that data output from the controller 1200A, data output from the radio transceiver 3300A, or data output from the input device 3400A is output through the display 3200A.

According to an embodiment, the controller 1200A capable of controlling the operation of memory device 1100A may be implemented as a part of the processor 3100A and may also be implemented as a chip separate from the processor 3100A. In addition, the memory device 1100A may include the interface circuit 400, such as the memory device 1100A shown in FIG. 23 or the memory device 1100A shown in FIG. 37. In addition, when the memory device 1100A includes only a semiconductor memory as shown in FIG. 36, an interface circuit for data communication between the controller 1200A and the memory device 1100A may be additionally provided. The interface circuit may be configured as the interface circuit 400A of FIG. 24.

Figure 39:
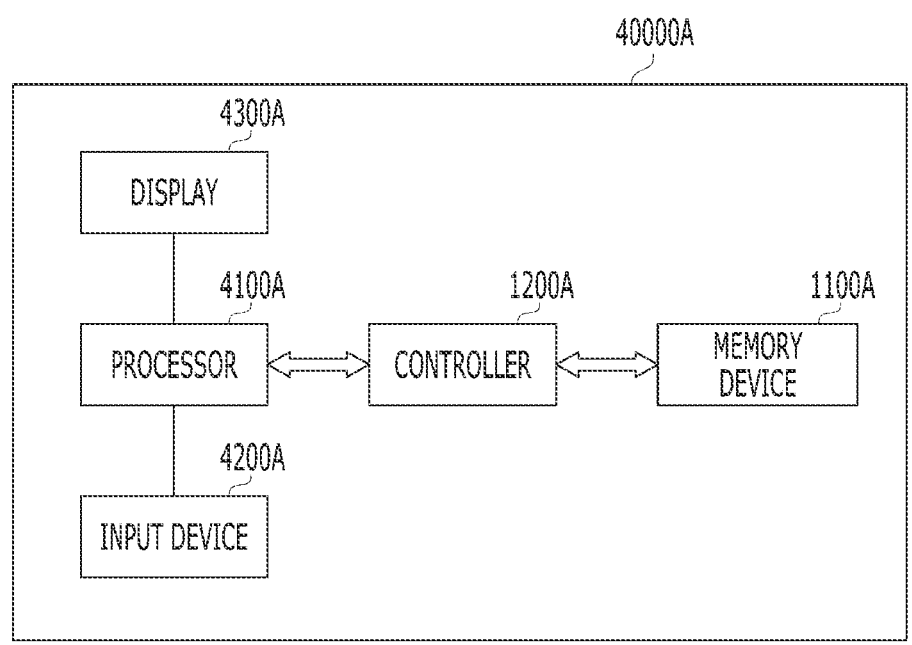
FIG. 39 is a diagram describing another embodiment of the memory system.

FIG. 39 is a diagram describing another example of the memory system.

Referring to FIG. 39, a memory system 40000A may be implemented as a personal computer (PC), a tablet PC, a net-book, an e-reader, a personal digital assistant (PDA), a portable multimedia player (PMP), an MP3 player, or an MP4 player.

The memory system 40000A may include the memory device 1100A and the controller 1200A capable of controlling a data processing operation of the storage device 1100A.

A processor 4100A may output data stored in the memory device 1100A through a display 4300A, according to data input through an input device 4200A. For example, the input device 4200A may be implemented as a point device such as a touch pad, a computer mouse, a keypad, or a keyboard.

The processor 4100A may control the overall operation of the memory system 40000A and control the operation of the controller 1200A. According to an embodiment, the controller 1200A capable of controlling the operation of memory device 1100A may be implemented as a part of the processor 4100A or may be implemented as a chip separate from the processor 4100A. In addition, the memory device 1100A may include the interface circuit 400A, such as the memory device 1100A shown in FIG. 23 or the memory device 1100A shown in FIG. 37. In addition, when the memory device 1100A includes only a semiconductor memory as shown in FIG. 36, an interface circuit for data communication between the controller 1200A and the memory device 1100A may be additionally provided. The interface circuit may be configured as the interface circuit 400A of FIG. 24.

Figure 40:
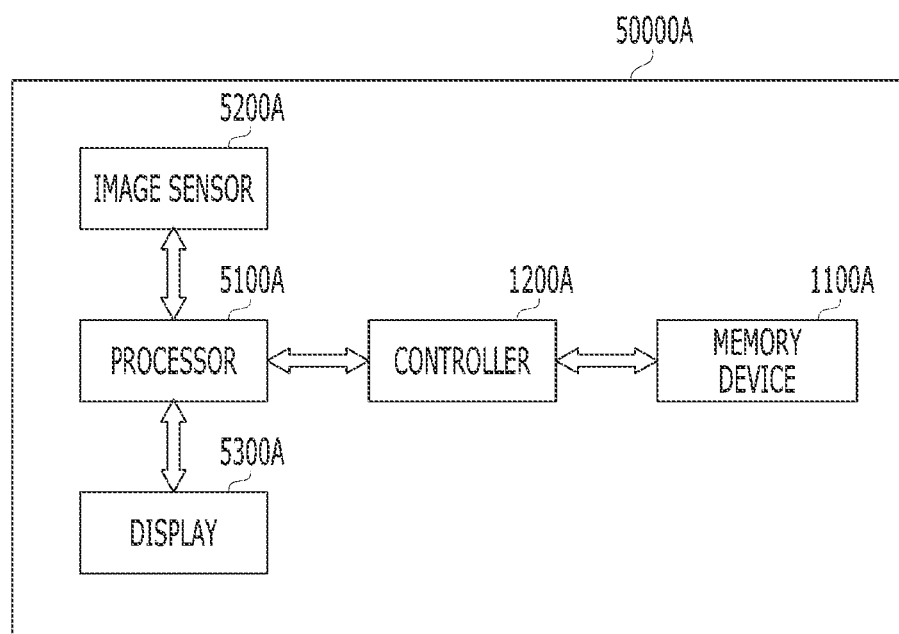
FIG. 40 is a diagram describing another embodiment of the memory system.

FIG. 40 is a diagram describing another embodiment of the memory system.

Referring to FIG. 40, a memory system 50000A may be implemented as an image processing device, for example, a digital camera, a portable phone provided with a digital camera, a smart phone provided with a digital camera, or a tablet PC provided with a digital camera.

The memory system 50000A includes the memory device 1100A and the controller 1200A capable of controlling a data processing operation, for example, a program operation, an erase operation, or a read operation, of the memory device 1100A.

An image sensor 5200A of the memory system 50000A may convert an optical image into digital signals. The converted digital signals may be transmitted to a processor 5100A or the controller 1200A. Under the control of the processor 5100A, the converted digital signals may be output through a display 5300A or stored in the memory device 1100A through the controller 1200A. Data stored in the memory device 1100A may be output through the display 5300A under the control of the processor 5100A or the controller 1200A.

According to an embodiment, the controller 1200A capable of controlling the operation of memory device 1100A may be implemented as a part of the processor 5100A or may be implemented as a chip separate from the processor 5100A. In addition, the memory device 1100A may include the interface circuit 400A, such as the memory device 1100A shown in FIG. 23 or the memory device 1100A shown in FIG. 37. In addition, when the memory device 1100A includes only a semiconductor memory as shown in FIG. 36, an interface circuit for data communication between the controller 1200A and the memory device 1100A may be additionally provided. The interface circuit may be configured as the interface circuit 400A of FIG. 24.

Figure 41:
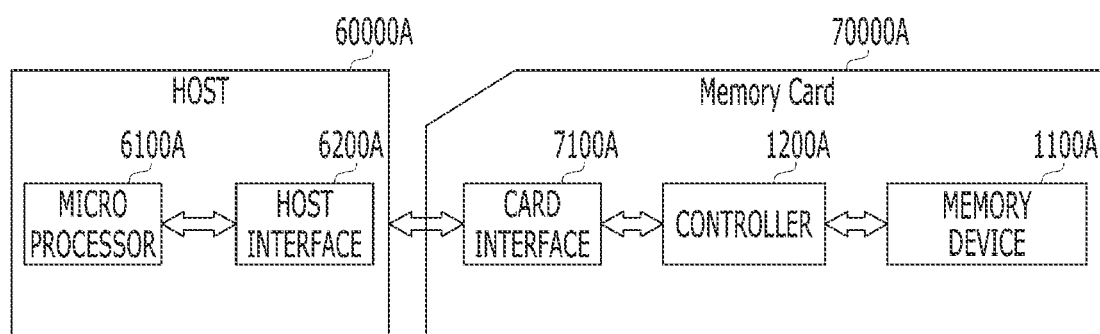
FIG. 41 is a diagram describing another embodiment of the memory system.

FIG. 41 is a diagram describing another embodiment of the memory system.

Referring to FIG. 41, a memory system 70000A may be implemented as a memory card or a smart card. The memory system 70000A may include the memory device 1100A, the controller 1200A, and a card interface 7100A.

The controller 1200A may control data exchange between the memory device 1100A and the card interface 7100A. According to an embodiment, the card interface 7100A may be a secure digital (SD) card interface or a multi-media card (MMC) interface, but is not limited thereto. In addition, the memory device 1100A may include the interface circuit 400A, such as the memory device 1100A shown in FIG. 23 or the memory device 1100A shown in FIG. 37. In addition, when the memory device 1100A includes only a semiconductor memory 100A as shown in FIG. 36, an interface circuit for data communication between the controller 1200A and the memory device 1100A may be additionally provided. The interface circuit may be configured as the interface circuit 400A of FIG. 24.

The card interface 7100A may interface data exchange between a host 60000A and the controller 1200A according to a protocol of the host 60000A. According to an embodiment, the card interface 7100A may support a universal serial bus (USB) protocol, and an interchip (IC)-USB protocol. Here, the card interface may refer to hardware capable of supporting a protocol that is used by the host 60000A, software installed in the hardware, or a signal transmission method.

When the memory system 70000A is connected to a host interface 6200A of the host 60000A such as a PC, a tablet PC, a digital camera, a digital audio player, a mobile phone, a console video game hardware, or a digital set-top box, the interface 6200A may perform data communication with the memory device 1100A through the card interface 7100A and the controller 1200A under control of a microprocessor 6100A.

Figure 42:
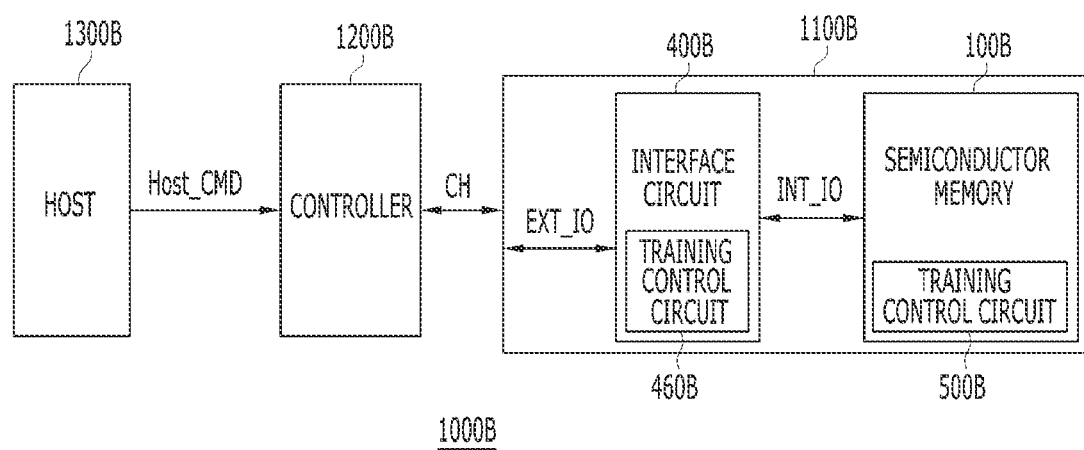
FIG. 42 is a block diagram describing a memory system according to an embodiment of the present disclosure.

FIG. 42 is a block diagram describing a memory system according to an embodiment of the present disclosure.

Referring to FIG. 42, a memory system 1000B includes a memory device 1100B in which data is stored, a controller 1200B that controls the memory device 1100E under control of a host 1300B.

The host 1300B may communicate with the controller by using an interface protocol such as a peripheral component interconnect-express (PCI-E), an advanced technology attachment (ATA), a serial ATA (SATA), a parallel ATA (PATA), or a serial attached SCSI (SAS). In addition, the interface protocol between the host 1300B and the controller 1200B is not limited to the above-described example, and alternatively may be one of various other interface protocols such as a universal serial bus (USB), a multi-media card (MMC), an enhanced small disk interface (ESDI), and integrated drive electronics (IDE).

The controller 1200B may generally control an operation of the memory system 1000B and control data exchange between the host 1300B and the memory device 1100B. For example, the controller 1200B may control the memory device 1100B in response to a request from the host 1300B to program or read data. The controller 1200B may control to perform a write training operation and a read training operation of an interface circuit 400B or a semiconductor memory 100B included in the memory device 1100B according to the request of the host 1300B. In addition, the controller 1200B may control the write training operation and the read training operation of the interface circuit 400B or the semiconductor memory 100B after a power up operation.

The controller 1200B may generate a command for controlling the memory device 1100B in response to a host command Host_CMD corresponding to the request of the host 1300B and transmit the command to the memory device 1100B, or may generate a command for controlling the memory 1100B after the power up operation and transmit the command to the memory device 1100B. When the controller 1200B generates the command for controlling the semiconductor memory 1008 included in the memory device 1100B, the controller 1200B generates the command so that an address corresponding to the semiconductor memory 100B is included in the command. In addition, when the controller 1200B generates the command for controlling the interface circuit 400B included in the memory device 1100B, the controller 1200B generates the command so that an address corresponding to the interface circuit 400B is included in the command.

According to an embodiment, the memory device 1100B may include a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), or a flash memory.

The memory device 1100B may be connected to the controller 1200B through a channel CH and may include the semiconductor memory 100B and the interface circuit 400B. The semiconductor memory 100B may communicate with the controller 1200B through the interface circuit 400B. For example, the interface circuit 400B may mediate command and data communication between the controller 1200B and the semiconductor memory 100B. In addition, the interface circuit 400B may perform an operation of controlling and rearranging a timing of data exchanged between the controller 1200B and the semiconductor memory 100B. The interface circuit 400B may rearrange the data exchanged between the controller 1200B and the semiconductor memory 100B to reduce skew of transmitted data and improve reliability. The interface circuit 400B may be connected to the channel CH through an external input/output line EXT_IO and may be connected to the semiconductor memory 100B through an internal input/output line INT_IO.

In addition, the interface circuit 400B may include a training control circuit 460B and may perform a training operation of the interface circuit 400B in response to a specific command (for example, a first command) received from the controller 1200B. In response to the first command, the training control circuit 460B of the interface circuit 400B may perform a write training operation of storing training data in the interface circuit 400B, determining an amount of mismatch between timings of internal docks and data of the interface circuit 400B during the write training operation, and correcting the amount of mismatch; and may perform a read training operation of reading the training data stored in the interface circuit 400B, outputting the training data to the controller 1200B, determining an amount of mismatch between timings of the internal docks and the data of the interface circuit 400B during the read training operation, and correcting the amount of mismatch. When the first command is received from the controller 1200B, the interface circuit 400B blocks transfer of the first command to the semiconductor memory 100B in order to prevent malfunction of the semiconductor memory 100B due to the first command.

In addition, the interface circuit 400B performs an operation of transmitting a specific command (for example, a second command) received from the controller 1200B to the semiconductor memory 100B.

The semiconductor memory 100B may include a plurality of memory cells capable of storing and reading data. In addition, the semiconductor memory 100B may include a training control circuit 500B, and the training control circuit 500B may perform a training operation of the semiconductor memory 100B in response to the second command received through the interface circuit 400B. In response to the second command, the training control circuit 500B of the semiconductor memory 100B may perform a write training operation of storing training data in the memory cells included in the semiconductor memory 100B, determining an amount of mismatch between timings of internal docks and data of the semiconductor memory 100B during the write training operation, and correcting the mismatch; and may perform a read training operation of reading the training data stored in the memory cells of the semiconductor memory 100B, outputting the training data to the interface circuit 400B, determining an amount of mismatch between timings of the internal clocks and the data of the semiconductor memory 100B during the read training operation, and correcting the mismatch.

Figure 43:
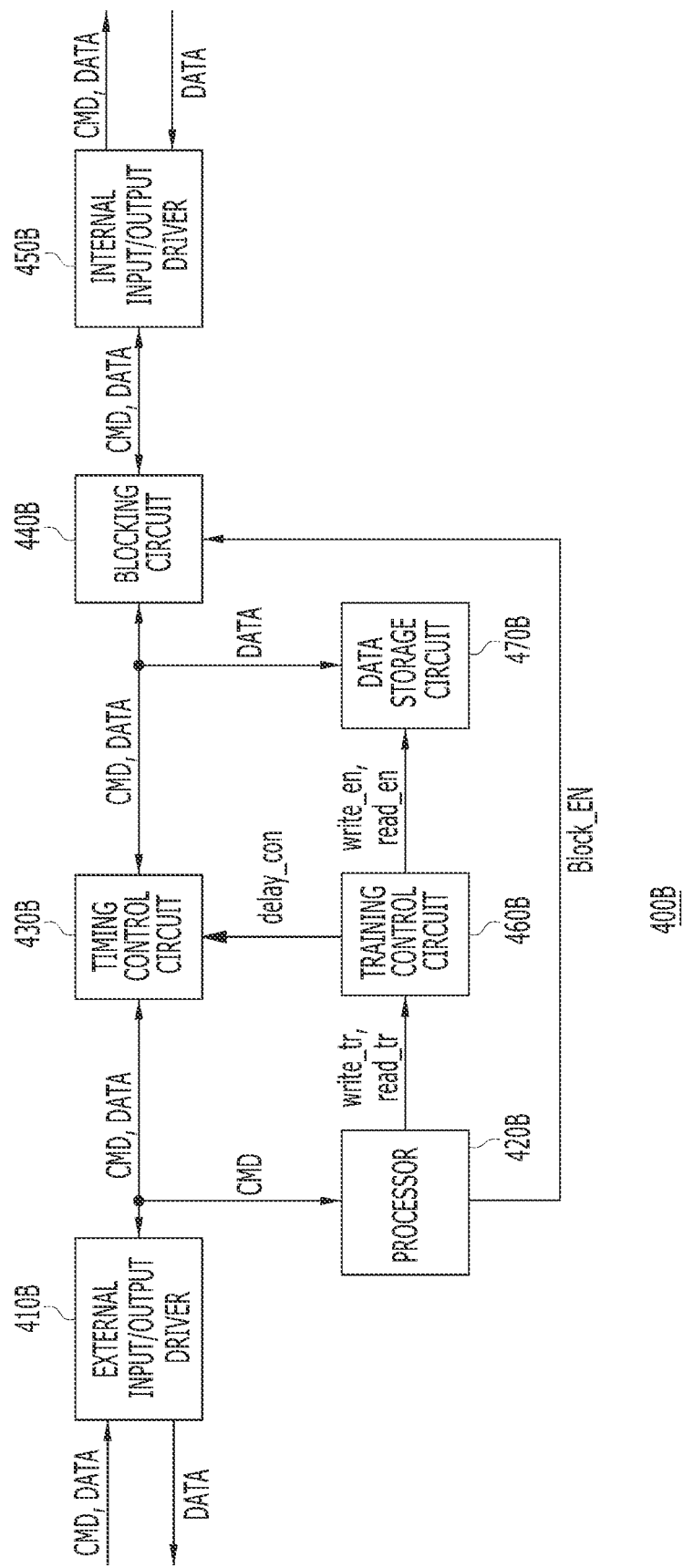
FIG. 43 is a block diagram describing a configuration of an interface circuit of FIG. 42.

FIG. 43 is a block diagram describing a configuration of the interface circuit of FIG. 42.

Referring to FIG. 43, the interface circuit 400B may include an external input/output driver 410B, a processor 420B, a timing control circuit 430B, a blocking circuit 440B, an internal input/output driver 450B, a training control circuit 460B, and a data storage circuit 470B.

The external input/output driver 410B receives a command CMD and data DATA from the controller 1200B of FIG. 42 and transmits the command CMD and the data to the timing control circuit 430B during a write operation. In addition, the external input/output driver 410B transmits the received command CMD to the processor 420B.

In addition, the external input/output driver 410B receives the data DATA from the timing control circuit 430B and transmits the data DATA to the controller 1200B of FIG. 42 during a read operation.

The processor 420B receives the command CMD from the external input/output driver 410B and parses the received command CMD. As a result of parsing, when the received command CMD is determined as a command CMD to be transmitted to the semiconductor memory 100B in correspondence with an internal operation of the semiconductor memory 100B of FIG. 42, the processor 420B deactivates and outputs a blocking disable signal Block_DEN. As a result of parsing, when the received command CMD corresponds to the training operation of the interface circuit 400B, a write training signal write_tr or a read training signal read_tr is generated and output, or the write training signal write_tr and the read training signal read_tr are sequentially generated and output. The processor 420B activates and outputs a blocking enable signal Block_EN. The blocking disable signal Block_DEN and the blocking enable signal Block_EN may be transferred through an electrical line.

The processor 420B may include a register (not shown), and a plurality of addresses may be stored in the register. The plurality of addresses include an address corresponding to the semiconductor memory 100B and an address corresponding to the interface circuit 400B. The processor 420B may compare the address included in the command CMD with the address stored in the register during the parsing operation to determine whether the received command CMD corresponds to the semiconductor memory 100B or the interface circuit 400B.

The timing control circuit 430B receives and rearranges timings of the command CMD and the data DATA from the external input/output driver 410B and outputs the rearranged command CMD and data DATA to the blocking circuit 440B during the write operation of the semiconductor memory. The timing control circuit 430B rearranges the timing of the data DATA received from the external input/output driver 410B and outputs the data to the data storage circuit 470B during the write training operation of the interface circuit 400B. The timing control circuit 430B rearranges the timing of the data DATA received from the blocking circuit 440B and outputs the data to the external input/output driver 410B during the read operation of the semiconductor memory. The timing control circuit 430B rearranges the timing of the data DATA received from the data storage circuit 470B and outputs the data to the external input/output driver 410B during the read training operation of the interface circuit 400B.

The timing control circuit 430B may delay and output the received data DATA in response to a delay control signal delay_con received from the training control circuit 460B.

The blocking circuit 440B transmits the command CMD and data DATA received from the timing control circuit 4306 to the internal input/output driver 450B or transmits the data DATA received from the internal input/output driver 450B to the timing control circuit 430B. The blocking circuit 440B performs a blocking operation in response to the blocking enable signal Block_EN activated during the training operation of the interface circuit 400B so that the command CMD and the data DATA received from the timing control circuit 430B are not transmitted to the internal input/output driver 450B.

The internal input/output driver 450B receives the command CMD and the data DATA through the blocking circuit 440B and transmits the command CMD and the data DATA to the semiconductor memory 100B of FIG. 42, or transmits the data DATA received from the semiconductor memory 100B to the blocking circuit 440B.

The training control circuit 460B controls the write operation and the read operation of the data storage circuit 470B during the training operation of the interface circuit 400B. The training control circuit 460B determines the amount of mismatch between the timings of the internal clock and the data of the interface circuit 400B according to a write operation result of the data storage circuit 470B, and generates the delay control signal delay_con for controlling the delay time of the data DATA received from the external input/output driver 410B during the write operation of the semiconductor memory 100B. In addition, the training control circuit 460B determines the amount of mismatch between the timings of the internal clock and the data of the interface circuit 400B according to a read operation result of the data storage circuit 470B and generates the delay control signal delay_con for controlling the delay time of the data DATA output to the external input/output driver 410B during the read operation of the semiconductor memory 100B.

For example, the training control circuit 460B generates and output a write enable signal write_en for controlling the write operation of the data storage circuit 470B in response to the write training signal write_tr received from the processor 420B during the write training operation of the interface circuit 400B. The training control circuit 460B generates and outputs a read enable signal read_en for controlling the read operation of the data storage circuit 470B in response to the read training signal read_tr received from the processor 420B during the read training operation of the interface circuit 400B.

The data storage circuit 470B may store the training data therein or may read and output the stored training data therefrom during the training operation of the interface circuit 400. The data storage circuit 470B may store the training data therein in response to the write enable signal write_en and may read and output the stored training data therefrom in response to the read enable signal read_en.

Figure 44:
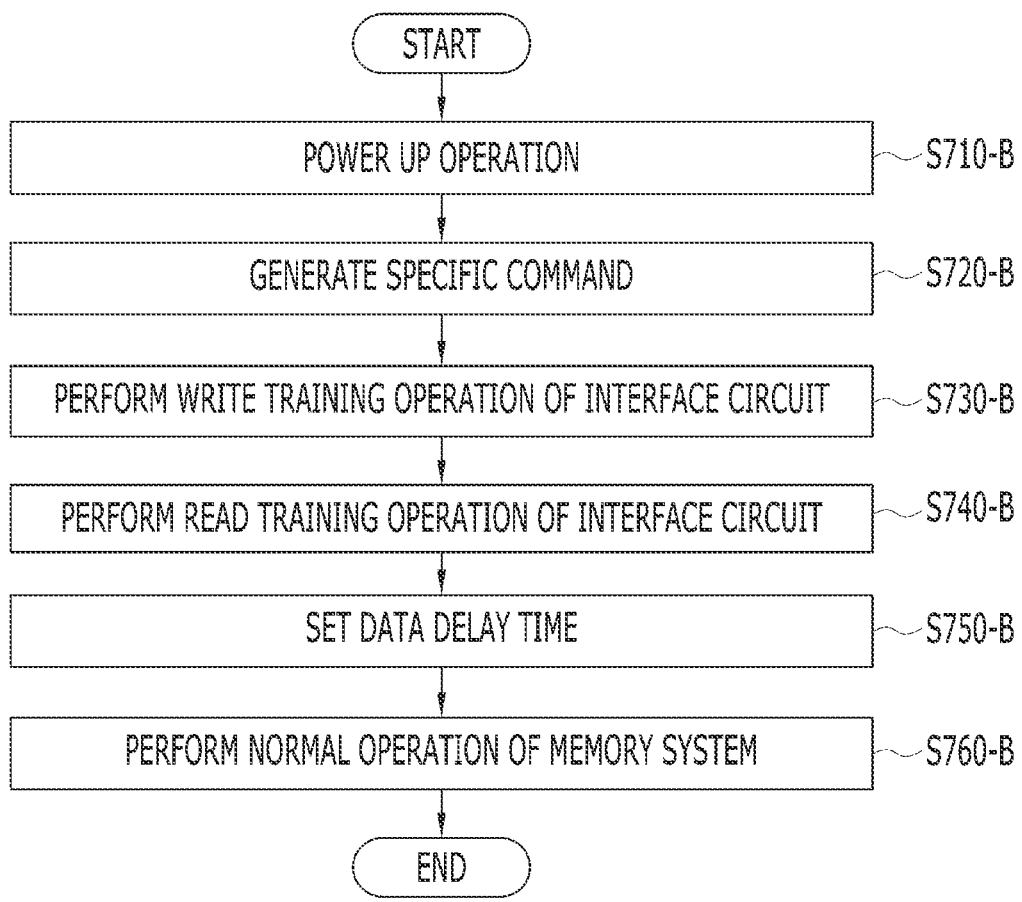
FIG. 44 is a flowchart describing an operation of a memory system according to an embodiment of the present disclosure.

FIG. 44 is a flowchart describing an operation of a memory system according to an embodiment of the present disclosure.

The operation of the memory system according to an embodiment of the present disclosure will be described with reference to FIGS. 42 to 44 as follows.

When a power voltage is applied to the memory system 1000 and a power up operation is performed (S710-B), the controller 1200 generates the specific command for instructing the training operation of the interface circuit 400B after the power up operation (S720-B). The specific command may comprise the command corresponding to the write training operation of the interface circuit 400 and the command corresponding to the read training operation of the interface circuit 400B. In addition, the specific command may include the address corresponding to the interface circuit 400B.

The controller 1200B outputs the specific command CMD and the data DATA for the write training operation to the interface circuit 400B of the memory device 1100B. The data DATA for the write training operation may have a specific pattern.

The interface circuit 400B receives the specific command CMD and the data DATA and performs the write training operation of the interface circuit 400B (S730-B).

A detailed operation of the interface circuit 400B during the write training operation of the interface circuit 400B will be described as follows.

The external input/output driver 410B receives the command CMD and the data DATA from the controller 1200B, and transmits the command CMD and the data DATA to the timing control circuit 430B. In addition, the external input/output driver 410B transmits the received command CMD to the processor 420B.

The processor 420B receives the command CMD from the external input/output driver 410B and parses the received command CMD. As a result of parsing, when the received command CMD corresponds to the training operation of the interface circuit 400B, the write training signal write_tr is generated and output. The processor 420B activates and outputs the blocking enable signal Block_EN. The processor 420B may compare the address included in the command CMD with the address stored in the register during the parsing operation to determine whether the received command CMD corresponds to the semiconductor memory 100B or the interface circuit 400B.

The timing control circuit 430B receives the command CMD and the data DATA from the external input/output driver 410B, rearranges the timings of the received command CMD and data DATA, and outputs the rearranged command CMD and data DATA to the blocking circuit 440B. In addition, the timing control circuit 430B outputs the rearranged data DATA to the data storage circuit 470B.

The blocking circuit 440B performs the blocking operation so that the command CMD and the data DATA received from the timing control circuit 430B are not transmitted to the internal input/output driver 450B in response to the blocking enable signal Block_EN.

The training control circuit 460B generates and outputs the write enable signal write_en for controlling the write operation of the data storage circuit 470B in response to the write training signal write_tr received from the processor 420B. The data storage circuit 470B receives and stores the data output from the timing control circuit 430B in response to the write enable signal write_en.

After the write training operation, the interface circuit 400 performs the read training operation (S740-B).

A detailed operation of the interface circuit 400B during the read training operation of the interface circuit 400B will be described as follows.

When the write training operation (S730-B) ends, the processor 420B generates and outputs the read training signal read_tr. The processor 420B controls the blocking enable signal Block_EN to maintain the activation state.

The training control circuit 460B generates and outputs the read enable signal read_en for controlling the read operation of the data storage circuit 470B in response to the read training signal read_tr received from the processor 420B. The data storage circuit 470B performs the data read operation in response to the read enable signal read_en and outputs the read data to the timing control circuit 430B.

The timing control circuit 430B rearranges the timing of the data received from the data storage circuit 470B and outputs the data to the external input/output driver 410B, and the external input/output driver 410B outputs the data DATA received from the timing control circuit 430B to the controller 1200B.

When the write training operation (S730-B) and the read training operation (S740-B) of the interface circuit 400B are finished, the training control circuit 460B determines the amount of mismatch between the timings of the internal clock and the data of the interface circuit 400B during the write training operation to set the delay time of the data DATA received from the external input/output driver 410B during the write operation, and determines the amount of mismatch between the timings of the internal clock and the data of the interface circuit 400B during the read training operation to set the delay time of the data DATA output to the external input/output driver 410B during the read operation (S750-B).

Thereafter, a normal operation of the memory system 1000B is performed (S760-B).

The host 1300B outputs the host command Host_CMD and the data DATA corresponding to a normal write operation to the controller 1200B during the normal write operation, and the controller 1200B generates the command CMD corresponding to the host command Host_CMD and transmits the command CMD corresponding to the host command Host_CMD to the memory device 1100B together with the data DATA.

The interface circuit 400B of the memory device 1100B receives and rearranges the timings of the command CMD and the data DATA, and transmits the rearranged command CMD and data DATA to the semiconductor memory 100B. The timing control circuit 430B of the interface circuit 400B may delay and output the received data DATA in response to the delay control signal delay_con received from the training control circuit 460B during an operation of transmitting the command CMD and the data DATA from the interface circuit 400B. The delay control signal delay_con may be generated based on the delay time set according to the amount of mismatch between the data DATA and the internal clocks obtained as a result of the write training operation of the interface circuit 400B.

The semiconductor memory 100B performs the normal write operation in response to the command CMD and the data DATA received through the interface circuit 400B.

During a normal read operation, the host 1300B outputs the host command Host_CMD corresponding to the normal read operation to the controller 1200B, and the controller 1200B generates the command CMD corresponding to the host command Host_CMD and transmits the command CMD corresponding to the host command Host_CMD to the memory device 1100B.

The interface circuit 400B of the memory device 1100B receives the command CMD and transmits the command CMD to the semiconductor memory 100B, and the semiconductor memory 100B performs the normal read operation in response to the received command CMD.

The interface circuit 400B receives and rearranges the timing of the data DATA read as a result of the normal read operation of the semiconductor memory 100B and transmits the rearranged data DATA to the controller 1200B. The timing control circuit 430B of the interface circuit 400B may delay and output the received data DATA in response to the delay control signal delay_con received from the training control circuit 460B during an operation of transmitting the data DATA of the interface circuit 400B. The delay control signal delay_con may be generated based on the delay time set according to the amount of mismatch between the data DATA and the internal docks obtained as a result of the read training operation of the interface circuit 400B.

During the above-described normal operation, for example, the normal write operation and the normal read operation of the semiconductor memory 100B, the blocking circuit 440B of the interface circuit 400B deactivates the blocking operation in response to the blocking disable signal Block_DEN. The blocking disable signal Block_DEN may be the inverse of the blocking enable signal Block_EN.

As described above, according to an embodiment of the present disclosure, the training operation of the interface circuit 400B may be performed in response to the specific command corresponding to the interface circuit 400B. In addition, malfunction of the semiconductor memory 108B may be prevented by blocking transfer of the first command to the semiconductor memory 100B during the training operation of the interface circuit 400B.

In an embodiment of the present disclosure, the training operation of the interface circuit is performed after the power up operation, but the present disclosure is not limited thereto. For example, when the training operation of the interface circuit is requested from the host, the specific command may be generated in response to the host command, and the interface circuit may perform the training operation in response to the specific command.

In addition, in an embodiment of the present disclosure, the delay time of the data is set according to the result of the write training operation and the read training operation during the training operation of the interface circuit. However, in order to match the timings of the internal clock and the data, a delay time of the internal clock may be controlled instead of a delay time of the data.

Figure 45:
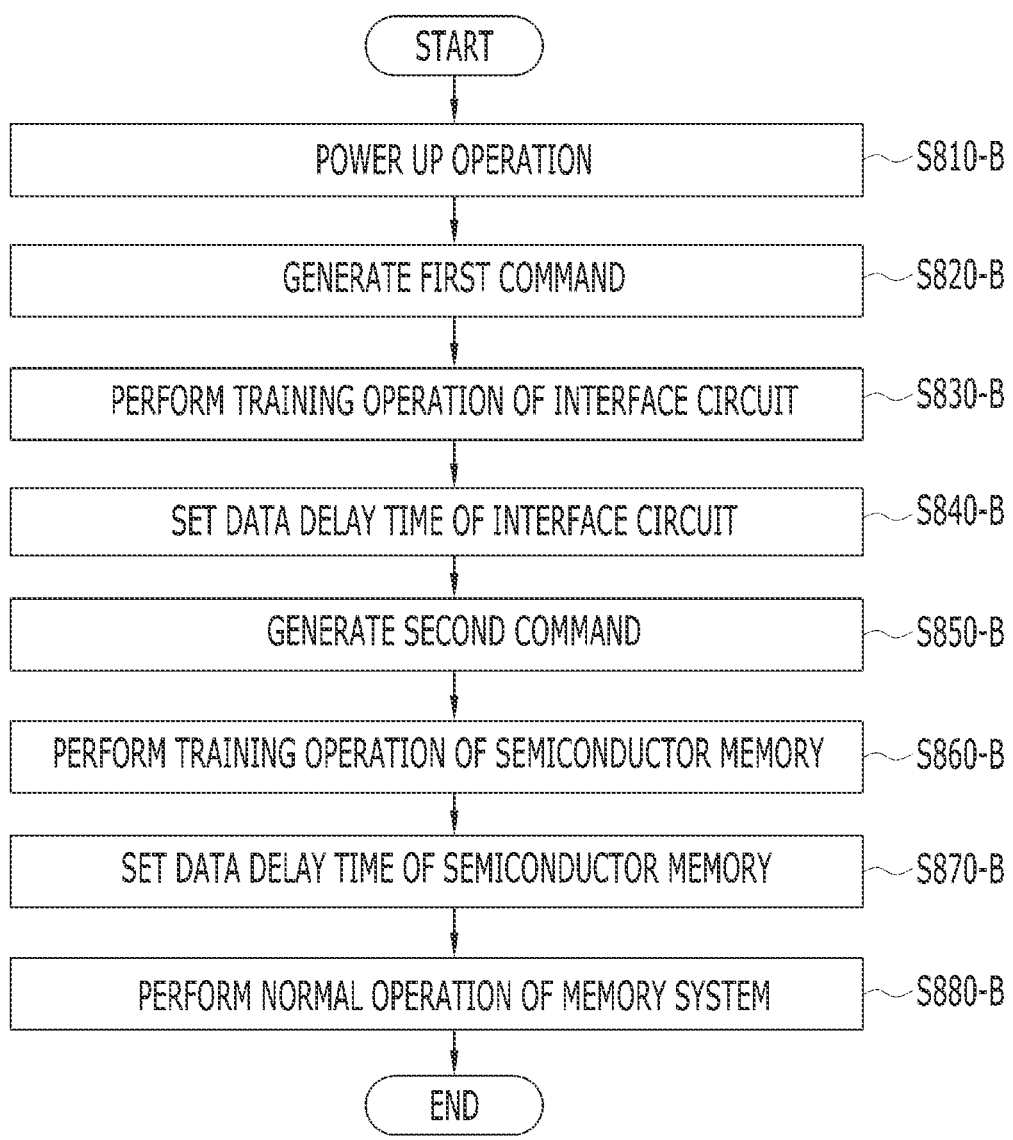
FIG. 45 is a flowchart describing an operation of a memory system according to another embodiment of the present disclosure.

FIG. 45 is a flowchart describing an operation of a memory system according to another embodiment of the present disclosure.

The operation of the memory system according to an embodiment of the present disclosure will be described with reference to FIGS. 42, 43, and 45 as follows.

When a power voltage is applied to the memory system 1000B and a power up operation is performed (S810-B), the controller 1200B generates the first command for instructing the training operation of the interface circuit 400B after the power up operation (S820-B). The first command may comprise the command corresponding to the write training operation of the interface circuit 400B and the command corresponding to the read training operation of the interface circuit 400B. In addition, the first command may include the address corresponding to the interface circuit 400B.

The controller 1200B outputs the first command CMD and the data DATA for the write training operation to the interface circuit 400B of the memory device 1100B. The data DATA for the write training operation may have a specific pattern.

The interface circuit 400B receives the first command CMD and the data DATA and performs the training operation of the interface circuit 400B (S830-B). The training operation of the interface circuit 400B may include the write training operation and the read training operation.

A detailed operation of the interface circuit 400B during the write training operation of the interface circuit 400B will be described as follows.

The external input/output driver 410B receives the first command CMD and the data DATA from the controller 1200B and transmits the first command CMD and the data DATA to the timing control circuit 430B. In addition, the external input/output driver 410B transmits the received command CMD to the processor 420B.

The processor 420B receives the first command CMD from the external input/output driver 410B and parses the received command CMD. As a result of parsing, when the received first command CMD corresponds to the training operation of the interface circuit 400B, the write training signal write_tr is generated and output. The processor 420B activates and outputs the blocking enable signal Block_EN. The processor 420B may compare the address included in the first command CMD with the address stored in the register during the parsing operation to determine whether the received first command CMD corresponds to the semiconductor memory 100B or the interface circuit 400B.

The timing control circuit 430B receives the first command CMD and the data DATA from the external input/output driver 410B, rearranges the timings of the received first command CMD and data DATA, and outputs the rearranged command CMD and data DATA to the blocking circuit 440B. In addition, the timing control circuit 430B outputs the rearranged data DATA to the data storage circuit 470B.

The blocking circuit 440B performs the blocking operation so that the first command CMD and the data DATA received from the timing control circuit 430B are not transmitted to the internal input/output driver 450B in response to the blocking enable signal Block_EN or the blocking disable signal Block_DEN.

The training control circuit 460B generates and outputs the write enable signal write_en for controlling the write operation of the data storage circuit 470B in response to the write training signal write_tr received from the processor 420B. The data storage circuit 470B receives and stores the data output from the timing control circuit 430B in response to the write enable signal write_en.

After the write training operation, the interface circuit 400B performs the read training operation.

A detailed operation of the interface circuit 400B during the read training operation of the interface circuit 400B will be described as follows.

When the write training operation ends, the processor 420B generates and outputs the read training signal write_tr. The processor 420B controls the blocking enable signal Block_EN to maintain the activation state.

The training control circuit 460B generates and outputs the read enable signal read_en for controlling the read operation of the data storage circuit 470B in response to the read training signal read_tr received from the processor 420B. The data storage circuit 470B performs the data read operation in response to the read enable signal read_en and outputs the read data to the timing control circuit 430B.

The timing control circuit 430B rearranges the timing of the data received from the data storage circuit 470B and outputs the data to the external input/output driver 410B, and the external input/output driver 410B outputs the data DATA received from the timing control circuit 430B to the controller 1200B.

When the training operation (S830-B) of the interface circuit 400B described above is finished, the training control circuit 460B determines the amount of mismatch between the timings of the internal clock and the data of the interface circuit 400B during the write training operation to set the delay time of the data DATA received from the external input/output driver 410B during the write operation, and determines the amount of mismatch between the timings of the internal clock and the data of the interface circuit 400B during the read training operation to set the delay time of the data DATA output to the external input/output driver 410B during the read operation (S840-B).

The controller 1200B generates the second command for instructing the training operation of the semiconductor memory 100B (S850-B). The second command may comprise the command corresponding to the write training operation of the semiconductor memory 100B and the command corresponding to the read training operation of the semiconductor memory 100B. In addition, the second command may include the address corresponding to the semiconductor memory 100B.

The controller 1200B outputs the second command CMD and the data DATA for the write training operation to the interface circuit 400B of the memory device 1100B. The data DATA for the write training operation may have a specific pattern.

The interface circuit 400B receives the second command CMD and the data DATA and transmits the second command CMD and the data DATA to the semiconductor memory 100B. The timing control circuit 430B of the interface circuit 400B may delay and output the received data DATA in response to the delay control signal delay_con received from the training control circuit 460B. The delay control signal delay_con may be generated based on the delay time set according to the amount of mismatch between the data DATA and the internal clock obtained as a result of the write training operation of the interface circuit 400B.

The semiconductor memory 100B performs the training operation of the semiconductor memory 100B based on the second command CMD and the data DATA received through the interface circuit 400B (S860-B). The training operation of the semiconductor memory 100B may include the write training operation and the read training operation. The training operation of the semiconductor memory 100B may be performed by the training control circuit 500B included in the semiconductor memory 100B.

The training control circuit 500B sets the delay time of the data received during the write operation of the semiconductor memory 100B and the delay time of the data output during the read operation according to the result of the training operation of the semiconductor memory 100B (S870-B). For example, the training control circuit 500B may determine the amount of mismatch between the timings of data received and programmed during the write training operation of the semiconductor memory 100B and the internal clock of the semiconductor memory 100B to set the delay time during the write operation of the semiconductor memory 100B and may determine the amount of mismatch between the timings of data output to the interface circuit 400B during the read training operation of the semiconductor memory 100B and the internal clock of the semiconductor memory 100B to set the delay time during the read operation of the semiconductor memory 100B.

Thereafter, the normal operation of the memory system 1000B is performed (S880-B).

The host 1300B outputs the host command Host_CMD and the data DATA corresponding to a normal write operation to the controller 1200B during the normal write operation. The controller 1200B generates the command CMD corresponding to the host command Host_CMD and transmits the command CMD corresponding to the host command Host_CMD to the memory device 1100B together with the data DATA.

The interface circuit 400B of the memory device 1100B receives and rearranges the timings of the command CMD and the data DATA, and transmits the rearranged command CMD and data DATA to the semiconductor memory 100B. The timing control circuit 430B of the interface circuit 400B may delay and output the received data DATA in response to the delay control signal delay_con received from the training control circuit 460B during an operation of transmitting the command CMD and the data DATA of the interface circuit 400B. The delay control signal delay_con may be generated based on the delay time set according to the amount of mismatch between the data DATA and the internal dock obtained as a result of the write training operation of the interface circuit 400B. The semiconductor memory 100B may receive the command CMD and the data DATA received through the interface circuit 400 to perform the normal write operation, and may perform the normal write operation by delaying the received data DATA by the delay time set by the training control circuit 500B.

During a normal read operation, the host 1300B outputs the host command Host_CMD corresponding to the normal read operation to the controller 1200B, and the controller 1200B generates the command CMD corresponding to the host command Host_CMD and transmits the command CMD corresponding to the host command Host_CMD to the memory device 1100B.

The interface circuit 400B of the memory device 1100B receives the command CMD and transmits the command CMD to the semiconductor memory 100B, and the semiconductor memory 100B performs the normal read operation in response to the received command CMD.

The semiconductor memory 100B may output the read data DATA to the interface circuit 400B, and may output the read data DATA by delaying the delay time set by the training control circuit 500B.

The interface circuit 400B rearranges the timing of the data DATA received from the semiconductor memory 100B and transmits the rearranged data DATA to the controller 1200B. The timing control circuit 430B of the interface circuit 400B may delay and output the received data DATA in response to the delay control signal delay_con received from the training control circuit 460B during an operation of transmitting the data DATA of the interface circuit 400B. The delay control signal delay_con may be generated based on the delay time set according to the amount of mismatch between the data DATA and the internal clock obtained as a result of the read training operation of the interface circuit 400B.

During the above-described normal operation, for example, the normal write operation and the normal read operation of the semiconductor memory 100B, the blocking circuit 440B of the interface circuit 400B deactivates the blocking operation in response to the blocking disable signal Block_DEN.

As described above, according to an embodiment of the present disclosure, the training operation of the interface circuit 400B may be performed in response to the first command corresponding to the interface circuit 400B, and the training operation of the semiconductor a memory 100B may be performed in response to the second command corresponding to the semiconductor memory 100B. In addition, malfunction of the semiconductor memory 100B may be prevented by blocking transfer of the first command to the semiconductor memory 100B during the training operation of the interface circuit 400B.

In an embodiment of the present disclosure, the training operations of the interface circuit and the semiconductor memory are performed after the power up operation, but the present disclosure is not limited thereto. For example, when the training operation of the interface circuit or the semiconductor memory is requested from the host, the first command or the second command may be generated in response to the host command, and the interface circuit or the semiconductor memory may perform the training operation in response to the first command or the second command.

In addition, in an embodiment of the present disclosure, the delay time of the data is set according to the result of the write training operation and the read training operation during the training operation. However, in order to match the timings of the internal clock and the data, a delay time of the internal clock may be controlled instead of a delay time of the data.

Figure 46:
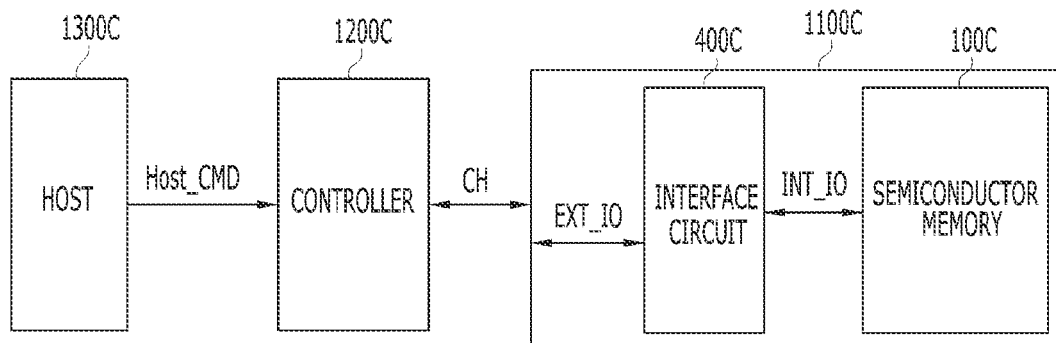
FIG. 46 is a block diagram illustrating a memory system according to an embodiment of the present disclosure.

FIG. 46 is a block diagram illustrating a memory system according to an embodiment of the present disclosure.

Referring to FIG. 46, a memory system 1000C includes a memory device 1100C in which data is stored, a controller 1200C that controls the memory device 1100C under control of a host 1300C.

The host 1300C may communicate with the controller by using an interface protocol, such as a peripheral component interconnect-express (PCI-E), an advanced technology attachment (ATA), a serial ATA (SATA), a parallel ATA (PATA), or a serial attached SCSI (SAS). In addition, the interface protocol between the host 1300C and the controller 1200C is not limited to the above-described example, and alternatively may be one of various other interface protocols such as a universal serial bus (USB), a multi-media card (MMC), an enhanced small disk interface (ESDI), and/or integrated drive electronics (IDE).

The controller 1200C may generally control an operation of the memory system 1000C and control a data exchange between the host 1300C and the memory device 1100C. For example, the controller 1200C may control the memory device 1100C according to a request of the host 1300C to program or read data.

In addition, the controller 1200C may control to perform an initial setting internal operation of an interface circuit 400C included in the memory device 1100C according to the request of the host 1300C. The initial setting internal operation may be performed after a power on operation of the memory system 1000C. The initial setting internal operation may include an on-die termination operation, a ZQ calibration operation, a driving force control operation of an input/output driver included in the interface circuit 400C, or the like.

The controller 1200C may generate a command set for controlling the memory device 1100C and transmit the command set to the memory device 1100C in response to a host command Host_CMD corresponding to the request of the host 1300C. When the controller 1200C generates the command set for controlling the semiconductor memory 100C in the memory device 1100C according to the request of the host 1300C, the controller 1200C generates the command set so that an address corresponding to the semiconductor memory 1000 is included in the command set. In addition, when the controller 1200C generates the command set for controlling the interface circuit 400C in the memory device 1100C according to the request of the host 1300C, the controller 1200C generates the command set so that an address corresponding to the interface circuit 400 is included in the command set.

According to an embodiment, the memory device 1100C may include a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), or a flash memory.

The memory device 1100C may be connected to the controller 1200C through a channel CH and may include the semiconductor memory 100C and the interface circuit 400C. The semiconductor memory 100C may communicate with the controller 1200C through the interface circuit 400C. For example, the interface circuit 400C may mediate command and data communication between the controller 1200C and the semiconductor memory 100C. In addition, the interface circuit 400C may perform retiming on data and a command set exchanged between the controller 1200C and the semiconductor memory 100C. The retiming may include buffering for storing and outputting the data or the command set to be transmitted. When the data or the command set to be transmitted is retimed, an output timing of the data or the command set to be transmitted is rearranged, and skew is reduced. That is, the interface circuit 400C may improve reliability of the memory system 1000C by adjusting the output timing the data and the command set exchanged between the controller 1200C and the semiconductor memory 100C. The interface circuit 400C may be connected to the channel CH through an external input/output line EXT_IO and may be connected to the semiconductor memory 100C through an internal input/output line INT_IO.

In addition, the interface circuit 400C may perform an on-die termination (ODT) operation in response to a specific command set received from the controller 1200C. Since impedance of a semiconductor circuit changes according to process, voltage, and temperature (PVT) change, the semiconductor circuit may improve reliability of transmission operation by matching impedances between the controller 1200C and the interface circuit 400C and between the interface circuit 400C and the semiconductor memory 100C by performing the on-die termination operation. The interface circuit 400C performs the on-die termination operation in response to the specific command set received from the controller 1200C to match the impedance with the semiconductor memory 100C and match the impedance with the controller 1200C. During the initial setting internal operation including the on-die termination operation performed in response to the specific command set, the interface circuit 400C blocks transmission of the specific command set to the semiconductor memory 100C in order to prevent the specific command set from being transmitted to the semiconductor memory 100C and causing the semiconductor memory 100C to malfunction.

Figure 47:
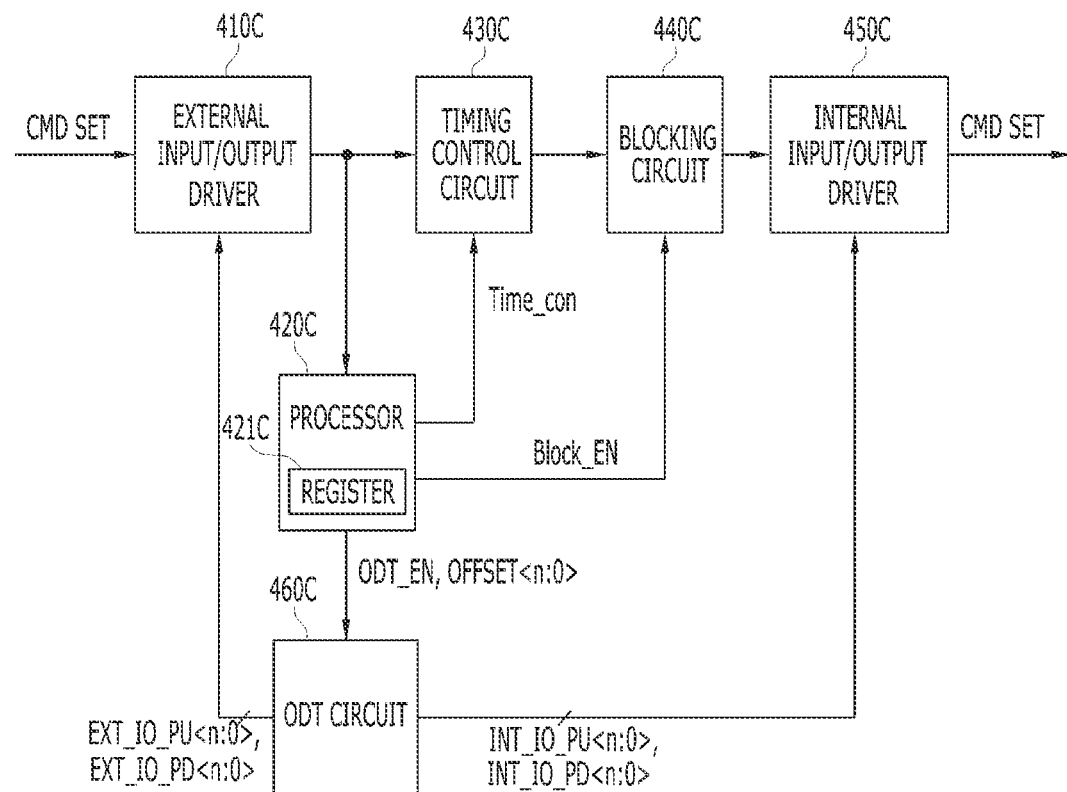
FIG. 47 is a block diagram illustrating a configuration of an interface circuit, such as that of FIG. 46.

FIG. 47 is a block diagram illustrating a configuration of the interface circuit of FIG. 46.

Referring to FIG. 47, the interface circuit 400C may include an external input/output driver 410C, a processor 420C, a timing control circuit 430C, a blocking circuit 440C, an internal input/output driver 450C, and an ODT circuit 460C.

The external input/output driver 410C receives the command set CMD SET from the controller 1200C of FIG. 46 and transmits the command set CMD SET to the processor 420C and the timing control circuit 430C. The external input/output driver 410C may control an impedance of an input/output line connected to the external input/output driver 410C in response to an external input/output pull-up code signal EXT_IO_PU<n:0> and an external input/output pull-down code signal EXT_IO_PD<n:0> output from the ODT circuit 460C. In addition, the external input/output driver 410C may control a driving force (or a drive strength) thereof in response to the external input/output pull-up code signal EXT_IO_PU<n:0> and the external input/output pull-down code signal EXT_IO_PD<n:0> output from the ODT circuit 460C.

The processor 420C receives the command set CMD SET from the external input/output driver 410C and parses the received command set CMD SET. As a result of parsing, when the received command set CMD SET is determined to be transmitted to the semiconductor memory 100C in correspondence with an operation of the semiconductor memory 100C of FIG. 46, the processor 420C generates and outputs a timing control signal Time_con corresponding to the command set CMD SET. In addition, as a result of parsing, when the received command set CMD SET is determined to correspond to an operation of the interface circuit 400C, such as the ODT operation of the interface circuit 400C, the ZQ calibration operation, the driving force control operation of the input/output driver, the processor 420C generates and outputs a blocking enable signal Block_EN, an ODT enable signal ODT_EN, and an offset signal OFFSET<n:0>.

The processor 420C may include a register 421C, and the register 421C may store a plurality of addresses. The plurality of addresses include an address corresponding to the semiconductor memory 100C and an address corresponding to the interface circuit 400C. The processor 420C may compare the address in the command set CMD SET with the address stored in the register 421C during the parsing operation to determine whether the received command set CMD SET corresponds to the semiconductor memory 100C or the interface circuit 400C.

The timing control circuit 430C receives the command set CMD SET from the external input/output driver 410C, controls and rearranges a timing of the received command set CMD SET in response to the tinning control signal Time_con received from the processor 420C, and outputs the rearranged command set CMD SET.

The blocking circuit 440C receives the command set CMD SET output from the timing control circuit 430C and transmits the command set CMD SET to the internal input/output driver 450C. When the blocking circuit 440C receives the blocking enable signal Block_EN from the processor 420C, the blocking circuit 440C blocks a transmission operation so that the command set CMD SET received from the timing control circuit 430C is not transmitted to the internal input/output driver 450C.

The internal input/output driver 450C receives the command set CMD SET through the blocking circuit 440C and transmits the command set CMD SET to the semiconductor memory 100C of FIG. 46. The internal input/output driver 450C may control an impedance of an input/output line connected to the internal input/output driver 450C in response to an internal input/output pull-up code signal INT_IO_PU<n:0> and an internal input/output pull-down code signal INT_IO_PD<n:0> output from the ODT circuit 460C. In addition, the internal input/output driver 450C may control the driving force thereof in response to the internal input/output pull-up code signal and the internal input/output pull-down code signal output from the ODT circuit 460C.

The ODT circuit 460C performs the ZQ calibration operation of generating information on changes in pressure, voltage and/or temperature (PVT) in response to the ODT enable signal ODT_EN received from the processor 420C, and the on-die termination operation of controlling the impedance of the input/output line according to the information generated as a result of the ZQ calibration operation. For example, the ODT circuit 460C performs the ZQ calibration operation in response to the ODT enable signal ODT_EN, generates and outputs the external input/output pull-up code signal EXT_IO_PU<n:0> and the external input/output pull-down code signal EXT_IO_PD<n:0> for controlling the impedance of the input/output line connected to the external input/output driver 410C, and generates and outputs the internal input/output pull-up code signal and the internal input/output pull-down code signal for controlling the impedance of the input/output line connected to the internal input/output driver 450C, according to a result of the ZQ calibration operation. In addition, the ODT circuit 460C may control the driving force of the external input/output driver 410C by controlling code values of the external input/output pull-up code signal EXT_IO_PU<n:0> and the external input/output pull-down code signal EXT_IO_PD<n:0> in response to the offset signal OFFSET<n:0>. In addition, the ODT circuit 460C may control the driving force of the internal input/output driver 450C by controlling code values of the internal input/output pull-up code signal INT_IO_PU<n:0> and the internal input/output pull-down code signal INT_PD<n:0> in response to the offset signal OFFSET<n:0>.

Figure 48:
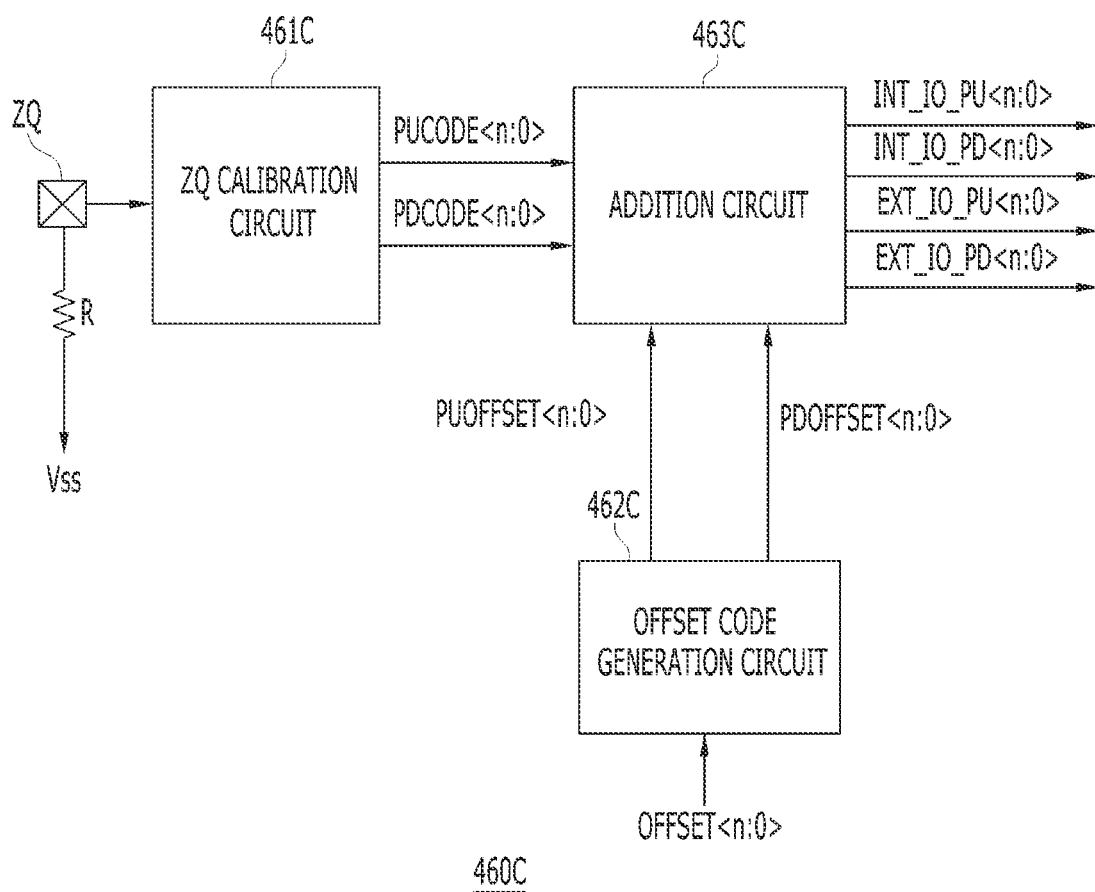
FIG. 48 is a block diagram illustrating a configuration of an ODT circuit, such as that of FIG. 47.

FIG. 48 is a block diagram illustrating a configuration of the ODT circuit of FIG. 47.

Referring to FIG. 48, the ODT circuit 460C may include a ZQ calibration circuit 461C, an offset code generation circuit 462C, and an addition circuit 463C.

The ZQ calibration circuit 461C generates a pull-up code PUCODE<n:0> and a pull-down code PDCODE<n:0>. The ZQ calibration circuit 461C compares a voltage received through a ZQ pad ZQ connected to an external resistor R with a reference voltage, and generates the pull-up code PUCODE<n:0> and the pull-down code PDCODE<n:0> according to a comparison result. The ZQ calibration circuit 461C may change and generate the pull-up code PUCODE<n:0> and the pull-down code PDCODE<n:0> according to the change of the process, voltage, and temperature. That is, the ZQ calibration circuit 461C may generate the pull-up code PUCODE<n:0> and the pull-down code PDCODE<n:0> that change according to a PVT characteristic change.

The offset code generation circuit 462C generates a pull-up offset code PUOFFSET<n:0> and a pull-down offset code PDOFFSET<n:0> in response to the offset signal OFFSET<n:0>. The offset signal OFFSET<n:0> may be changed according to the driving force of the external input/output driver 410C and the internal input/output driver 450C of FIG. 47, which are to be controlled.

The addition circuit 463C adds the pull-up code PUCODE<n:0> with the pull-up offset code PUOFFSET<n:0> to generate the internal input/output pull-up code signal INT_IO_PU<n:0> and the external input/output pull-up code signal EXT_IO_PU<n:0>, and adds pull-down code PDCODE<n:0> with the pull-down offset code PDOFFSET<n:0> to generate and output the internal input/output pull-down code signal and the external input/output pull-down code signal.

Figure 49:
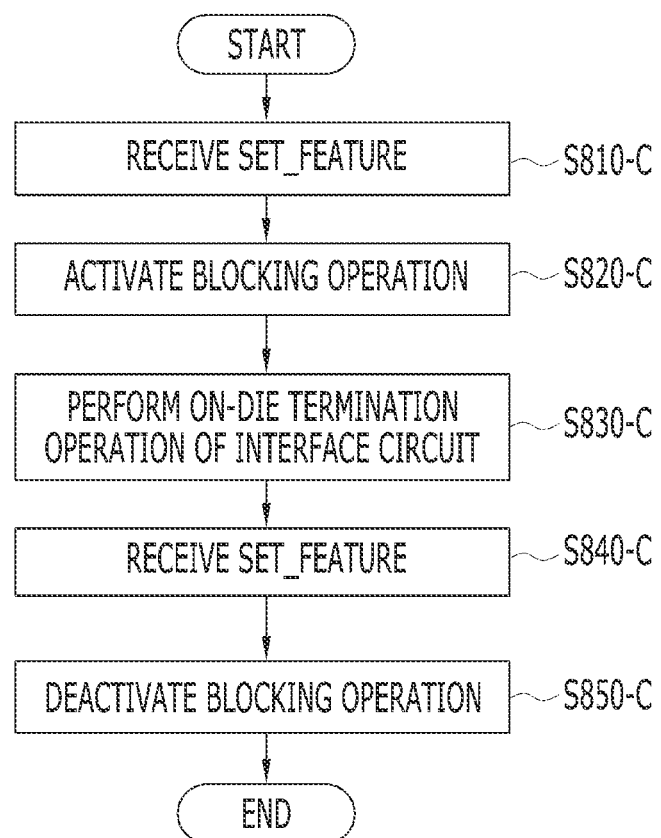
FIG. 49 is a flowchart illustrating a method of operating a memory system according to a first embodiment of the present disclosure.

FIG. 49 is a flowchart illustrating a method of operating a memory system according to an embodiment of the present disclosure.

Figure 50:
FIG. 50 is a diagram illustrating a command configuration according to an embodiment of the present disclosure.

FIG. 50 is a diagram illustrating a configuration of the command set.

Such method of operating a memory system is described with reference to FIGS. 46 to 50 as follows.

In an embodiment of the present disclosure, the on-die termination operation of the interface circuit 400C in the memory device 1100C is performed in response to the request from the host 1300C.

The host 1300C outputs a specific command SET_FEATURE for the internal setting operation of the memory device 1100C as a host command Host_CMD.

The controller 1200C receives the specific command SET_FEATURE from the host 1300C (S810-C), generates a command set corresponding to the received specific command SET_FEATURE, and outputs the generated command set to the memory device 1100C.

The command set may include the command CMD corresponding to the on-die termination operation, the address ADD corresponding to the interface circuit 400C, and the data DATA corresponding to a detailed set value of the on-die termination operation, as shown in FIG. 50. For example, the address ADD in the command set corresponding to the internal operation of the semiconductor memory 100C corresponds to the semiconductor memory 100C, and the address ADD in the command set corresponding to the internal operation of the interface circuit 400C, such as the on-die termination operation, the Zip calibration operation, or the driving force control operation of the input/output driver corresponds to the interface circuit 400C.

The interface circuit 400C of the memory device 1100C receives the command set from the controller 1200C and performs the operation of blocking the command set from being transmitted to the semiconductor memory 100C in response to the received command set (S820-C).

More specifically, the processor 420C of the interface circuit 400C parses the command set CMD SET received through the external input/output driver 410C, and when the parsing indicates that the address ADD in the command set CMD SET corresponds to the interface circuit 400C, the processor 420C generates and outputs the blocking enable signal Block_EN. The blocking circuit 440C is activated in response to the blocking enable signal Block_EN to perform the blocking operation of blocking the transmission of the command set CMD SET from the timing control circuit 430C to the internal input/output driver 4500. Therefore, transmission of the command set CMD SET to the semiconductor memory 100C during the on-die termination operation of the interface circuit 400C may be prevented.

The processor 420C generates and outputs the ODT enable signal ODT_EN and the offset signal OFFSET<n:0> according to a result of the parsing of the command set CMD SET. The ODT circuit 460C performs the on-die termination operation of controlling the impedance of the input/output line in response to the ODT enable signal ODT_EN received from the processor 420C (S830-C). During the on-die termination operation, the ZQ calibration operation may be performed to generate the information on PVT change, and the impedance of the input/output line may be controlled according to the generated information. In addition, the ODT circuit 460C may control the driving force of the external input/output driver 410C and the internal input/output driver 450C in response to the offset signal OFFSET<n:0> during the on-die termination operation.

Thereafter, the host 1300C outputs the specific command SET_FEATURE for ending the internal setting operation of the memory device 1100C as the host command Host_CMD.

The controller 1200C receives the specific command SET_FEATURE from the host 1300C (S840-C), generates the command set corresponding to the received specific command SET_FEATURE, and outputs the generated command set to the memory device 1100C.

The interface circuit 400C of the memory device 11000 receives the command set from the controller 1200C and deactivates the blocking operation in response to the received command set (S850-C).

As described above, according to an embodiment of the present disclosure, when the command set corresponding to the on-die termination operation of the interface circuit 400C is received by the interface circuit 400C, the interface circuit 400C performs the on-die termination operation in response to the command set after blocking the transmission of the command set to the semiconductor memory 100C. Therefore, malfunctioning of the semiconductor memory 100C may be prevented.

Figure 51:
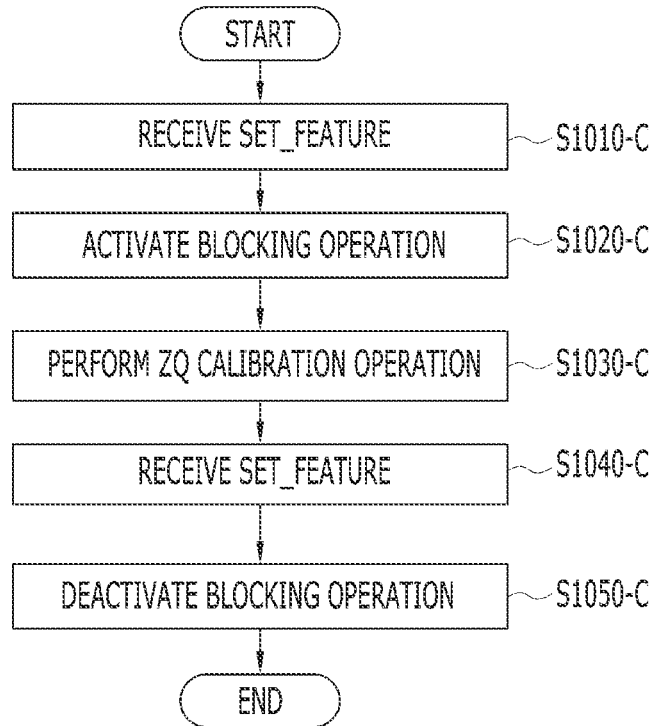
FIG. 51 is a flowchart illustrating a method of operating a memory system according to a second embodiment of the present disclosure.

FIG. 51 is a flowchart illustrating a method of operating a memory system according to another embodiment of the present disclosure.

Such method of operating a memory system is described with reference to FIGS. 46 to 48, 50, and 51 as follows.

In another embodiment of the present disclosure, the ZQ calibration operation of the interface circuit 400C in the memory device 1100C is performed in response to the request from the host 1300C.

The host 1300C outputs the specific command SET_FEATURE for the internal setting operation of the memory device 11000 as the host command Host CID.

The controller 1200C receives the specific command SET_FEATURE from the host 1300C (S1010-C), generates the command set corresponding to the received specific command SET_FEATURE, and outputs the generated command set to the memory device 1100C.

The command set may include the command CMD corresponding to the ZQ calibration operation, the address ADD corresponding to the interface circuit 400C, and the data DATA corresponding to a detailed set value of the ZQ calibration operation, as shown in FIG. 50. For example, the address ADD in the command set corresponding to the internal operation of the semiconductor memory 100C corresponds to the semiconductor memory 100C, and the address ADD in the command set corresponding to the internal operation of the interface circuit 400C, such as the on-die termination operation, the ZQ calibration operation, or the driving force control operation of the input/output driver corresponds to the interface circuit 400C.

The interface circuit 400C of the memory device 1100C receives the command set from the controller 1200C and performs the blocking operation of blocking the command set from being transmitted to the semiconductor memory 100C in response to the received command set (S1020-C).

More specifically, the processor 420C of the interface circuit 400C parses the command set CMD SET received through the external input/output driver 410C, and when the parsing indicates that the address ADD in the command set CMD SET corresponds to the interface circuit 400C, the processor 420C generates and outputs the blocking enable signal Block_EN. The blocking circuit 440C is activated in response to the blocking enable signal Block_EN to block the transmission of the command set CMD SET from the timing control circuit 430C to the internal input/output driver 450C. Therefore, the transmission of the command set CMD SET to the semiconductor memory 1000 during the ZQ calibration operation of the interface circuit 400 may be prevented.

The processor 420C generates and outputs the ODT enable signal ODT_EN according to a result of the parsing of the command set CMD SET. The ZQ calibration circuit 461C of the ODT circuit 460C performs the ZQ calibration operation to generate the pull-up code PUCODE<n:0> and the pull-down code PDCODE<n:0> changed according to the PVT characteristic (S1030-C). In an embodiment of the present disclosure, reliability of the data transmission operation may be improved by controlling a pull-up operation and a pull-down operation of the external input/output driver 410C and the internal input/output driver 450C based on the pull-up code PUCODE<n:0> and the pull-down code PDCODE<n:0> generated as a result of the ZQ calibration operation.

Thereafter, the host 1300C outputs the specific command SET_FEATURE for ending the internal setting operation of the memory device 1100C as the host command Host_CMD.

The controller 1200C receives the specific command SET_FEATURE from the host 1300C (S1040-C), generates the command set corresponding to the received specific command SET_FEATURE, and outputs the generated command set to the memory device 1100C.

The interface circuit 400C of the memory device 1100C receives the command set from the controller 1200C and deactivates the blocking operation in response to the received command set (S1050-C).

As described above, according to an embodiment of the present disclosure, when the command set corresponding to the ZQ calibration operation of the interface circuit 400C is received by the interface circuit 400C, the interface circuit 400C performs the ZQ calibration operation in response to the command set after blocking the transmission of the command set to the semiconductor memory 100C. Therefore, malfunctioning of the semiconductor memory 100C may be prevented.

Figure 52:
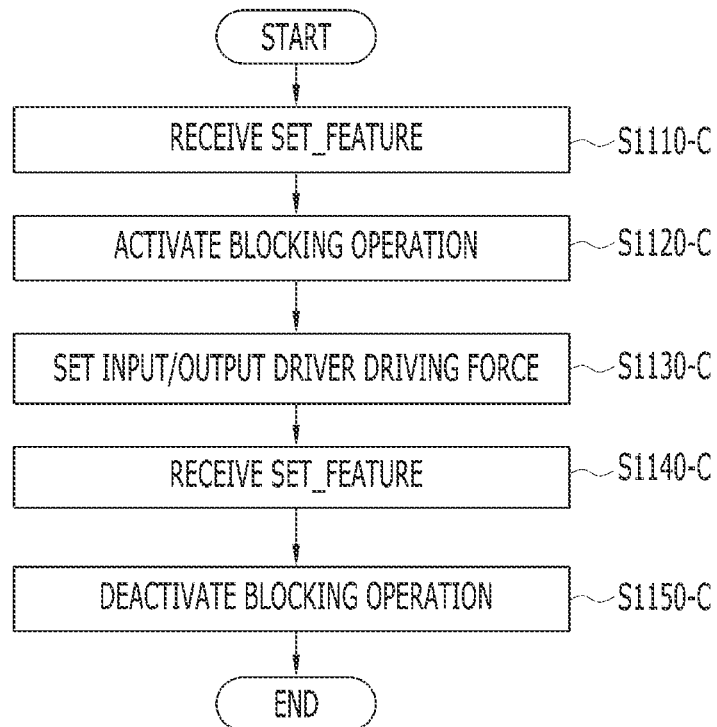
FIG. 52 is a flowchart illustrating a method of operating a memory system according to a third embodiment of the present disclosure.

FIG. 52 is a flowchart illustrating a method of operating a memory system according to another embodiment of the present disclosure.

Such method of operating a memory system is described with reference to FIGS. 46 to 48, 50, and 52 as follows.

In another embodiment of the present disclosure, the driving force control operation of the interface circuit 400C in the memory device 1100C is performed in response to the request from the host 1300C.

The host 1300C outputs the specific command SET_FEATURE for the internal setting operation of the memory device 1100C as the host command Host_CMD.

The controller 1200C receives the specific command SET_FEATURE from the host 1300C (S1010-C), generates the command set corresponding to the received specific command SET_FEATURE, and outputs the generated command set to the memory device 1100C.

The command set may include the command CMD corresponding to the driving force control operation, the address ADD corresponding to the interface circuit 400C, and the data DATA corresponding to a detailed set value of the driving force control operation, as shown in FIG. 50. For example, the address ADD in the command set corresponding to the internal operation of the semiconductor memory 100C corresponds to the semiconductor memory 100C, and the address ADD in the command set corresponding to the internal operation of the interface circuit 400C, such as the on-die termination operation, the ZQ calibration operation, or the driving force control operation of the input/output driver corresponds to the interface circuit 400C.

The interface circuit 400C of the memory device 1100C receives the command set from the controller 1200C and performs the operation of blocking the command set from being transmitted to the semiconductor memory 1000 in response to the received command set (S1120-C).

More specifically, the processor 420C of the interface circuit 400C parses the command set CMD SET received through the external input/output driver 410C, and when the parsing indicates that the address ADD in the command set CMD SET corresponds to the interface circuit 400C, the processor 420C generates and outputs the blocking enable signal Block_EN. The blocking circuit 440C is activated in response to the blocking enable signal Block_EN to block the transmission of the command set CMD SET from the timing control circuit 430C to the internal input/output driver 450C. Therefore, transmission of the command set CMD SET to the semiconductor memory 100C during the driving force control operation of the input/output driver of the interface circuit 400 may be prevented.

The processor 420C generates and outputs the ODT enable signal ODT_EN and the offset signal OFFSET<n:0> according to a result of the parsing of the command set CMD SET. The offset signal OFFSET<n:0> is generated based on the data DATA in the command set CMD SET.

The offset code generation circuit 462C of the ODT circuit 460C outputs the pull-up offset code PUOFFSET<n:0> and the pull-down offset code PDOFFSET<n:0> in response to the offset signal OFFSET<n:0>. The addition circuit 463C generates the internal input/output pull-up code signal INT_IO_PU<n:0>, the internal input/output pull-down code single INT_IO_PD<n:0>, the external input/output pull-up code signal EXT_IO_PU<n:0>, and the external input/output pull-down code single EXT_IO_PD<n:0> in response to the pull-up offset code PUOFFSET n:0> and the pull-down offset code PDOFFSET<n:0>, and sets the driving force of the input/output driver (S1130-C). For example, the driving force of the external input/output driver 410C during a data input/output operation is controlled in response to the external input/output pull-up code signal EXT_IO_PU<n:0> and the external input/output pull-down code single EXT_IO_PD<n:0>, and the driving force of the internal input/output driver 450C during the data input/output operation is controlled in response to the internal input/output pull-up code signal INT_IO_PU<n:0> and the internal input/output pull-down code single INT_IO_PD<n:0>.

Thereafter, the host 1300C outputs the specific command SET_FEATURE for ending the internal setting operation of the memory device 1100C as the host command Host_CMD.

The controller 1200C receives the specific command SET_FEATURE from the host 1300C (S1140-C), generates the command set corresponding to the received specific command SET_FEATURE, and outputs the generated command set to the memory device 1100C.

The interface circuit 400C of the memory device 1100C receives the command set from the controller 1200C and deactivates the blocking operation in response to the received command set (S1150-C).

As described above, according to an embodiment of the present disclosure, when the command set corresponding to the driving force control operation of the input/output driver of the interface circuit 400C is received by the interface circuit 400C, the interface circuit 400C performs the driving force control operation of the input/output driver in response to the command set after blocking the transmission of the command set to the semiconductor memory 100C. Therefore, malfunctioning of the semiconductor memory 100C may be prevented.

Figure 53:
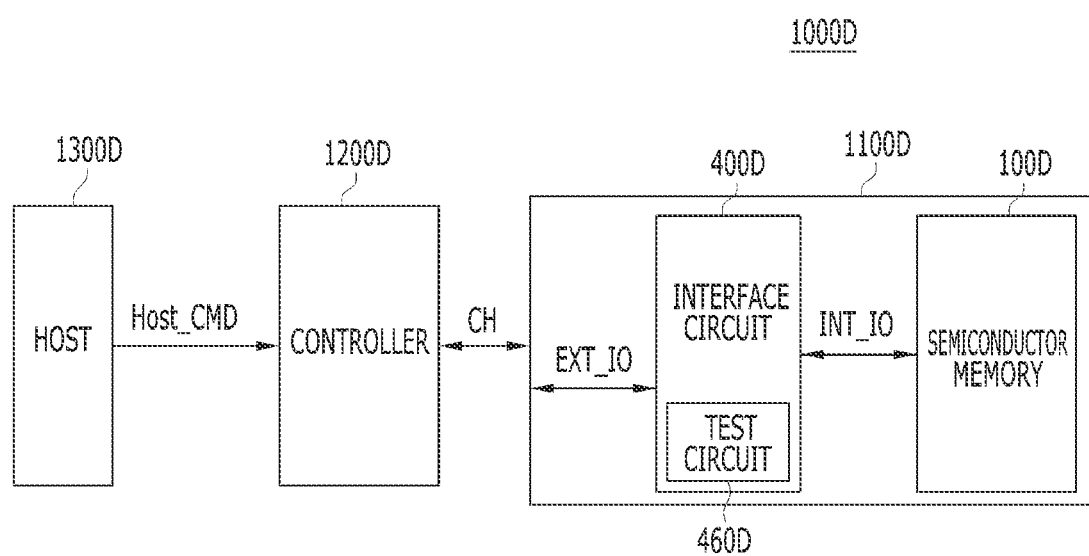
FIG. 53 is a block diagram describing a memory system according to an embodiment of the present disclosure.

FIG. 53 is a block diagram describing a memory system according to an embodiment of the present disclosure.

Referring to FIG. 53, a memory system 1000D includes a memory device 1100D in which data is stored, and a controller 1200D that controls the memory device 1100D, which is turn under the control of a host 1300D.

The host 1300D may communicate with the controller 1200D by using an interface protocol such as a peripheral component interconnect-express (PCI-E), an advanced technology attachment (ATA), a serial ATA (SATA), a parallel ATA (DATA), or a serial attached SCSI (SAS). In addition, the interface protocol between the host 1300D and the controller 1200D is not limited to the above-described examples, and alternatively may be one of various other interface protocols such as a universal serial bus (USB), a multi-media card (MMC), an enhanced small disk interface (ESDI), and integrated drive electronics (IDE).

The controller 1200D may generally control an operation of the memory system 1000D and control a data exchange between the host 1300D and the memory device 1100D. For example, the controller 1200D may control the memory device 1100D to program or read data according to a request of the host 1300D. In addition, the controller 1200D may generate commands relating to a test operation and transmit the commands to the memory device 1100D during the test operation of the memory device 1100D.

The memory device 1100D may be connected to the controller 1200D through a channel CH, and may include a semiconductor memory 100D and an interface circuit 400D. The semiconductor memory 100D may communicate with the controller 1200D through the interface circuit 400D. For example, the interface circuit 400D may mediate command and data communication between the controller 1200D and the semiconductor memory 100D. In addition, the interface circuit 400D may perform an operation of adjusting and rearranging a timing of the data exchanged between the controller 1200D and the semiconductor memory 100D. The interface circuit 400D may rearrange the data exchanged between the controller 1200D and the semiconductor memory 100D to reduce any skew of transmitted data and to improve reliability. The interface circuit 400D may be connected to the channel CH through an external input/output line EXT_IO, and may be connected to the semiconductor memory 100D through an internal input/output line INT_IO.

In addition, the interface circuit 400D may include a test circuit 460D and may perform a test operation of the interface circuit 400D in response to a test command received from the controller 1200D. In a test operation, the interface circuit 400D blocks transmission of the test command to the semiconductor memory 100D in order to prevent the test command from being transmitted to the semiconductor memory 100D and causing the semiconductor memory 100D to malfunction.

In another embodiment, the interface circuit 400D may receive a test command and test signals from an external test device (not shown) during the test operation. A test pin may be electrically connected to the external input/output line EXT_IO of the interface circuit 400D.

During a test operation of the interface circuit 400D, the interface circuit 400D may receive the test command and the test signals through the test pin, and output signals according to a test result through the test pin. To this end, the memory device 1100D may include a test pin PIN of the interface circuit 400D. The test pin of the interface circuit 400D will be described in detail later with reference to FIG. 56.

According to an embodiment, the memory device 1100D may include a double data rate synchronous dynamic random access memory (DDR SDRAM), a low power double data rate4 (LPDDR4) SDRAM, a graphics double data rate (DDDR) SDRAM, a low power DDR (LPDDR), a Rambus dynamic random access memory (RDRAM), or a flash memory.

Figure 54:
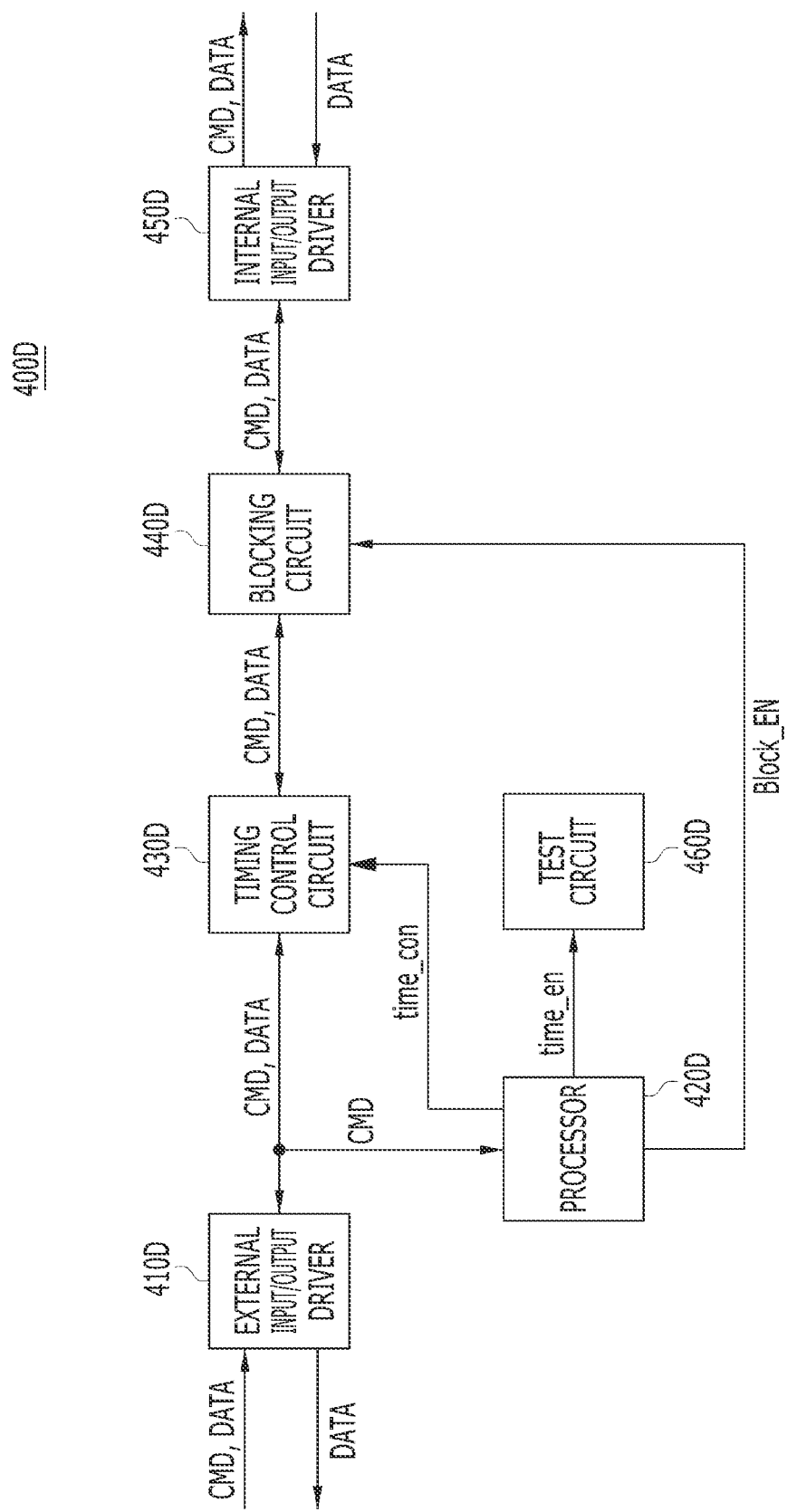
FIG. 54 is a block diagram describing a configuration of an interface circuit of FIG. 53 according to an embodiment of the present disclosure.

FIG. 54 is a block diagram describing a configuration of the interface circuit of FIG. 53 according to an embodiment of the disclosure.

Referring to FIG. 54, the interface circuit 400D may include an external input/output driver 410D, a processor 420D, a timing control circuit 430D, a blocking circuit 440D, an internal input/output driver 450D, and a test circuit 460D.

The external input/output driver 410D receives a command CMD and data DATA from the controller 1200D of FIG. 54 during a write operation and transmits the command CMD and the data DATA to the timing control circuit 430D. In addition, the external input/output driver 410D transmits the received command CMD to the processor 420D.

In addition, the external input/output driver 410D receives the data DATA from the timing control circuit 430D during a read operation and transmits the data DATA to the controller 1200D of FIG. 53.

During the test operation of the interface circuit 400D, the interface circuit 400D may receive the command CMD and the data DATA through the test pin (not illustrated in FIG. 54) and output the data DATA according to the test result to an external test device through the test pin.

In an embodiment, the processor 420D receives a command CMD from the external input/output driver 410D and parses the received command CMD. As a result of parsing, if the received command CMD is a command CMD to be transmitted to the semiconductor memory 100D for an internal operation of the semiconductor memory 100D of FIG. 53, then the processor 420D deactivates and outputs a blocking enable signal Block_EN. In another embodiment, as a result of parsing, if the received command CMD corresponds to a command for a test operation of the interface circuit 400D, then a test enable signal test_en is generated and output, and the blocking enable signal Block_EN is activated and output.

The processor 420D may include a register (not shown), and a plurality of addresses may be stored in the register. The plurality of addresses includes an address corresponding to the semiconductor memory 100D and an address corresponding to the interface circuit 400D. The processor 420D may compare an address included in the command CMD and an address stored in the register during the parsing operation to determine whether the received command CMD refers to an operation involving the semiconductor memory 100D or testing of the interface circuit 400D.

With respect to operations involving semiconductor memory 100D, during a write operation, the timing control circuit 430D receives the command CMD and the data DATA from the external input and output driver 410D, rearranges or process the command CMD and the data DATA, and outputs the rearranged or processed command CMD and data DATA to the blocking circuit 440D. During a read operation, the timing control circuit 430D outputs the data DATA received from the blocking circuit 440D to the external input/output driver 410D. The timing control circuit 430D adjusts and rearranges a timing of the received data DATA, in response to a timing control signal time_con output from the processor 420D, and outputs the rearranged data DATA to the external input/output driver 410D.

Similarly, the blocking circuit 440D transmits the command CMD and data DATA received from the timing control circuit 430D to the internal input/output driver 450D in a write operation, and transmits the data DATA received from the internal input/output driver 450D to the timing control circuit 430D in a read operation. Furthermore, the blocking circuit 440D performs a block operation in response to the blocking enable signal Block_EN activated during a test operation of the interface circuit 400D so that the command CMD and the data DATA received from the timing control circuit 430D are not transmitted to the internal input/output driver 450D. That is, the blocking circuit 440D blocks signals transmitted between the interface circuit 400D and the semiconductor memory 100D during a test operation.

The internal input/output driver 450D receives the command CMD and the data DATA through the blocking circuit 440D and transmits the command CMD and the data DATA to the semiconductor memory 100D of FIG. 53 in a write operation, or transmits the data DATA received from the semiconductor memory 100D to the blocking circuit 440D in a read operation.

The test circuit 460D may perform a test of the interface circuit 400D in response to the test enable signal test_en received from the processor 420D during a test operation of the interface circuit 400D, and may output the data according to the test operation result through the test pin (not shown).

FIG. 55 is a diagram illustrating packaging ball mapping of a packaged memory device.

Referring to FIG. 55, a packaged memory device has ball mapping in a matrix structure. A plurality of data input/output pins are disposed in a center region of the ball mapping of the matrix structure and are externally connected (for example, connected through a border or boundary structure) through a ball out process. A corner region of the ball mapping may be vulnerable to external influences such as temperature, process damage, and the like, and thus non-connecting pins NC that are not substantially used may be disposed in the corner regions of the ball mapping. In addition, some of the pins in the center region may also be non-connecting pins NC.

In an example of a packaged memory device, a plurality of data input/output pins that are used for all operations of the packaged memory device are disposed only in the central region of the ball mapping, that is, the plurality of data input/output pins are used for transmission of signals and data during an operation of the memory device. There is no test pin utilized for the testing of the interface circuit included in this example of a packaged memory device.

FIG. 56 is a diagram illustrating packaging ball mapping of a memory device according to an embodiment of the present disclosure.

Referring to FIG. 56, a packaged memory device has a ball mapping in a matrix structure. In a central region of a packaging ball mapping of a matrix structure, denoted NAND_PKG_BALL in FIG. 8, a plurality of input/output pins connected to the semiconductor memory 100D of FIG. 53 of memory device 1100D are disposed. The plurality of data pins may include a plurality of power pins VCCQ, VCC, VSS, VPP, and VREF_1, a plurality of data pins DQ0_1 to DQ7_1, and a plurality of control signal pins DQS_1_T, DQS_1_C, RE_1_T, WE_1_N, ALE_1, CLE_1_N CE0_1_N to CE3_1_N, R/B_0_N to R/B_3_N, ZQ_0_N, ZQ_1_N, WP_0_N, and the like. The plurality of input/output pins may be bonded to an outer or external border or structure through a ball out process. During normal operation of an interface circuit and a semiconductor memory included in a memory device, the plurality of input/output pins receive power and a signal from an external source through a border or structure, or transmit signals output from the interface circuit and the semiconductor memory through a border or structure, for example, signals received or transmitted, from or to the controller.

In addition, in the memory device, the non-connecting pins NC are disposed in each of corner regions EDGE_A, EDGE_B, EDGE_C, and EDGE_D of the packaging ball mapping region of the matrix structure.

In addition, in the memory device, certain remaining vacant regions outside of the region NAND_PKG_BALL and each of the corner regions EDGE_A, EDGE_B, EDGE_C, and EDGE_D are defined as interface circuit test pin regions Interface_test_PIN_A and Interface_test_PIN_B. In these regions, test pins VQPS_1, ANA_ITO_1, VDDI_1, VDD_CORE_1, VDD_CORE_0, VSSI_0, ANA_ITO_0, and VQPS_0 used in the testing of the interface circuit are disposed, as shown in FIG. 56 in the interface circuit test pin regions Interface_test_PIN_A and Interface_test_PIN_B.

The interface circuit test pin regions Interface_test_PIN_A and Interface_test_PIN_B may be disposed on at the sides of region NAND_PKG_BALL as shown in FIG. 56, however, the locations of Interface_test_PIN_A and Interface_test_PIN_B in the packaging ball mapping are not limited thereto. For example, Interface_test_PIN_A and Interface_test_PIN_B may be disposed at unused upper and lower positions relative to region NAND_PKG_BALL.

The test pins VQPS_1, ANA_ITO_1, VDDI_1, VDD_CORE_1, VDD_CORE_0, VDDI_0, ANA_ITO_0, and VQPS_0 for the testing of an interface circuit may not perform a ball out process and thus are not bonded to the outer border. The test pins may be disposed in a form of a pin to be exposed to the outside of the packaged memory device, and may be connected to an external test device through a probe during the test operation.

According to an embodiment of the present disclosure, in the memory device, some of the remaining blank regions outside of region NAND_PKG_BALL and each of the corner regions EDGE_A, EDGE_B, EDGE_C, and EDGE_D of the packaging ball mapping region of the matrix structure are defined as interface circuit test pin regions Interface_test_PIN_A and Interface_test_PIN_B, and the test pins of the interface circuit are disposed in the interface circuit test pin regions Interface_test_PIN_A and Interface_test_PIN_B. Therefore, testing of the interface circuit may be easily performed.

In embodiments of the present disclosure, the test pins P IN are included in the packaging ball mapping for the testing of the interface circuit. Embodiments of the present disclosure are not, however, limited thereto, and a pad that is exposed to the outside of the packaged memory device may be used instead of the pin.

Figure 57:
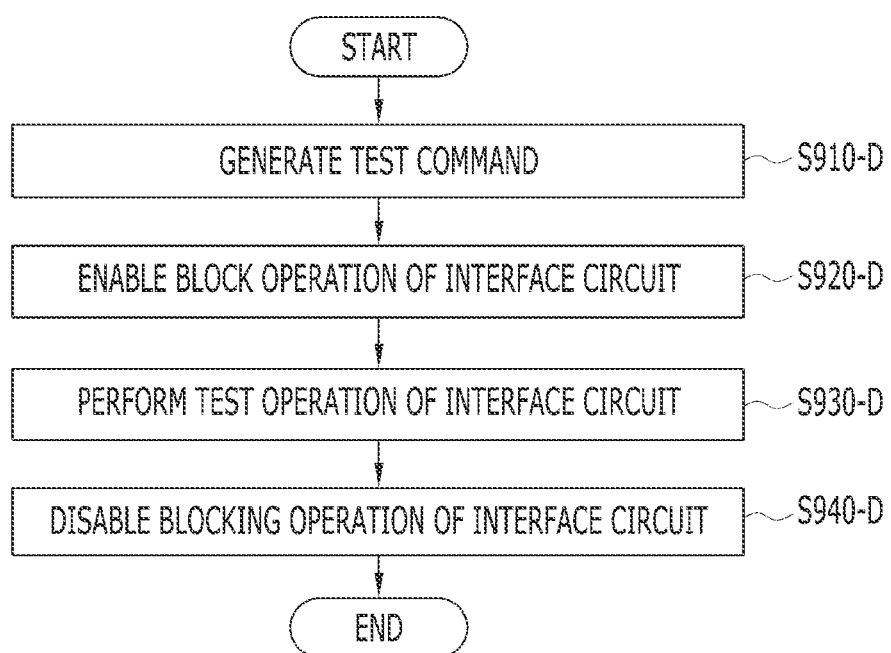
FIG. 57 is a flowchart illustrating a test operation of a memory device according to an embodiment of the present disclosure.

FIG. 57 is a flowchart illustrating a test operation of a memory device according to an embodiment of the present disclosure.

The test operation of the memory device will be described with reference to FIGS. 53, 54, and 57 as follows.

The controller 1200D generates and outputs a test command CMD for a test operation of the interface circuit 400D of memory device 1100D (S910-D). The command CMD may include an address, and the address may be an address corresponding to the interface circuit 400D.

The interface circuit 400D of the memory device 1100D receives the test command CMD from the controller 1200D and enables a blocking operation in response to the test command CMD (S920-D).

The blocking operation of the interface circuit 400D is described as follows.

The external input/output driver 410D receives the test command CMD from the controller 1200D and transmits the test command CMD to the processor 420D. The processor 420D receives the test command CMD from the external input/output driver 410D and parses the received test command CMD. When the parsed received test command CMD corresponds to the test operation of the interface circuit 400D, the test enable signal test_en and the blocking enable signal Block_EN are generated and output. The blocking circuit 440D performs the blocking operation in response to the blocking enable signal Block_EN so that the test command CMD received from the timing control circuit 430D is not transmitted to the internal input/output driver 450D.

The test circuit 460D of the interface circuit 400D performs the test operation in response to the test enable signal test_en (S930-D). During the test operation, the test circuit 460D may receive signals for the test operation using the test pins for the testing of the interface circuit, and output the signals generated as a result of the test operation to the outside through the test pins.

After the test operation is completed, the processor 420D disables the blocking enable signal Block_EN to disable the blocking operation (S940-D).

As described above, in embodiments of the present disclosure, during the test operation of the interface circuit 400D, the blocking operation is performed to prevent the test command from being transmitted from the interface circuit 400D to the semiconductor memory 100D. Therefore, during the test operation of the interface circuit 400D, malfunction of the semiconductor memory 100D after receiving the test command may be prevented.

FIG. 58 is a diagram illustrating packaging ball mapping of the memory device 1100D according to an embodiment of the present disclosure.

Referring to FIG. 58, a packaged memory device has a ball mapping in a matrix structure. In a center region (NAND_PKG_BALL) of a packaging ball mapping of the matrix structure, a plurality of input/output pins, connected to the semiconductor memory 100D of FIG. 53 included in the memory device, are disposed. The plurality of data pins may include a plurality of power pins VCCQ, VCC, VSS, VPP, and VREF_1, a plurality of data pins DQ0_1 to DQ7_1, and a plurality of control signal pins DQS_1_T, DQS_1_C, RE_1_T, WE_1_N, ALE_1, CLE_1, CE0_1_N to CE3_1_N, R/B_0_N to R/B_3_N, ZQ_0_N, ZQ_1_N, WP_0_N, and the like. The plurality of input/output pins may be bonded to or through an outer border through a ball out process.

In addition, in the memory device, non-connecting pins NC are disposed in each of corner regions EDGE_A, EDGE_B, EDGE_C, and EDGE_D of the packaging ball mapping region of the matrix structure.

In addition, in the memory device, some remaining vacant regions except for the centered region NAND_PKG_BALL and each of the corner regions EDGE_A, EDGE_B, EDGE_C, and EDGE_D are defined as interface circuit test pin regions Interface_test_PIN_A and Interface_test_PIN_B. Test pins VQPS_1, ANA_ITO_1, VDDI_1, VDD_CORE_1, VDD_CORE_0, VDDI_0, ANA_ITO_0, and VQPS_0 for testing the interface circuit are disposed in the interface circuit test pin regions Interface_test_PIN_A and Interface_test_PIN_B.

The interface circuit test pin regions Interface_test_PIN_A and Interface_test_PIN_B may be disposed on both sides of the center region NAND_PKG_BALL as shown in FIG. 58; however, the regions are not limited to the sides of the center region and instead may be disposed at upper and lower positions relative to region NAND_PKG_BALL.

The test pins VQPS_1, ANA_ITO_1, VDDI_1, VDD_CORE_1, VDD_CORE_0, VDDI_0, ANA_ITO_0, and VQPS_0 for the test of the interface circuit, which a may not perform a ball out process, may be disposed in a pin state, and may be connected to an external test device through a probe during the test operation.

In some embodiments, a test pin TEST_PIN for testing a multi-channel operation of the interface circuit is disposed, and the test pin TEST_PIN utilizes some of the non-connecting pins NC disposed in the each of the corner regions EDGE_A, EDGE_B, EDGE_C, and EDGE_D and some of the non-connecting pins NC disposed in the center region NAND_PKG_BALL. For example, a pin corresponding to C4 in the corner region EDGE_A is utilized as a CE_MUX pin (CE_MUX) and pins corresponding to C10 and C11 in the corner region EDGE_B are utilized as a CE4_1_N pin (CE4_1_N) and a CE6_1_N pin (CE6_1_N). In addition, pins corresponding to H6, H11, K3, and K11 in the center region NAND_PKG_BALL are utilized as CE5_0_N pin (CE5_0_N), CE7_1_N pin (CE7_1_N), CE7_0_N pin (CE7_0_N), and CE5_1_N pin (CE5_1_N). The test pins (TEST_PIN) are preferably disposed adjacent to the center region NAND_PKG_BALL in each of the corner regions EDGE_A, EDGE_B, EDGE_C, and EDGE_D. In addition, pins corresponding to R3 and R4 in the corner region EDGE_C are utilized as CE_0_N pin (CE_0_N) and CE4_0_N pin (CE4_0_N).

Thus, as described above, some of the non-connecting pins of the edge regions or the center region may be utilized as the test pins for test operations of the interface circuit.

FIG. 59 is a diagram illustrating packaging ball mapping of a memory device 1100D according to an embodiment of the disclosure.

Referring to FIG. 59, the packaged memory device has a ball mapping of a matrix structure. In a centered region NAND_PKG_BALL of a packaging ball mapping in a matrix structure, a plurality of input/output pins, connected to the semiconductor memory 100D of FIG. 53 included in the memory device, are disposed. The plurality of data pins may include a plurality of power pins VCCQ, VCC, VSS, VPP, and VREF_1, a plurality of data pins DQ0_1 to DQ7_1, and a plurality of control signal pins DQS_1_T, DQS_1_C, RE_1_T, WE_1_N, ALE_1, CLE_1, CE0_1_N to CE3_1_N, R/B_0_N to R/B_3_N, ZQ_0_N, ZQ_1_N, WP_0_N, and the like. The plurality of input/output pins that are bonded to or through an outer border through a ball out process.

In addition, in the memory device, the non-connecting pins NC are disposed in each of corner regions EDGE_A, EDGE_B, EDGE_C, and EDGE_D of the packaging ball mapping region of the matrix structure.

In addition, in the memory device, some remaining vacant regions outside of region NAND_PKG_ALL and the edge regions EDGE_A, EDGE_B, EDGE_C and EDGE_D are defined as the interface circuit test pin regions Interface_test_PIN_A and Interface_test_PIN_B, and NAND test pin regions Nand_test_PIN_A and Nand_test_PIN_B. In addition, the test pins VQPS_1, ANA_ITO_1, VDDI_1, VDD_CORE_1, VDD_CORE_0, VDDI_0, ANA_ITO_0, and VQPS_0 for the test of the interface circuit 400D are disposed in the interface circuit test pin regions Interface_test_PIN_A and Interface_test_PIN_B, and test pins VQPS_1, ANA_ITO_1, VDDI_1, VDD_CORE_1, VDD_CORE_0, VDDI_0, ANA_ITO_0, and VQPS_0 for the test of the semiconductor memories 100D are disposed in the NAND test pin regions Nand_test_PIN_A and Nand_test_PIN_B.

The interface circuit test pin regions Interface_test_PIN_A and Interface_test_PIN_B may be disposed on the sides of the center region NAND_PKG_BALL as shown in FIG. 59, but their locations are not limited thereto. In other examples, Interface_test_PIN_A and Interface_test_PIN_B may be disposed at upper and lower positions relative to the center region NAND_PKG_BALL. In addition, the NAND test pin regions Nand_test_PIN_A and Nand_test_PIN_B may be disposed on both sides of the center region NAND_PKG_BALL as shown in FIG. 59, but are not limited thereto, and may be disposed at upper and lower regions relative to the center region NAND_PKG_BALL.

The test pins VQPS_1, ANA_ITO_1, VDDI_1, VDD_CORE_1, VDD_CORE_0, VDDI_0, ANA_ITO_0, and VQPS_0 for the test of the interface circuit and the test pins VQPS_1, ANA_ITO_1, VDDI_1, VDD_CORE_1, VDD_CORE_0, VDDI_0, ANA_ITO_0, and VQPS_0 for the test of the semiconductor memory may not perform a ball out process. Therefore, the test pins may be disposed in a pin state, and may be connected to an external test device through a probe during the test operation.

In addition, a test pin (TEST_PIN) for testing the multi-channel operations of the interface circuit is also disposed in the packaging ball mapping, and the test pin (TEST_PIN) utilizes some of the non-connecting pins NC disposed in the each of the corner regions EDGE_A, EDGE_B, EDGE_C, and EDGE_D and some of the non-connecting pins NC disposed in the center region NAND_PKG_BALL. For example, a pin corresponding to C4 in the corner region EDGE_A is utilized as a CE_MUX pin (CE_MUX) and pins corresponding to C10 and C11 in the corner region EDGE_B are utilized as a CE4_1_N pin (CE4_1_N) and a CE6_1_N pin (CE6_1_N). The test pins TEST_PIN are preferably disposed adjacent to the center region NAND_PKG_BALL in each of the corner regions EDGE_A, EDGE_B, EDGE_C, and EDGE_D. In addition, pins corresponding to H6, H11, K3, and K11 in the center region NAND_PKG_BALL are utilized as CE5_0_N pin (CE5_0_N), CE7_1_N pin (CE7_1_N), CE7_0_N pin (CE7_0_N), and CE5_1_N pin CE5_1_N). In addition, pins corresponding to R3 and R4 in the corner region EDGE_C are utilized as CE_0_N pin (CE_0_N) and CE4_0_N pin (CE4_0_N).

Therefore, in embodiments contemplated by this disclosure, some of the non-connecting pins of the edge regions or the center region may be utilized as the test pins for test operation of the interface circuit.

As described above, in embodiments of the present disclosure, test pins for testing operations of the interface circuit and test pins for testing operations of the semiconductor memory are provided. Therefore, the test operation of the interface circuit and the test operation of the semiconductor memory may be performed in parallel. Thus, the time required for a test operation may be reduced.

In addition, during a test operation of a semiconductor memory, the semiconductor memory may be directly tested without performing a test operation of the semiconductor memory through the interface circuit, thereby improving reliability of the test operation.

While the present invention has been described with respect to the specific embodiments, it will be apparent to those skilled in the art that various changes and modifications may be made without departing from the spirit and scope of the invention as defined in the following claims.

What is claimed is:

1. A memory package comprising:
   an interface circuit configured to receive a command signal and a read enable signal from a controller, retime the command signal and the read enable signal, and output the command signal and the read enable signal; and
   a semiconductor memory configured to transfer a read command to retrieve first data in response to the command signal and the read enable signal received through the interface circuit and output the read first data to the interface circuit together with a data strobe signal,
   wherein the interface circuit stores the first data temporarily during a read operation of second data, and the interface circuit receives the second data in synchronization with the data strobe signal from the semiconductor memory.

2. The memory package according to claim 1, wherein the interface circuit blocks, during the read operation of the second data, the first data received from the semiconductor memory.

3. The memory package according to claim 1, wherein the read enable signal includes the data strobe signal.

4. The memory package according to claim 1,
wherein the interface circuit performs the read operation of the second data when the command signal received from the controller corresponds to the read operation of the second data, and
wherein the interface circuit determines that the command signal corresponds to the read operation of the second data when an address included in the command signal corresponds to the interface circuit.

5. The memory package according to claim 1,
wherein the interface circuit stores the command signal, and
wherein the interface circuit controls an output timing to retime the command signal and outputs the command signal received from the controller to the semiconductor memory.

6. The memory package according to claim 5, wherein retiming a signal includes at least one of buffering, rearranging to reduce skew, and adjusting a duty cycle of the signal.

7. The memory package according to claim 1, wherein the interface circuit determines that the command signal corresponds to the read operation of the first data when an address included in the command signal corresponds to a memory cell in the memory package device.

8. The memory package according to claim 7, wherein the interface circuit retimes and outputs the first data received from the semiconductor memory to the controller during the read operation of the first data.

9. The memory package according to claim 8, wherein the interface circuit stores and retimes the first data by controlling an output timing.

10. The memory package according to claim 1, wherein the interface circuit includes a data storage circuit configured to store the second data.

11. The memory package according to claim 1, wherein the interface circuit further comprises:
a timing control circuit configured to control a timing of the command signal and the read enable signal received from the controller and output the command signal and the read enable signal;
a processor configured to parse the command signal received from the controller and generate a blocking control signal and a data read signal when the command signal corresponds to the interface circuit as a result of parsing; and
a blocking control circuit configured to transmit to the semiconductor memory the command signal and the read enable signal received from the timing control circuit, receive the data strobe signal and the first data from the semiconductor memory, and block the first data in response to the blocking control signal.

12. The memory package according to claim 11, wherein a data storage circuit reads the second data in response to the data read signal.

13. A memory package comprising:
a semiconductor memory configured to output first data and a data strobe signal during a read operation of the first data; and
an interface circuit configured to receive a command and the data strobe signal from a controller and output the command and the data strobe signal to the semiconductor memory,
wherein the interface circuit is further configured to receive the first data and the data strobe signal from the semiconductor memory and output the first data and the data strobe signal to the controller during the read operation of the first data, and
wherein the interface circuit stores second data during the read operation of the second data, and the interface circuit blocks the first data received from the semiconductor memory and outputs the second data in synchronization with the data strobe signal to the controller.

14. The memory package according to claim 13, wherein the interface circuit retimes and outputs the command and the data strobe signal received from the controller to the semiconductor memory.

15. The memory package according to claim 14, wherein the interface circuit stores the command and the data strobe signal and controls an output timing to retime the command and the data strobe signal.

16. The memory package according to claim 13, wherein the interface circuit retimes and outputs the first data received from the semiconductor memory to the controller during the read operation of the first data, and
wherein the interface circuit stores the first data and controls an output timing to retime the first data.

17. The memory package according to claim 13, wherein retiming a signal includes at least one of buffering, rearranging to reduce skew, and adjusting a duty cycle of the signal.

18. The memory package according to claim 13, wherein the interface circuit determines that the command corresponds to the read operation of the first data when an address included in the command corresponds to a memory cell included in the semiconductor memory the memory, and the interface circuit determines that the command corresponds to the read operation of the second data when the address corresponds to the interface circuit.

19. The memory package according to claim 13, wherein the interface circuit further comprises:
a timing control circuit configured to control a timing of the command and the data strobe signal received from the controller and output the command and the data strobe signal;
a processor configured to parse the command received from the controller and generate a blocking control signal and a data read signal when the command corresponds to the interface circuit as a result of parsing; and
a blocking control circuit configured to transmit to the semiconductor memory, the command and the data strobe signal received from the timing control circuit, receive the data strobe signal and the first data from the semiconductor memory, and block the first data in response to the blocking control signal.

20. The memory package according to claim 19, wherein a data storage circuit reads the second data in response to the data read signal.

* * * * *